United States Patent
Kunikiyo

(10) Patent No.: US 6,538,954 B2
(45) Date of Patent: Mar. 25, 2003

(54) MULTI-PORT STATIC RANDOM ACCESS MEMORY EQUIPPED WITH A WRITE CONTROL LINE

(75) Inventor: Tatsuya Kunikiyo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/900,969

(22) Filed: Jul. 10, 2001

(65) Prior Publication Data

US 2002/0006072 A1 Jan. 17, 2002

Related U.S. Application Data

(63) Continuation-in-part of application No. 09/756,187, filed on Jan. 9, 2001.

(30) Foreign Application Priority Data

Jul. 10, 2000 (JP) .................................... 2000-207848
May 18, 2001 (JP) .................................... 2001-148893

(51) Int. Cl.[7] ................................................ G11C 8/16
(52) U.S. Cl. .................. 365/230.05; 365/156; 365/190; 365/227; 365/226
(58) Field of Search ....................... 365/230.05, 190, 365/156, 154, 227, 226

(56) References Cited

U.S. PATENT DOCUMENTS

| | | | |
|---|---|---|---|
| 6,005,794 A | 12/1999 | Sheffield et al. | 365/154 |
| 6,011,726 A | 1/2000 | Batson et al. | 365/188 |
| 6,078,544 A | * 6/2000 | Park | 365/230.05 |
| 6,118,689 A | * 9/2000 | Kuo et al. | 365/154 |
| 6,122,218 A | * 9/2000 | Kang | 365/230.05 |
| 6,317,358 B1 | * 11/2001 | Keeth | 365/149 |
| 6,320,811 B1 | * 11/2001 | Snyder et al. | 365/230.03 |

* cited by examiner

Primary Examiner—Andrew Q. Tran
(74) Attorney, Agent, or Firm—Oblon, Spivak, McClelland, Maier & Neustadt, P.C.

(57) ABSTRACT

Transistors (MN9, MN10) are connected in series between a node (N1) and a write data bit line (41), and have gates connected to a write control line (44) and a write word line (31), respectively. A potential corresponding to the exclusive OR of the write data bit line (41) and a write data complement bit line (42) is applied to the write control line (44). The write data bit line (41) and the write data complement bit line (42) which are not used for a write operation are precharged to the same potential to turn off the transistor (MN9). A memory device can reduce unwanted power consumption while rapidly performing a write operation which inverts a stored content.

20 Claims, 44 Drawing Sheets

F I G. 9
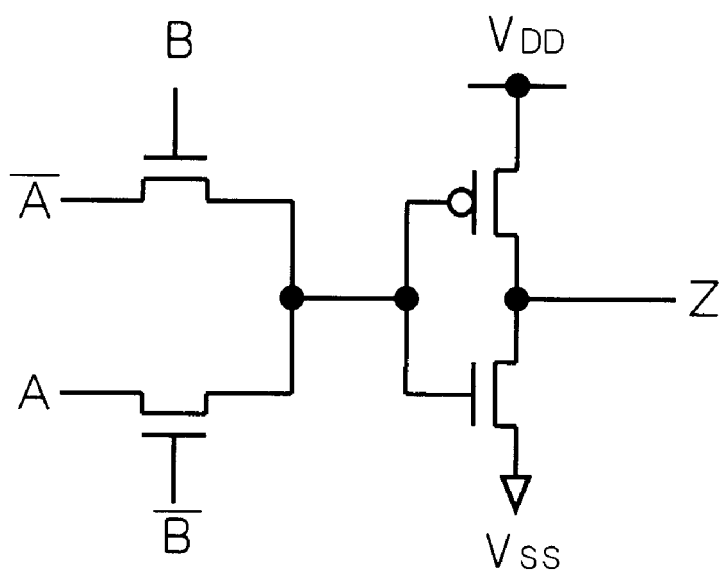

F I G. 23
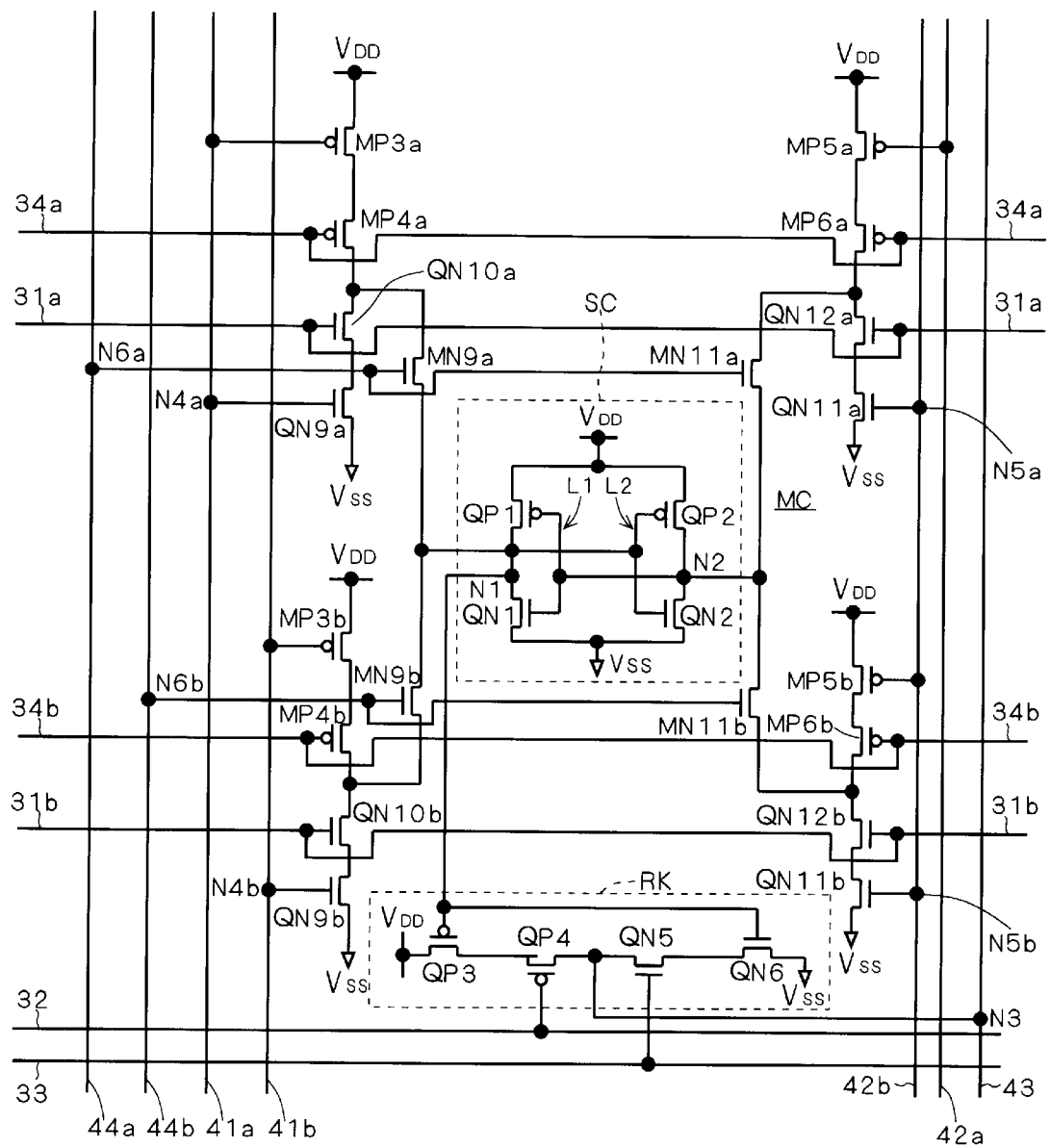

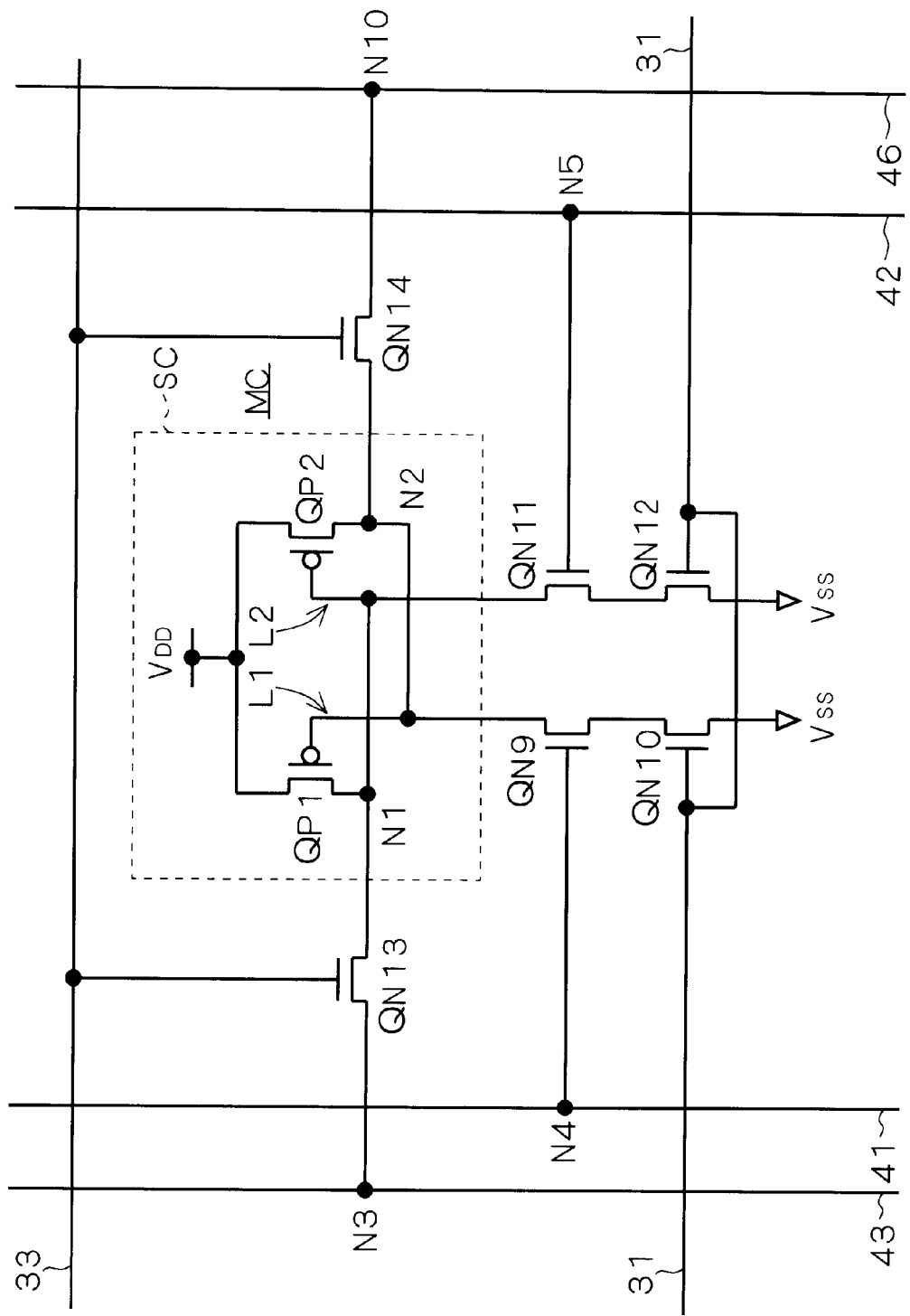
F I G. 34

F/G. 37
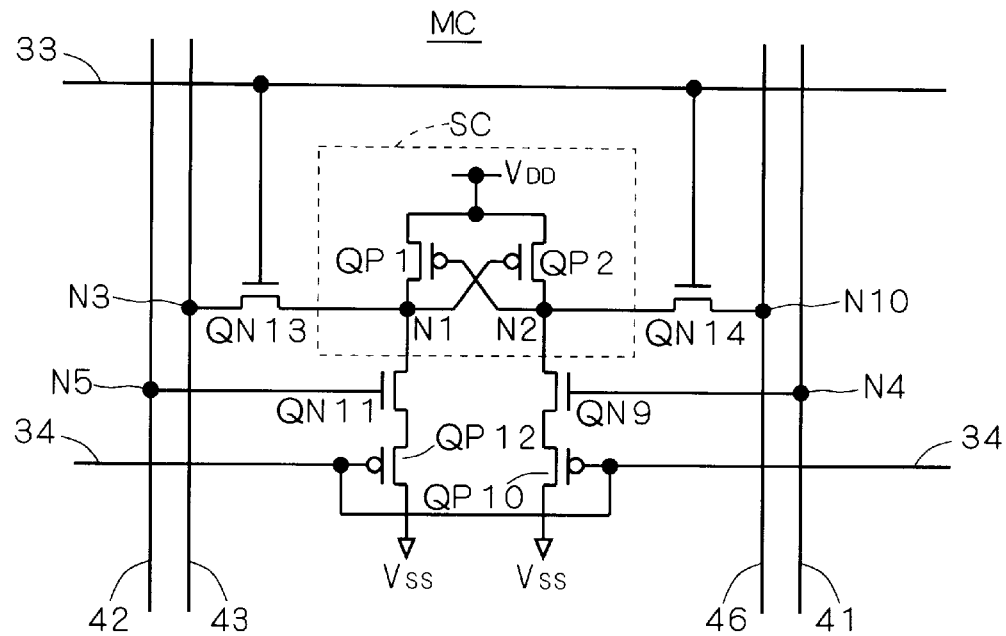
F/G. 38
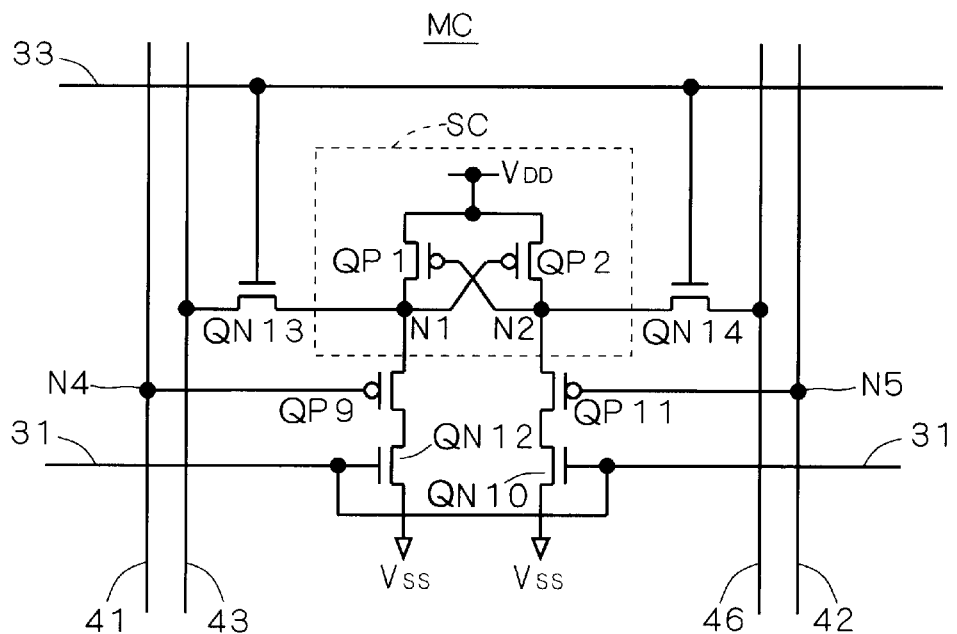

F I G. 39
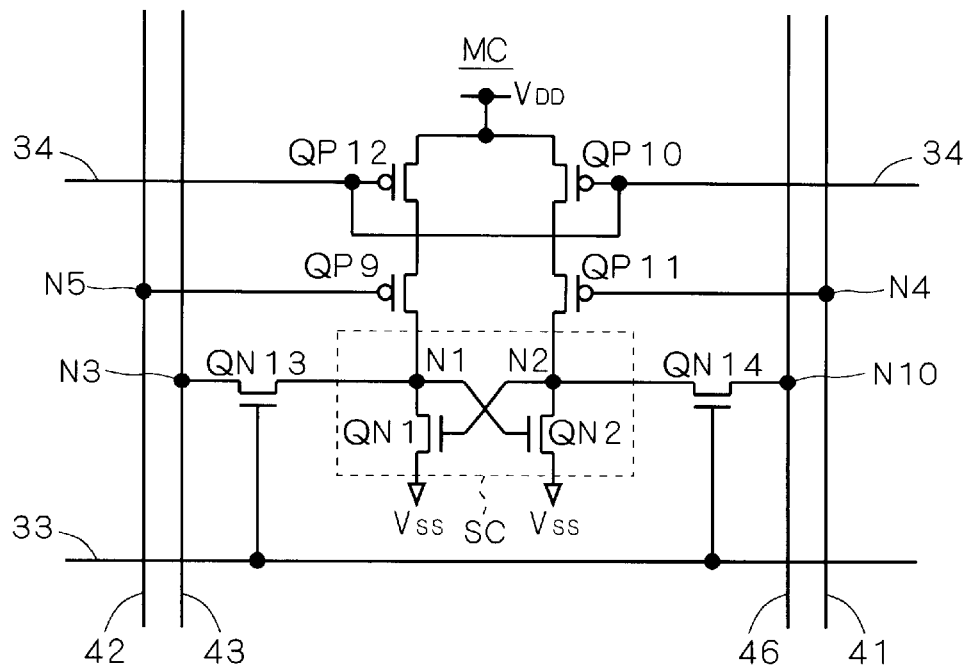
F I G. 40
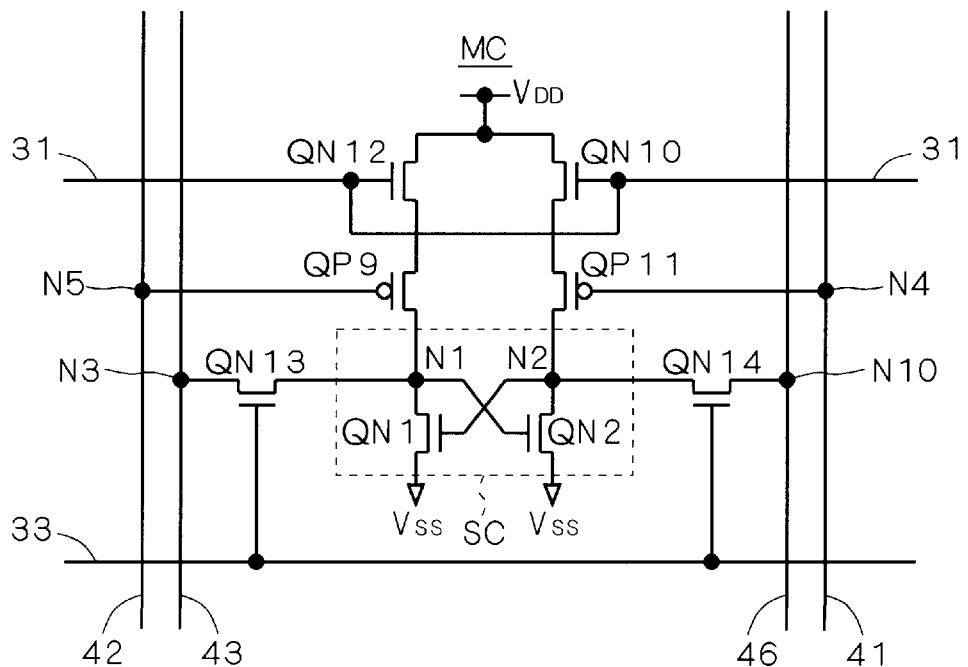

F I G. 43
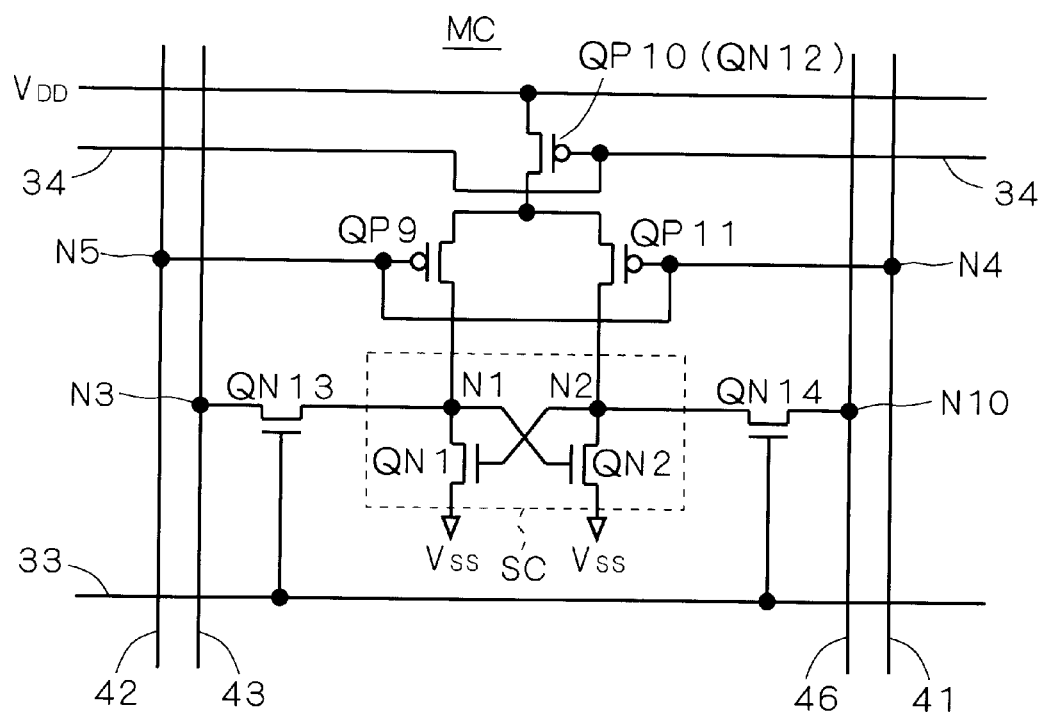

F I G. 46
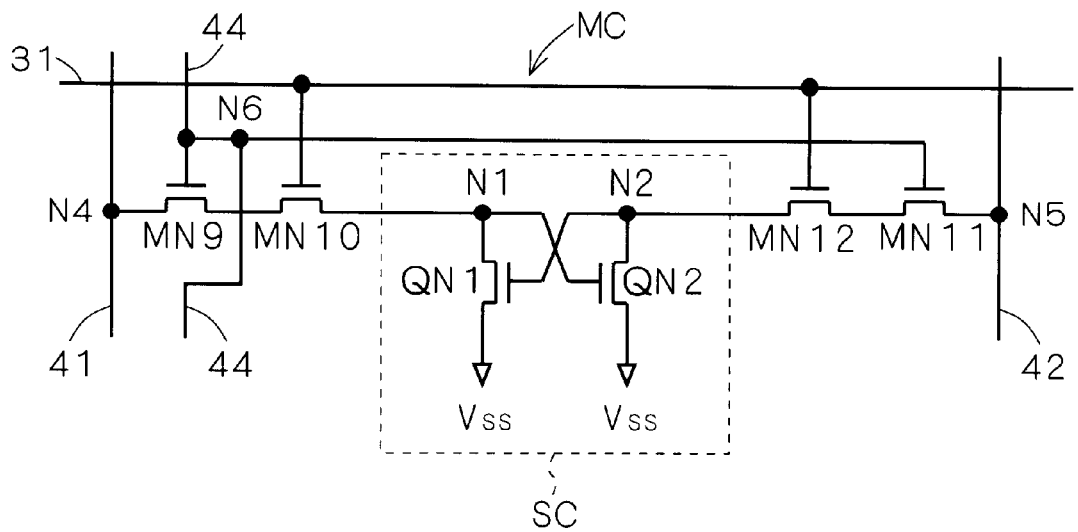
F I G. 47
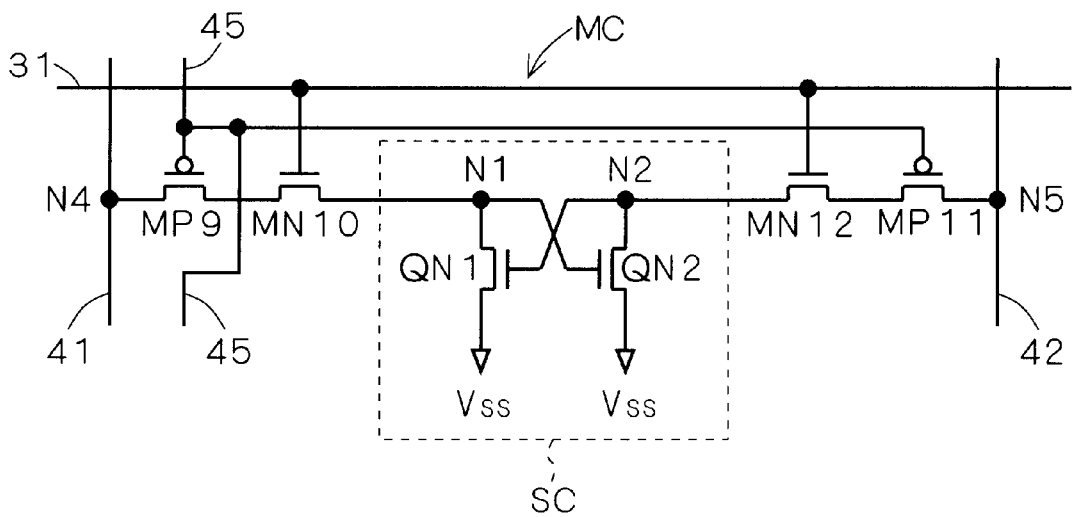

MULTI-PORT STATIC RANDOM ACCESS MEMORY EQUIPPED WITH A WRITE CONTROL LINE

BACKGROUND OF THE INVENTION

1. Field of the Invention

The present invention relates to a multi port SRAM (Static Random Access Memory) including MISFETs (Metal Insulator Semiconductor Field Effect Transistors) and, more particularly, to a technique for reading and writing data from and into memory cells of the SRAM.

2. Description of the Background Art

In an integrated circuit, an SRAM is used to cache data or instructions, i.e., to function to temporarily hold data therein for transmission of data to a CPU (Central Processing Unit) in timed relation to the CPU and to store the state of a sequential circuit therein. In recent years, emphasis has been placed on the rate at which data is written into and read from the memory. To increase a memory bandwidth, there has been proposed a technique in which a plurality of I/O ports are provided to the memory cells of the SRAM. Examples of this technique include a dual port static memory cell having one read port and one write port, and a multi port static memory cell having a multiplicity of read ports and a multiplicity of write ports.

FIG. 51 conceptually illustrates a configuration of a background art SRAM including a memory cell array and its peripheral components. Memory cells in the array are disposed in a matrix having m rows and n columns, and a memory cell in the i-th row, j-th column is designated by $MC_{ij}$. In FIG. 51 is shown the reference character $MC_{13}$ designating a memory cell disposed in the first row, the third column.

The SRAM shown in FIG. 51 is configured to have word lines extending along the rows and bit lines extending along the columns. A word line decoder 3 is connected to word line groups $30_i$ (i=1, 2, 3, ..., m−1, m), and selectively activates a word line group $30_i$ corresponding to a row address RA inputted thereto. A bit line decoder 4 is connected to bit line groups $40_j$ (j=1, 2, 3, ..., n−1, n), and selectively activates a bit line group $40_j$ corresponding to a column address CA inputted thereto.

The word line groups $30_i$ and the bit line groups $40_j$ intersect each other at the memory cells $MC_{ij}$. In other words, a common word line group is provided in corresponding relation to a plurality of memory cells arranged along each row, and a common bit line group is provided in corresponding relation to a plurality of memory cells arranged along each column.

Each of the word line groups $30_i$ includes a write word line $31_i$, a read word line $33_i$, and a read complement word line $32_i$. The read word line $33_i$ and the read complement word line $32_i$ constitute a read word line pair. Each of the bit line groups $40_j$ includes a write data bit line $41_j$, a write data complement bit line $42_j$, and a read data bit line $43_j$. The write data bit line $41_j$ and the write data complement bit line $42_j$ constitute a write data bit line pair.

FIG. 52 is a circuit diagram illustrating a common structure of every memory cell MC. Since the structure of the memory cells MC is not dependent basically upon the row and column locations (i, j), the subscripts denoting the row and column locations are omitted in FIG. 52.

The memory cell MC shown in FIG. 52 comprises a storage part (referred to hereinafter as a "storage cell") SC having a pair of inverters L1 and L2 comprising a cross-coupled latch circuit, a read circuit RK, and access transistors QN3 and QN4.

In the storage cell SC, the inverter L1 has transistors QP1 and QN1 connected in series, and the inverter L2 has transistors QP2 and QN2 connected in series. The read circuit RK comprises a tristate inverter having transistors QP3, QP4, QN5, QN6 connected in series.

N-type MOSFETs (Metal Oxide Semiconductor Field Effect Transistors) are used as the transistors QN1 to QN6, and P-type MOSFETs are used as the transistors QP1 to QP4. For example, the N-type MOSFETs are of a surface-channel type, and the P-type MOSFETs are of a surface-channel or buried-channel type.

The storage cell SC further comprises a pair of nodes N1 and N2 which have a pair of storage states: the nodes N1 and N2 are "high" and "low" respectively, and vice versa. A "high" means a logic corresponding to a potential higher than $(V_{DD}+V_{SS})/2$, and a "low" means a logic corresponding to a potential lower than $(V_{DD}+V_{SS})/2$ where a ground is often selected as the potential $V_{SS}$. A "high" and a "low" mean not only the logics but also potentials corresponding to the respective logics. Which of the "high" and "low" states represents a "1" as a bit of the SRAM and which represents a "0" is a matter of design choice.

The N-type MOSFET turns on when a "high" is applied to the gate thereof, and turns off when a "low" is applied thereto. The P-type MOSFET turns on when a "low" is applied to the gate thereof, and turns off when a "high" is applied thereto. In an "on" state, current flows between the source and the drain of the MOSFET to provide electrical conduction therebetween. In an "off" state, there is electrical disconnection between the source and the drain of the MOSFET and almost no current flows therebetween.

The node N1 is the input of the inverter L2, and a potential corresponding to a logic complementary to the logic corresponding to the potential at the node N1 is outputted to the node N2. The node N2 is the input of the inverter L1, and the inverted bit of a logic complementary to the logic corresponding to the potential at the node N2 is outputted to the node N1. Thus, there are a pair of storage states corresponding to complementary logics.

The access transistor QN3 is connected at nodes N1 and N4 to the storage cell SC and the write data bit line 41, respectively. The access transistor QN4 is connected at nodes N2 and N5 to the storage cell SC and the write data complement bit line 42, respectively. The gates of the respective access transistors QN3 and QN4 are connected commonly to the write word line 31.

In the read circuit RK, the drains of the respective transistors QP4 and QN5 are connected commonly to a node N3. The gates of the respective transistors QP3 and QN6 are connected commonly to the node N1. The gates of the transistors QP4 and QN5 are connected to the read complement word line 32 and the read word line 33, respectively. As described above, a dual port static memory cell is used as the memory cell MC.

For reading data from the memory cell MC, complementary logics are placed on the read word line 33 and the read complement word line 32. The read word line 33 and the read complement word line 32 corresponding to a row including the memory cell MC to be read are driven high and low, respectively, whereas the read word lines 33 and the read complement word lines 32 corresponding to the other rows are driven low and high, respectively.

Thus, both of the transistors QP4 and QN5 of the read circuit RK in the memory cell MC to be read turn on. This causes an inverter comprised of the transistors QP3 and QN6 to apply a value complementary to the value at the node N1 through the node N3 to the read data bit line 43. On the other hand, the transistors QP4 and QN5 of the read circuit RK in each of the memory cells MC which are not to be read turn off. This disconnects the read data bit line 43 from the storage cell SC in each of the memory cells MC which are not to be read.

For writing data into the memory cell MC, the write word line 31 corresponding to a row including the memory cell MC to be written is driven high, whereas the write word lines 31 corresponding to the other rows are driven low.

Thus, both of the access transistors QN3 and QN4 in the memory cell MC to be written turn on. This connects the nodes N1 and N2 of the storage cell SC through the nodes N4 and N5 to the write data bit line 41 and the write data complement bit line 42, respectively. On the other hand, the access transistors QN3 and QN4 in each of the memory cells MC which are not to be written turn off. This disconnects the nodes N1 and N2 of the storage cell SC from the write data bit line 41 and the write data complement bit line 42 in each of the memory cells MC which are not to be written.

As described above, since the logics on the nodes N1 and N2 of the storage cell SC are in complementary relation, complementary logics are placed on the write data bit line 41 and the write data complement bit line 42 corresponding to a column including the memory cell MC to be written. Then, the logics placed on the write data bit line 41 and the write data complement bit line 42 are written into the nodes N1 and N2, respectively.

After the write operation, the write word line 31 is driven low to turn off the access transistors QN3 and QN4. This disconnects the storage cell SC from the write data bit line pair. Thus, the data held in the storage cell SC is not rewritten, and the storage cell SC is placed into a stand-by state.

In the above construction, when the write word line 31 is driven high during a write operation, the access transistors QN3 and QN4 in all of the memory cells MC disposed in the same row as the memory cell MC to be written turn on. Thus, in the memory cells MC which are disposed in the same row as the memory cell MC to be written but are not to be written, the nodes N1 and N2 are connected through the access transistors QN3 and QN4 to the write data bit line 41 and the write data complement bit line 42, respectively, during the write operation.

On the other hand, the write data bit lines 41 and the write data complement bit lines 42 corresponding to the columns including the memory cells MC which are not to be written are normally precharged to an equal potential. This precharge potential is, for example, $V_{DD}$, $(V_{DD}+V_{SS})/2$, or $V_{SS}$. Therefore, depending on the potentials at the nodes N1 and N2 in each of these memory cells MC, one of the write data bit line 41 and the write data complement bit line 42 is pulled to $V_{SS}$ and the other is pulled to $(V_{DD}-V_{thn})$ (assuming that the potential $V_{DD}$ is applied to the write word line 31 and the threshold voltage $V_{thn}$ of the transistors QN3 and QN4 is greater than zero). The potential application through the nodes N1 and N2 to such precharged write data bit line pair gives rise to unwanted electric power consumption.

Additionally, the bit line pair to which the potential is applied by the storage cell SC in the above-mentioned manner is subjected to another precharge operation to prepare for the next write operation. This precharge operation also consumes unwanted electric power.

FIG. 53 is a circuit diagram showing a configuration of a memory cell MC proposed for preventing the above-mentioned power consumption and disclosed, for example, in U.S. Pat. No. 6,005,794.

NMOS transistors QN9 and QN10 are connected in series between the node N1 and a potential point providing the potential $V_{SS}$ (also referred to hereinafter as a "potential point $V_{SS}$"), e.g., a ground. The gate of the NMOS transistor QN9 is connected at the node N4 to the write data bit line 41, and the gate of the NMOS transistor QN10 is connected to the write word line 31. Similarly, NMOS transistors QN11 and QN12 are connected in series between the node N2 and the potential point $V_{SS}$. The gate of the NMOS transistor QN11 is connected at the node N5 to the write data complement bit line 42, and the gate of the NMOS transistor QN12 is connected to the write word line 31.

The write word line 31 corresponding to the memory cell MC to be written (i.e., in a selected row) is driven high to turn on the transistors QN10 and QN12 during a write operation. Complementary logics are applied to the write data bit line 41 and the read data bit line 43 corresponding to the memory cell MC (i.e., in a selected column) to turn on one of the transistors QN9 and QN11. When the write data bit line 41 and the write data complement bit line 42 are high and low respectively, a logic "low" is placed on the node N1. This forces the node N2 high. Conversely, when the write data bit line 41 and the write data complement bit line 42 are low and high respectively, a logic "low" is placed on the node N2. This forces the node N1 high.

In such a write operation, all of the unselected write data bit line pairs are driven to the potential $V_{SS}$. The transistors QN9 and QN11 are off in the memory cells MC which are not to be written. Therefore, in the memory cells MC disposed in the row corresponding to the selected write word line 31 which is high, the nodes N1 and N2 are not forced to any potential from externally of the storage cell SC. In other words, this is advantageous in preventing the above-mentioned unwanted power consumption.

However, this circuit presents a problem in that a write operation which changes the stored content of the storage cell SC requires much time. Specifically, this circuit forces one of the nodes N1 and N2 low from externally of the storage cell SC, but does not have the function of forcing the other node high from externally of the storage cell SC. For example, when inverting the nodes N1 and N2 which are high and low respectively into their complementary states, the transistors QN9 and QN10 turn on to attempt to discharge the node N1. However, since the node N2 is originally low and is not forced high from externally of the storage cell SC, the inverter L1 attempts to hold the node N1 high. The storage cell SC is designed to have a high static noise margin in order to hold data in a stable fashion. Therefore, this circuit is not capable of rapidly inverting the stored content of the storage cell SC only by discharging the node N1.

SUMMARY OF THE INVENTION

According to a first aspect of the present invention, a memory device comprises: (a) a plurality of word line groups each including (a-1) a write word line; (b) a plurality of bit line groups each including (b-1) a write data bit line, and (b-2) a write control line provided in corresponding relation to the write data bit line; and (c) a plurality of memory cells each provided in corresponding relation to one of the word line groups and one of the bit line groups, each of the memory cells including (c-1) a storage cell including a first storage node, and (c-2) a first switch connected between the write data bit line of the one of the bit line groups corresponding thereto and the first storage node, the first switch being conducting only when both of the write word line of the one of the word line groups corresponding thereto and the write control line are active, wherein the write control line is active when an associated one of the bit line groups which includes the write control line is selected, and is inactive when the associated one of the bit line groups is not selected.

Preferably, according to a second aspect of the present invention, in the memory device of the first aspect, each of the bit line groups further includes (b-3) a write data complement bit line provided in corresponding relation to the write data bit line. The storage cell each includes (c-1-1) a second storage node receiving a logic complementary to a logic on the first storage node. Each of the memory cells further includes (c-3) a second switch connected between the write data complement bit line of the one of the bit line groups corresponding thereto and the second storage node, the second switch being conducting only when both of the write word line of the one of the word line groups corresponding thereto and the write control line are active. The write data bit line and the write data complement bit line have logics complementary to each other when an associated one of the bit line groups which includes the write data bit line and the write data complement bit line is selected, and have the same logic when the associated one of the bit line groups is not selected. The write control line has the exclusive OR of the write data bit line and the write data complement bit line in the one of the bit line groups.

Preferably, according to a third aspect of the present invention, in the memory device of the second aspect, potentials on the write data bit line and the write data complement bit lines are non-invertingly amplified and then exclusive-ORed.

Preferably, according to a fourth aspect of the present invention, in the memory device of the first aspect, the first switch includes: (c-2-1) a first transistor having a control electrode connected to the write control line, and first and second current electrodes; and (c-2-2) a second transistor having a control electrode connected to the write word line, and first and second current electrodes. The first and second current electrodes of the first transistor and the first and second current electrodes of the second transistor are connected in series between the first storage node and the write data bit line.

Preferably, according to a fifth aspect of the present invention, in the memory device of the fourth aspect, the first switch further includes: (c-2-3) a third transistor having a control electrode receiving a logic complementary to a logic on the write control line, a first current electrode connected to the second current electrode of the first transistor, and a second current electrode connected to the first current electrode of the first transistor, the third transistor being different in conductivity type from the first transistor; and (c-2-4) a fourth transistor having a control electrode receiving a logic complementary to a logic on the write word line, a first current electrode connected to the second current electrode of the second transistor, and a second current electrode connected to the first current electrode of the second transistor, the fourth transistor being different in conductivity type from the second transistor.

Preferably, according to a sixth aspect of the present invention, in the memory device of the fourth or fifth aspect, the first current electrode of the first transistor and the second current electrode of the second transistor share one region with each other.

Preferably, according to a seventh aspect of the present invention, in the memory device of the first aspect, the first switch includes: (c-2-1) a first transistor having a control electrode, a first current electrode connected to the write data bit line, and a second current electrode connected to the first storage node; and (c-2-2) a second transistor having a control electrode connected to the write control line, a first current electrode connected to the control electrode of the first transistor, and a second current electrode connected to the write word line.

Preferably, according to an eighth aspect of the present invention, in the memory device of the first aspect, the first switch includes: (c-2-1) a first transistor having a control electrode connected to the write word line, a first current electrode, and a second current electrode connected to the write control line; and (c-2-2) a second transistor having a control electrode connected to the first current electrode of the first transistor, a first current electrode connected to the write data bit line, and a second current electrode connected to the first storage node.

According to a ninth aspect of the present invention, a memory device comprises: (a) a plurality of word line groups each including (a-1) a write word line; (b) a plurality of bit line groups each including (b-1) a write data bit line, and (b-2) a write control line provided in corresponding relation to the write data bit line; and (c) a plurality of memory cells each provided in corresponding relation to one of the word line groups and one of the bit line groups, each of the memory cells including (c-1) a storage cell including a first storage node, and (c-2) a first potential setting section for providing a logic complementary to a logic on the write data bit line of the one of the bit line groups corresponding thereto to the first storage node only when both of the write word line of the one of the word line groups corresponding thereto and the write control line are active, wherein the write control line is active when an associated one of the bit line groups which includes the write control line is selected, and is inactive when the associated one of the bit line groups is not selected.

Preferably, according to a tenth aspect of the present invention, in the memory device of the ninth aspect, the first potential setting section includes: (c-2-1) a first potential point for supplying a potential corresponding to a first logic; (c-2-2) a first switch for controlling electrical conduction between the first storage node and a first connection point, depending on a logic on the write control line; and (c-2-3) a second switch for controlling electrical conduction between the first connection point and the first potential point, depending on both of the logic on the write data bit line and a logic on the write word line.

Preferably, according to an eleventh aspect of the present invention, in the memory device of the tenth aspect, the first potential setting section further includes: (c-2-4) a second potential point for supplying a potential corresponding to a second logic complementary to the first logic; and (c-2-5) a third switch for controlling electrical conduction between the first connection point and the second potential point, depending on both of the logic on the write data bit line and a logic complementary to the logic on the write word line.

Preferably, according to a twelfth aspect of the present invention, in the memory device of the ninth aspect, the first potential setting section includes: (c-2-1) a first potential point for supplying a potential corresponding to a first logic; (c-2-2) a first switch for controlling electrical conduction between the first storage node and a first connection point, depending on a logic on the write word line; and (c-2-3) a second switch for controlling electrical conduction between the first connection point and the first potential point, depending on a logic on the write control line and the logic on the write data bit line.

Preferably, according to a thirteenth aspect of the present invention, in the memory device of the twelfth aspect, the first potential setting section further includes: (c-2-4) a second potential point for supplying a potential corresponding to a second logic complementary to the first logic; and (c-2-5) a third switch for controlling electrical conduction between the first connection point and the second potential point, depending on both of a logic complementary to the logic on the write control line and the logic on the write data bit line.

Preferably, according to a fourteenth aspect of the present invention, in the memory device of the fourth or seventh aspect, the first transistor is an NMOS transistor formed on an SOI substrate; and a potential for alleviating a forward bias on the first current electrode of the first transistor and a body is applied to the write word line which is inactive.

According to a fifteenth aspect of the present invention, a memory device comprises: (a) a plurality of word line groups each including (a-1) a write word line; (b) a plurality of bit line groups each including (b-1) a write data bit line; and (c) a plurality of memory cells each provided in corresponding relation to one of the word line groups and one of the bit line groups, each of the memory cells including (c-1) a storage cell including a first storage node, (c-2) a switch connected between the first storage node and a first potential point supplying a first potential corresponding to a first logic, and (c-3) a control device for permitting open/close control of the switch, depending on a logic on the write data bit line of the one of the bit line groups corresponding thereto when the write word line of the one of the word line groups corresponding thereto is active.

Preferably, according to a sixteenth aspect of the present invention, in the memory device of the fifteenth aspect, the switch includes (c-2-1) a first transistor having a first current electrode connected to the first storage node, a second current electrode connected to the first potential point, and a control electrode. The control device includes (c-3-1) a second transistor having a first current electrode connected to the control electrode of the first transistor, a second current electrode connected to the write data bit line, and a control electrode connected to the write word line.

Preferably, according to a seventeenth aspect of the present invention, in the memory device of the sixteenth aspect, the control device further includes (c-3-2) a third transistor having a first current electrode connected to the second current electrode of the second transistor, a second current electrode connected to the first current electrode of the second transistor, and a control electrode receiving a potential corresponding to a logic complementary to a logic on the write word line.

According to an eighteenth aspect of the present invention, a memory device comprises: (a) a plurality of write word lines; (b) a plurality of write data bit lines; and (c) a plurality of memory cells each provided in corresponding relation to one of the write word lines and one of the write data bit lines, each of the memory cells including (c-1) a storage cell including a storage node, (c-2) a first transistor, electrical conduction of the first transistor being controlled by a logic placed on the one of the write data bit lines, and (c-3) a second transistor, electrical conduction of the second transistor being controlled by a logic placed on the one of the write word lines, the storage node being connected through only in-series connection of the first transistor and the second transistor to a first potential point supplying a first potential corresponding to a first logic, the storage cell further including a third transistor having a first current electrode connected to the storage node, a second current electrode receiving a second potential corresponding to a logic complementary to the first logic, and a control electrode, and a fourth transistor having a first current electrode connected to the control electrode of the third transistor, a second current electrode receiving the second potential, and a control electrode connected to the storage node.

Preferably, according to a nineteenth aspect of the present invention, in the memory device of the fourth aspect, the storage cell comprises a pair of cross-coupled transistors.

Preferably, according to a twentieth aspect of the present invention, in the memory device of the fourth aspect, the first transistor and the second transistor differ in conductivity type from each other.

In the memory device according to the first aspect of the present invention, both of the write word line and the write control line are active in a memory cell to be written during a write operation, to connect the first storage node through the first switch to the write data bit line. Thus, it takes short time to invert the logic to be stored at the first storage node, independently of the logic placed on the write data bit line. On the other hand, the write control line is inactive in each of the memory cells which are not to be written. Then, the first switch does not connect the first storage node to the write data bit line. This reduces unwanted power consumption in the memory cells which are not to be written.

In the memory device according to the second aspect of the present invention, the write data bit line and the write data complement bit line are precharged in each of the unselected bit line groups. This precharge operation normally drives the write data bit line and the write data complement bit line to the same potential. Therefore, exclusive-ORing the write data bit line and the write data complement bit line inactivates the write control line.

In the memory device according to the third aspect of the present invention, the exclusive-OR is correctly provided even when the potential to be applied to the write data bit line and the write data complement bit line during the precharge operation is intermediate between two potentials corresponding to complementary logics.

In the memory device according to the fourth, seventh or eighth aspect of the present invention, the first switch is implemented by the use of the first and second transistors.

The memory device according to the fifth aspect of the present invention can avoid the reduction in the potential to be applied to the first storage node by the amount of the threshold voltage of the first and second transistors below the potential to be applied to the write data bit line. This eliminates the need to provide a circuit for increasing the potential on the write word line.

In the memory device according to the sixth aspect of the present invention, the first switch having a smaller area is implemented.

In the memory device according to any one of the ninth to thirteenth aspects of the present invention, both of the write word line and the write control line are active in a memory cell to be written during a write operation. In this case, the logic complementary to the logic on the write data bit line is provided to the first storage node. On the other hand, the write control line is inactive in each of the memory cells which are not to be written. Then, the first potential setting section does not place any logic on the first storage node. This reduces the unwanted power consumption in the memory cells.

The memory device according to the fourteenth aspect of the present invention can suppress an effective base current flowing between the first current electrode and the body of the second transistor when the write word line is inactive, even if the second transistor is formed on the SOI substrate, to thereby eliminate so-called "half-select write disturb."

In the memory device according to the fifteenth or sixteenth aspect of the present invention, when the write word line is active, the switch is open/close controlled depending on the logic on the write data bit line to control the electrical conduction/non-conduction between the first storage node and the first potential point. There is no path through which electric charges directly move between the first storage node and the write data bit line. Thus, the storage cell neither charges nor discharges the write data bit line in the memory cell to be written or in the memory cells connected to the same write word line as the memory cell to be written, thereby to avoid the unwanted power consumption. Additionally, the read operation from the memory cells connected to the same write word line as the memory cell to be written is performed rapidly.

The memory device according to the seventeenth aspect of the present invention can achieve on/off control of the first transistor with precision.

In the memory device according to the eighteenth aspect of the present invention, there is no path through which electrical charges directly move between the storage node and the one of the write data bit lines. Thus, the storage cell neither charges nor discharges the one of the write data bit lines in a memory cell to be written or in each memory cell which shares the use of the one of the write word line with the memory cell to be written. This eliminates unwanted power consumption. The storage cell comprises the cross-coupled third and fourth transistors to achieve area reduction by the area of two transistors per storage cell, as compared with a storage cell comprising a pair of cross-coupled inverters. Further, the storage cell in the eighteenth aspect can perform a rapid write operation.

In the memory device according to the nineteenth aspect of the present invention, the storage cell can achieve area reduction by the area of two transistors per storage cell, as compared with a storage cell comprising a pair of cross-coupled inverters, and also perform a rapid write operation.

In the memory device according to the twentieth aspect of the present invention, the worst value (maximum value) of the time required to stabilize the storage cell is less than that in a configuration in which the first and second transistors are of the same conductivity type.

It is therefore an object of the present invention to provide a technique for reducing unwanted power consumption while rapidly performing a write operation which inverts a stored content.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 through 9 are circuit diagrams illustrating XOR circuits;

FIG. 23 is a circuit diagram of a memory cell according to a third modification of the fifth preferred embodiment of the present invention;

FIG. 34 is a circuit diagram illustrating a single memory cell according to an eighth preferred embodiment of the present invention;

FIG. 37 is a circuit diagram of a memory cell according to a first modification of the eighth preferred embodiment of the present invention;

FIG. 38 is a circuit diagram of a memory cell according to a second modification of the eighth preferred embodiment of the present invention;

FIG. 39 is a circuit diagram of a memory cell according to a third modification of the eighth preferred embodiment of the present invention;

FIG. 40 is a circuit diagram of a memory cell according to a fourth modification of the eighth preferred embodiment of the present invention;

FIG. 43 is a circuit diagram of a memory cell according to a seventh modification of the eighth preferred embodiment of the present invention;

FIG. 46 is a circuit diagram illustrating a single memory cell according to a ninth preferred embodiment of the present invention;

FIGS. 47 through 49 are circuit diagrams of modifications of the ninth preferred embodiment of the present invention;

DESCRIPTION OF THE PREFERRED EMBODIMENTS

Preferred embodiments of the present invention will now be discussed wherein a logic "high" and a logic "low" are described as corresponding to a state in which a word line is active or selected and a state in which a word line is inactive or unselected, respectively, unless otherwise specified. The following description applies to the inverse corresponding relationship between these states if the conductivity types of transistors to be used are changed as required.

First Preferred Embodiment

Figure 1:
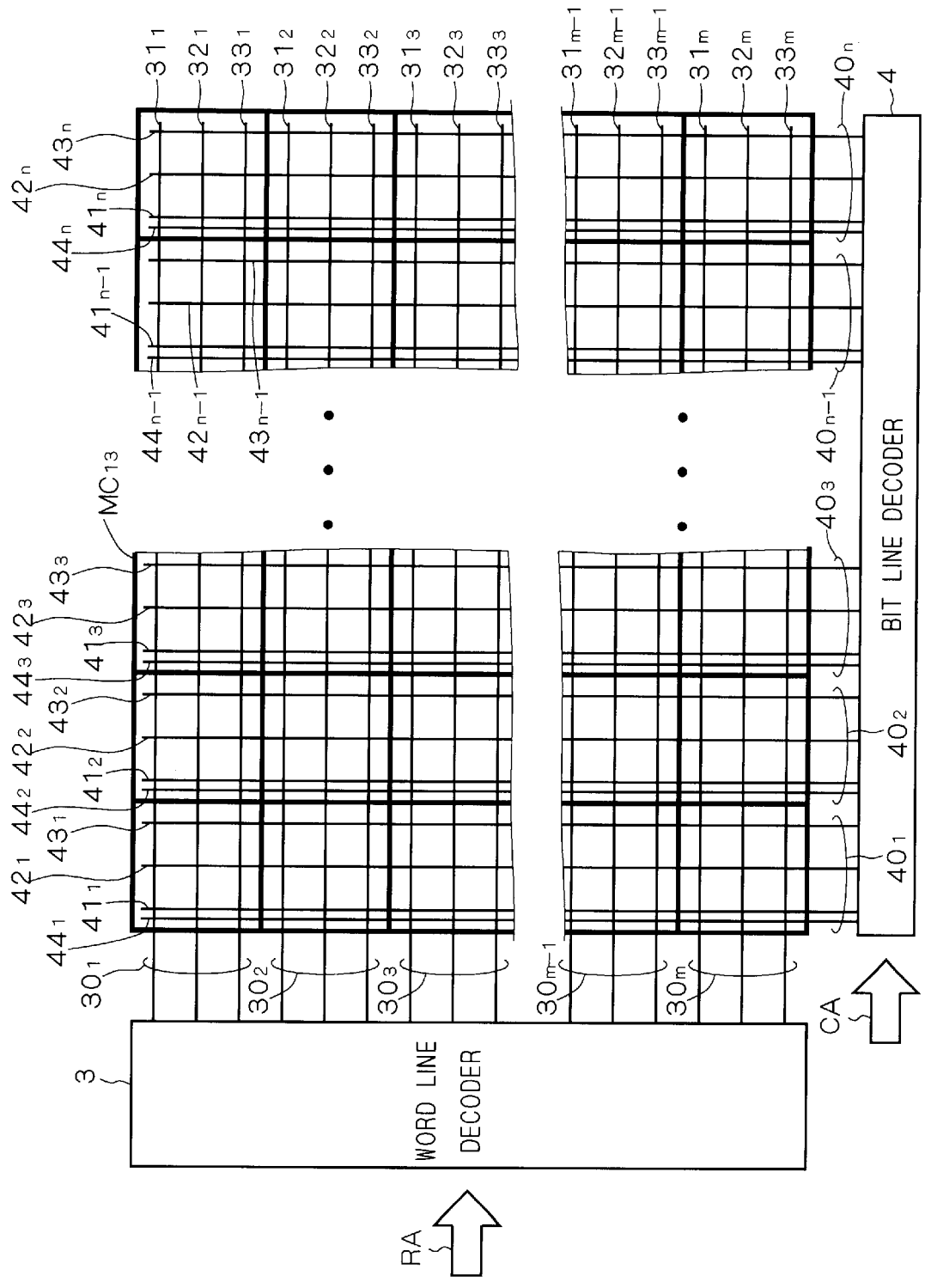
FIG. 1 conceptually shows an SRAM according to a first preferred embodiment of the present invention.

FIG. 1 conceptually shows a configuration of an SRAM including a memory cell array and its peripheral components according to a first preferred embodiment of the present invention. The SRAM of FIG. 1 has a characteristic structure in that a write control line $44_j$ is added to each bit line group $40_j$ of the background art SRAM configuration. The bit line decoder 4 also places a potential (or logic) on the write control line $44_j$. More specifically, a logic corresponding to the exclusive-OR (also referred to hereinafter as "XOR") of the logic to be provided to the write data bit line $41_j$ and the logic to be provided to the write data complement bit line $42_j$ is placed on the write control line $44_j$. For purposes of simplicity, it is assumed in the following description that one of the potentials $V_{DD}$ and $V_{SS}$ is applied to the write data bit line $41_j$ and the write data complement bit line $42_j$ during a precharge period.

Figure 2:
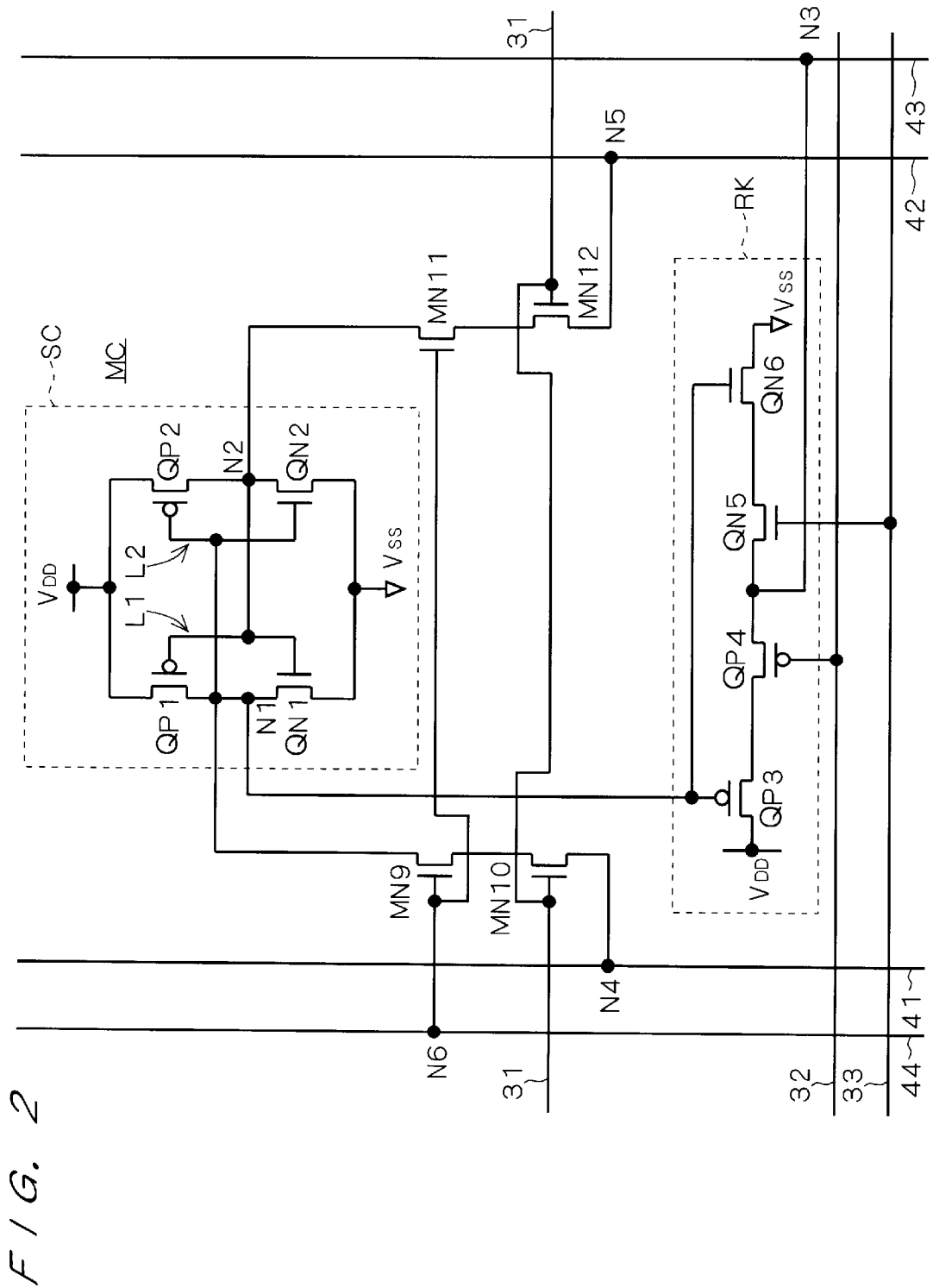
FIG. 2 is a circuit diagram illustrating a single memory cell according to the first preferred embodiment of the present invention.

FIG. 2 is a circuit diagram illustrating a configuration of a single memory cell MC shown in FIG. 1. As in the background art, the subscripts denoting the row and column locations are omitted in FIG. 2. The memory cell MC comprises a storage cell SC, a read circuit RK, and pass transistors MN9, MN10, MN11 and MN12 which are NMOS transistors. There are provided a write data bit line 41, a write data complement bit line 42, a read data bit line 43, a write word line 31, a read complement word line 32, and a read word line 33.

The storage cell SC comprises a pair of cross-coupled inverters L1 and L2. Nodes N1 and N2 serve as the outputs of the respective inverters L1 and L2. The inverter L1 includes a PMOS transistor QP1 having a source receiving the potential $V_{DD}$, a drain connected to the node N1, and a gate connected to the node N2; and an NMOS transistor QN1 having a source receiving the potential $V_{SS}$, a drain connected to the node N1, and a gate connected to the node N2. Likewise, the inverter L2 includes a PMOS transistor QP2 having a source receiving the potential $V_{DD}$, a drain connected to the node N2, and a gate connected to the node N1; and an NMOS transistor QN2 having a source receiving the potential $V_{SS}$, a drain connected to the node N2, and a gate connected to the node N1.

The read circuit RK is a tristate inverter including: a PMOS transistor QP3 having a source receiving the potential $V_{DD}$, and a gate connected to the node N1; a PMOS transistor QP4 having a drain connected at a node N3 to the read data bit line 43, and a gate connected to the read complement word line 32; an NMOS transistor QN6 having a source receiving the potential $V_{SS}$, and a gate connected to the node N1; and an NMOS transistor QN5 having a drain connected at the node N3 to the read data bit line 43, and a gate connected to the read word line 33. The drain of the transistor QP3 and the source of the transistor QP4 are connected to each other, and the drain of the transistor QN6 and the source of the transistor QN5 are connected to each other.

Figure 3:
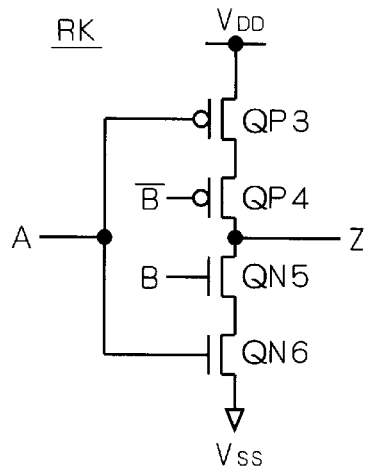
FIG. 3 is a circuit diagram illustrating a tristate inverter.
Figure 4:
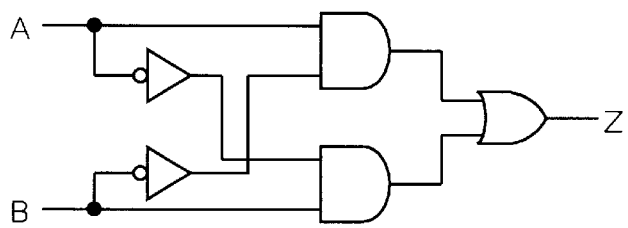
Figure 5:
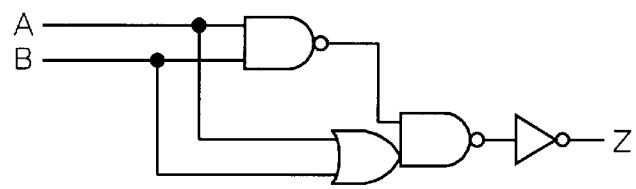
Figure 6:
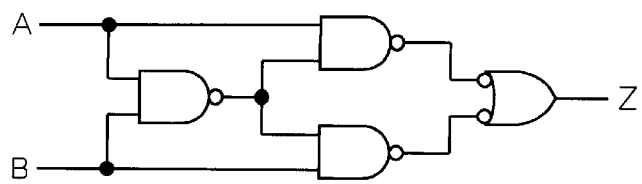

FIG. 3 is a circuit diagram illustrating a configuration of the tristate inverter, and substantially shows the configuration of the read circuit RK. A logic A is provided commonly to the gate of one of the pair of NMOS transistors and to the gate of one of the pair of PMOS transistors. A logic B is provided to the gate of the other of the pair of NMOS transistors, and a logic $\overline{B}$ (a logic complementary to the logic B and indicated with the line over B; this applies to other logics) is provided to the gate of the other of the pair of PMOS transistors. When the logic B is low, the output logic Z is not determined by the tristate inverter (in a tristate condition). When the logic B is high, the output logic Z is the inverse of the logic A.

Referring again to FIG. 2, the pass transistors MN9 and MN10 are connected in series between a node N4 on the write data bit line 41 and the node N1 of the storage cell SC, and function as a switch for transmitting the logic on the write data bit line 41 to the node N1 when both of the write control line 44 and the write word line 31 are high. More specifically, one of the pair of current electrodes (the source-drain pair) of the pass transistor MN9 is connected to the node N1, and one of the pair of current electrodes of the pass transistor MN10 is connected to the node N4. The other of the pair of current electrodes of the pass transistor MN9 and the other of the pair of current electrodes of the pass transistor MN10 are connected to each other. The gate of the pass transistor MN9 is connected at a node N6 to the write control line 44, and the gate of the pass transistor MN10 is connected at the node N4 to the write data bit line 41.

Similarly, the pass transistors MN11 and MN12 are connected in series between a node N5 on the write data complement bit line 42 and the node N2 of the storage cell SC, and function as a switch for transmitting the logic on the write data complement bit line 42 to the node N2 when both of the write control line 44 and the write word line 31 are high. More specifically, one of the pair of current electrodes of the pass transistor MN11 is connected to the node N2, and one of the pair of current electrodes of the pass transistor MN12 is connected to the node N5. The other of the pair of current electrodes of the pass transistor MN11 and the other of the pair of current electrodes of the pass transistor MN12 are connected to each other. The gate of the pass transistor MN11 is connected at the node N6 to the write control line 44, and the gate of the pass transistor MN12 is connected at the node N4 to the write data bit line 41.

Figure 53:
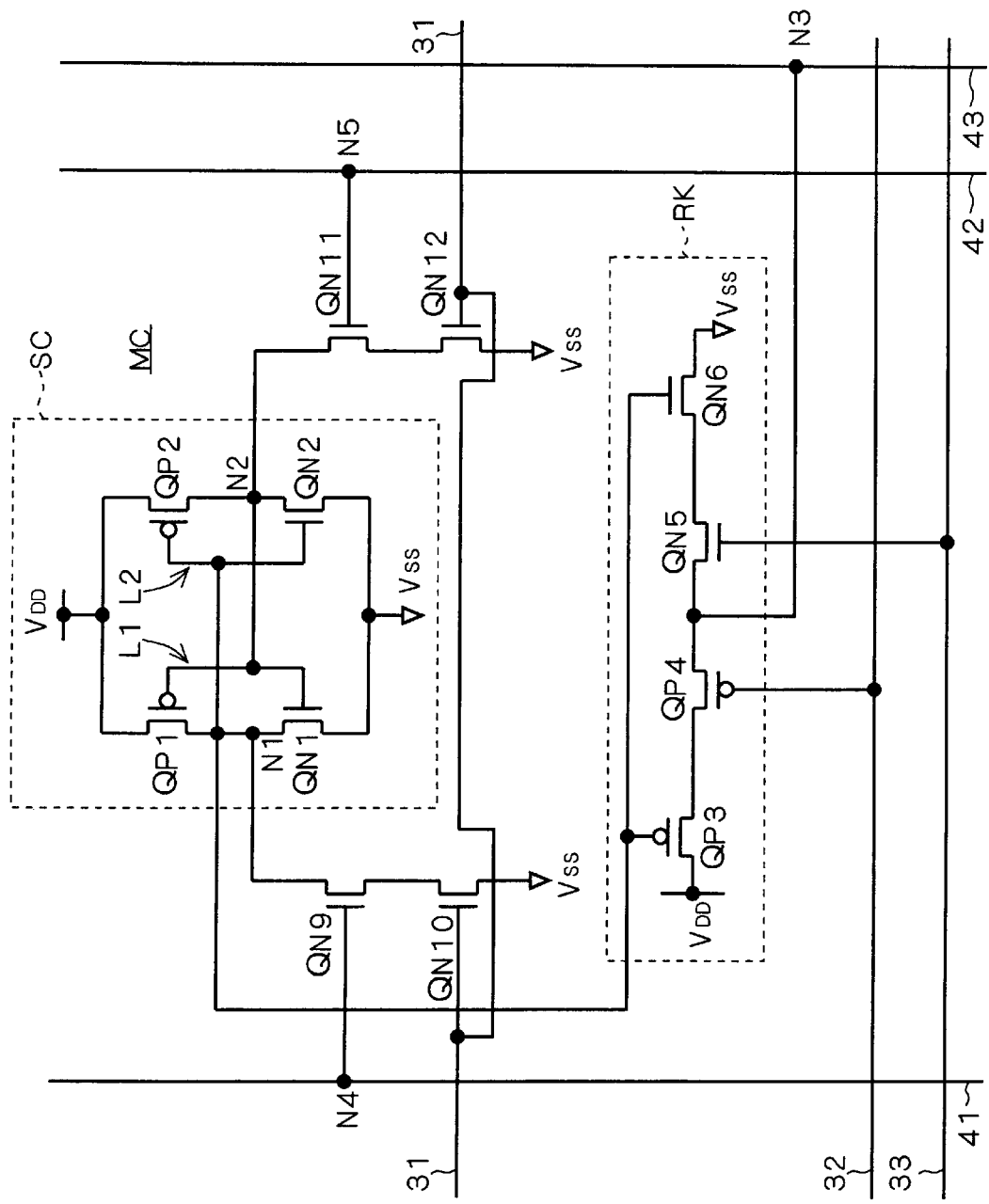

The pass transistors MN10 and MN12 are similar to the transistors QN10 and QN12 shown in FIG. 53 in that the operation thereof is dependent upon the logic on the write word line 31, but differ therefrom in that the sources thereof are not connected to the potential point $V_{SS}$ but to the write data bit line 41 and the write data complement bit line 42, respectively. The pass transistors MN9 and MN11 are similar to the transistors QN9 and QN11 shown in FIG. 53 in being connected between the pass transistor MN10 and the node N1 and between the transistor MN12 and the node N2, respectively, but differ therefrom in that the electrical conduction thereof is dependent upon the logic on the write control line 44.

A write operation into the memory cell having such a configuration is described below. A selected write word line 31 goes high to turn on the pass transistors MN10 and MN12. One of the write data bit line 41 and the write data complement bit line 42 which constitute the write data bit line pair goes high, and the other goes low. In response to these transitions, the write control line 44 goes high to turn on the pass transistors MN9 and MN11.

Thus, the node N1 of the storage cell SC is connected at the node N4 to the write data bit line 41 through the pass transistors MN9 and MN10, and the node N2 is connected at the node N5 to the write data complement bit line 42 through the pass transistors MN11 and MN12. The logics placed on the write data bit line 41 and the write data complement bit line 42 are written into the nodes N1 and N2, respectively. Therefore, the circuit shown in FIG. 2 requires less time to invert the data stored in the storage cell SC than the circuit shown in FIG. 53.

For consideration of the magnitude of potentials, it is assumed that the threshold voltage of the pass transistors MN9 and MN10 is a potential $V_{thn}$ and the potential $V_{DD}$ which is high is applied to the write word line 31 and the write data bit line 41. Because of the substrate effect of the two pass transistors MN9 and MN10 between the nodes N4 and N1, a potential ($V_{DD}-2V_{thn}$) is applied to the node N1.

When the potential difference ($V_{DD}-V_{SS}$) is not greater than 1 V, there is a likelihood that the inverters L1 and L2 of the storage cell SC recognize the potential ($V_{DD}-2V_{thn}$) as being low, rather than as being high. To prevent such a false recognition, the potential to be applied as being high to the write word line 31 may be set at, for example, ($V_{DD}+2V_{thn}$) which is higher than the potential $V_{DD}$. The potentials to be applied as being high to the write word line 31 and the write control line 44 may be set at ($V_{DD}+V_{thn}$) to produce a similar effect.

The operation of each of the memory cells MC disposed in a row corresponding to the selected write word line 31 and in columns corresponding to the unselected write data bit line pairs will be described. In such a memory cell MC, both of the write data bit line 41 and the write data complement bit line 42 are precharged either high or low. In response to the precharged level, the write control line 44 is driven low. In other words, the write control line 44 corresponding to each unselected column is low. Thus, even when the write word line 31 is high to maintain the transistors MN10 and MN12 in an on state, the transistors MN9 and MN11 are off to prevent the storage cell SC from influencing the potentials on the write data bit line 41 and the write data complement bit line 42. Therefore, the memory cell MC can reduce unwanted power consumption while rapidly performing a write operation which inverts the stored content thereof.

FIGS. 4 through 9 are circuit diagrams illustrating XOR circuits for exclusive-ORing the logics A and B to provide the logic Z. These XOR circuits may be used to provide the exclusive-OR of the logic on the write data bit line 41 and the logic on the write data complement bit line 42 to the write control line 44. Although XOR circuits are shown as incorporated in the bit line decoder 4 in the configuration of FIG. 1, the XOR circuits may be provided separately from the bit line decoder 4.

Figure 7:
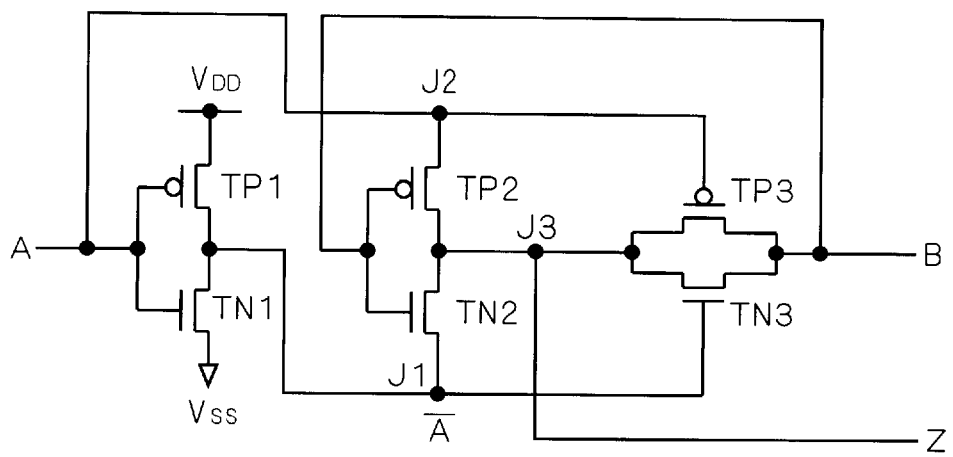
Figure 8:
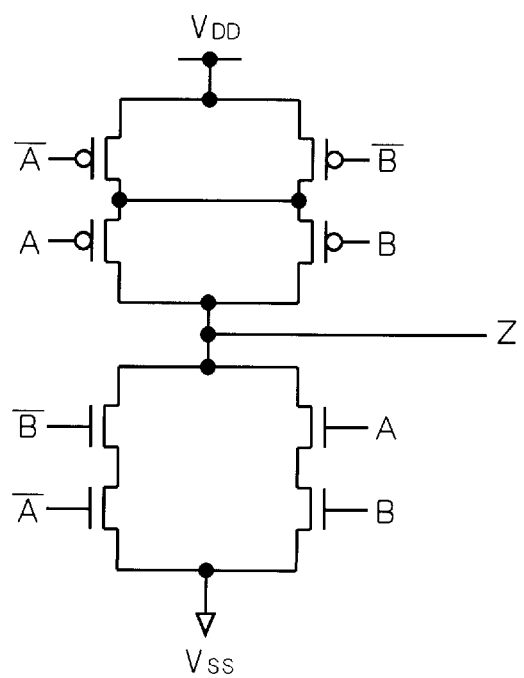

As an example, the operation of the XOR circuit shown in FIG. 7 is described below. When the logic A is high, an inverter comprised of a PMOS transistor TP1 and an NMOS transistor TN1 provides a logic "low" to a node J1. On the other hand, the logic A, i.e. a high, is provided to a node J2. A PMOS transistor TP2 and an NMOS transistor TN2 are connected in series between the nodes J2 and J1 and serve as an inverter. This inverter receives the logic B to output the logic Z which is the logic $\overline{B}$ to a node J3. At this time, no conflict between the logic B and the logic $\overline{B}$ occurs at the node J3 since a transmission gate comprised of a PMOS transistor TP3 and an NMOS transistor TN3 is off.

When the logic A is low, the nodes J1 and J2 are high and low, respectively. Thus, both of the transistors TP3 and TN3 turn on to provide the logic B as the logic Z to the node J3. On the other hand, when the logic B is high, the NMOS transistor TN2 transmits the logic "high" at the node J1 to the node J3. When the logic B is low, the PMOS transistor TP2 transmits the logic "low" at the node J2 to the node J3. In either case, the logic B is provided as the logic Z to the node J3.

The circuit of FIG. 7 which performs the above-mentioned operation provides the XOR of the logics A and B. To obtain a value complementary to the exclusive-OR (XNOR or exclusive-NOR), the output from the XOR circuit may be inverted or the XOR circuit may receive the logics A and B one of which is inverted.

Figure 10:
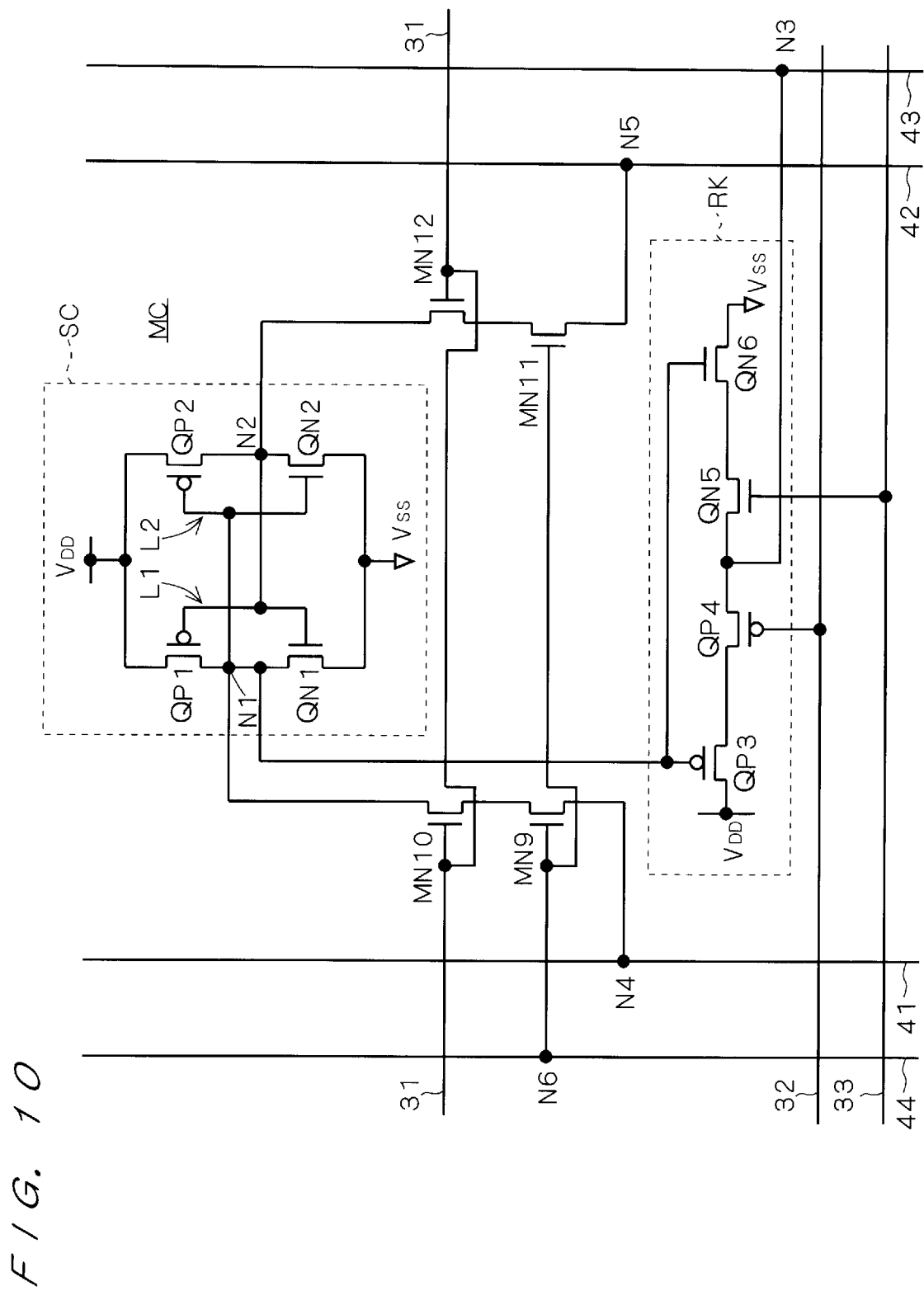
FIG. 10 is a circuit diagram of a modification of the first preferred embodiment of the present invention.

FIG. 10 is a circuit diagram showing a modification of the first preferred embodiment. The configuration of FIG. 10 is similar to that of FIG. 2 in that the transistor MN9 the switching of which is controlled by the logic on the write control line 44 and the transistor MN10 the switching of which is controlled by the logic on the write word line 31 are connected in series between the nodes N1 and N4, but differs in that the transistors MN9 and MN10 are interchanged in position. Likewise, the configuration of FIG. 10 further differs from that of FIG. 2 in that the transistors MN11 and MN12 are interchanged in position between the nodes N2 and N5. Such a configuration can, of course, provide effects similar to those of the configuration shown in FIG. 2.

Figure 11:
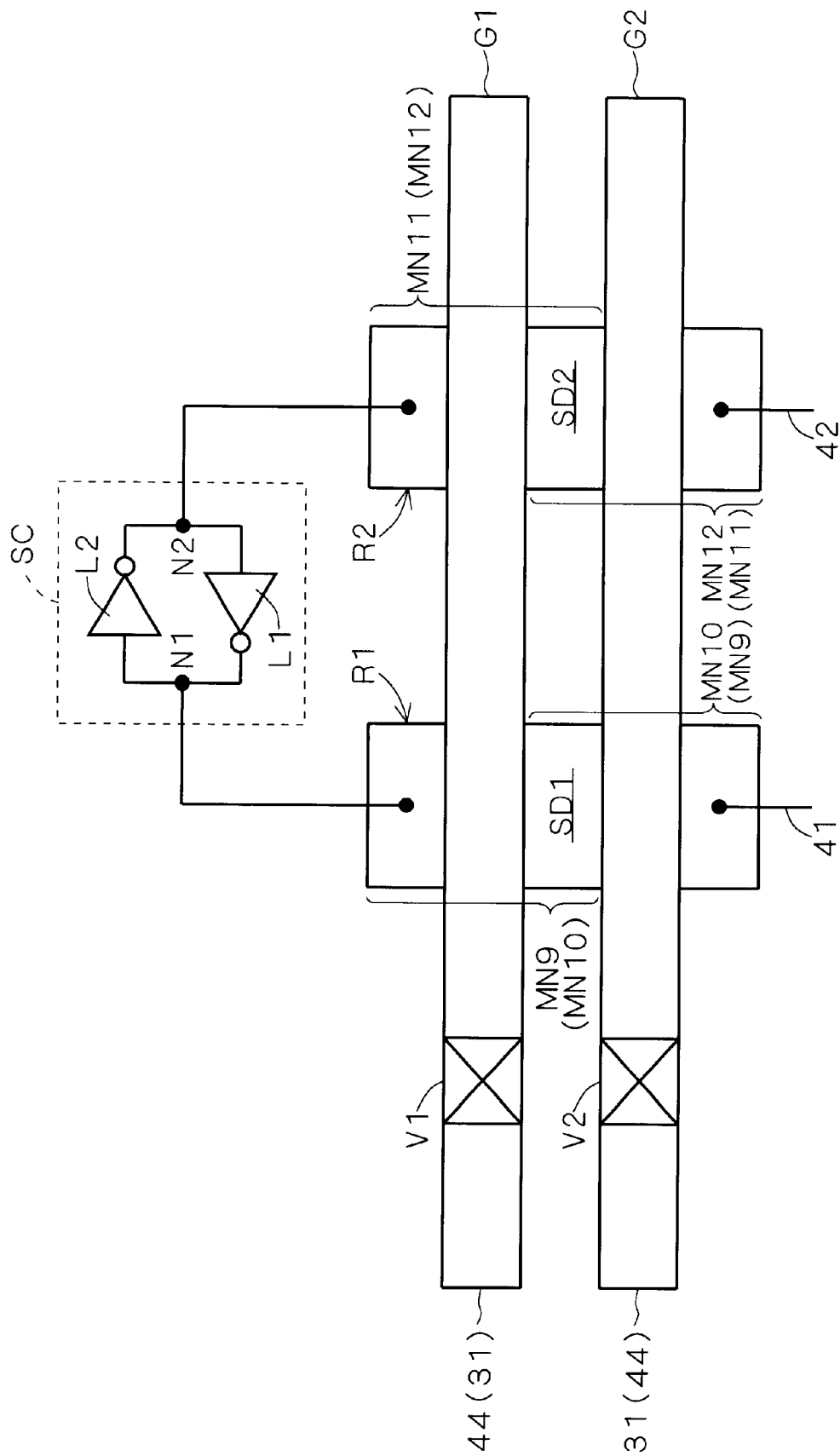
FIG. 11 schematically illustrates the first preferred embodiment of the present invention.

FIG. 11 schematically illustrates an arrangement of the pass transistors MN9, MN10, MN11 and MN12. The inverters L1 and L2 of the storage cell SC are symbolically shown for simplicity of illustration, while the arrangement of the pass transistors MN9, MN10, MN11 and MN12 is shown in plan as well as the write data bit line 41, the write data complement bit line 42, the write control line 44 and the write word line 31. In FIG. 11, the reference characters inside round brackets correspond to the configuration shown in FIG. 10, and the reference characters to the left of the parenthesized reference characters correspond to the configuration shown in FIG. 2.

The arrangement of FIG. 11 will be described in conformity with the configuration shown in FIG. 2. The pass transistors MN9 and MN10 are formed in an active region R1. One of the pair of current electrodes of the pass transistor MN9 is connected to the node N1, and one of the pair of current electrodes of the pass transistor MN10 is connected to the write data bit line 41. The other of the pair of current electrodes of the pass transistor MN9 and the other of the pair of current electrodes of the pass transistor MN10 share a source/drain region SD1 with each other. Likewise, the pass transistors MN11 and MN12 are formed in an active region R2. One of the pair of current electrodes of the pass transistor MN11 is connected to the node N2, and one of the pair of current electrodes of the pass transistor MN12 is connected to the write data complement bit line 42. The other of the pair of current electrodes of the pass transistor MN11 and the other of the pair of current electrodes of the pass transistor MN12 share a source/drain region SD2 with each other.

A gate interconnect line G1 serving as the gates of the pass transistors MN9 and MN11 and a gate interconnect line G2 serving as the gates of the pass transistors MN10 and MN12 are provided over the active regions R1 and R2 (on the side of the viewer with respect to the plane of the figure), with a gate insulation film not shown therebetween. The write control line 44 and the write word line 31 is provided over the gate interconnect lines G1 and G2. The write control line 44 and the write word line 31 are connected to the gate interconnect lines G1 and G2 through via contacts V1 and V2, respectively.

As stated above, the pass transistors MN9 and MN10 share the source/drain region SD1 with each other, and the pass transistor MN11 and MN12 share the source/drain region SD2 with each other. This reduces the area of the pass transistors MN9, MN10, MN11 and MN12 when arranged.

A potential $(V_{DD}+V_{SS})/2$ may be applied to the write data bit line $41_j$ and the write data complement bit line $42_j$ during the precharge period. In this case, a circuit for non-invertingly amplifying the potentials on the write data bit line $41_j$ and the write data complement bit line $42_j$ should be provided in the preceding stage of the XOR circuit. For example, when $V_{SS}=0$ V and the input margin of the XOR circuit is great enough to allow the input of a potential $2V_{DD}$, the amplification factor of the non-inverting amplifier circuit should be doubled. This allows the pair of inputs to the XOR circuit to be both high even when the precharge potential is either $V_{DD}/2$ or $V_{DD}$. Further, when the precharge potential is $V_{SS}$, the pair of inputs to the XOR circuit are both low. Therefore, this circuit configuration can enjoy the effects of the first preferred embodiment.

Second Preferred Embodiment

Figure 12:
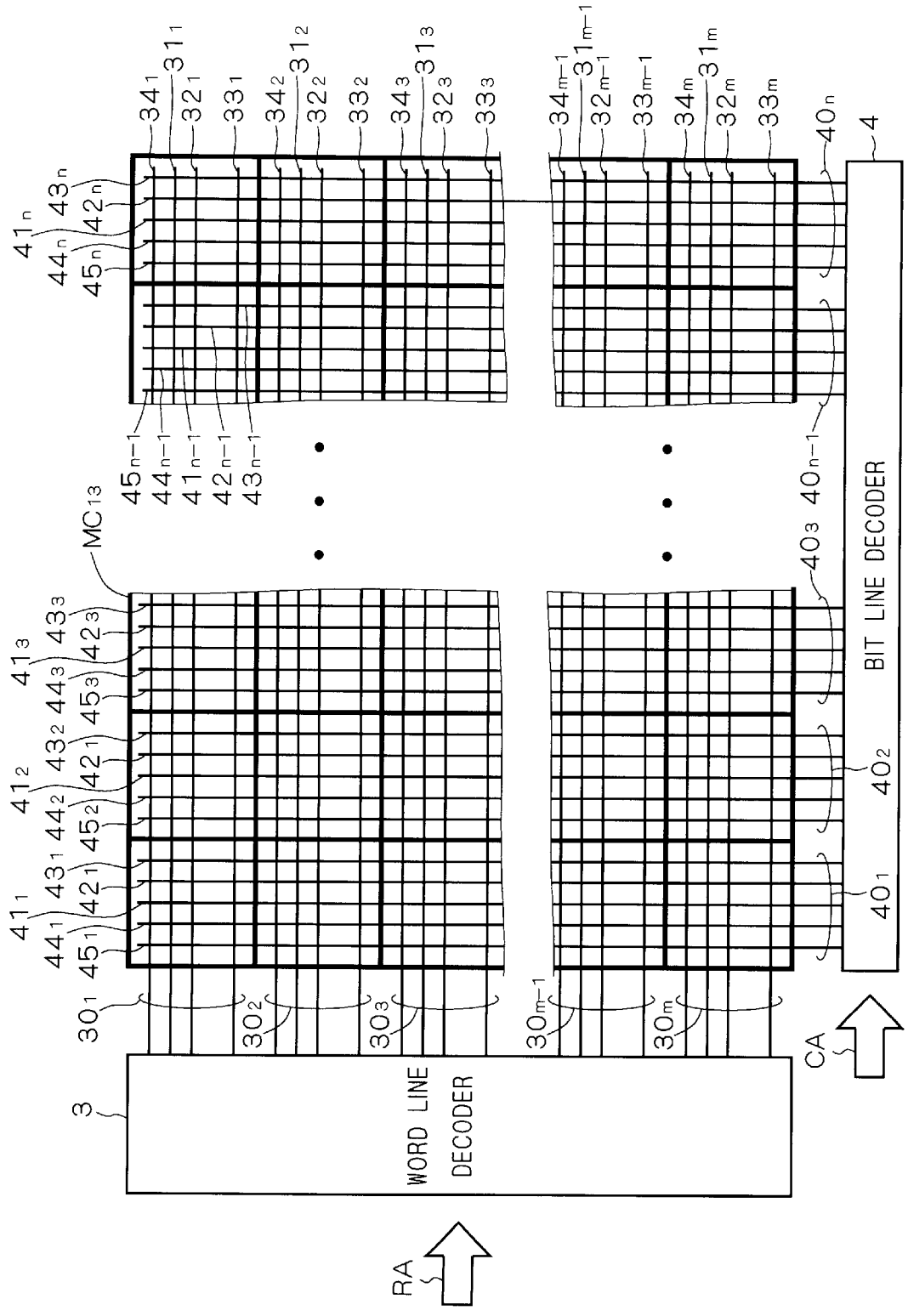
FIG. 12 conceptually shows an SRAM according to a second preferred embodiment of the present invention.

FIG. 12 conceptually shows a configuration of an SRAM including a memory cell array and its peripheral components according to a second preferred embodiment of the present invention. The SRAM of FIG. 12 has a characteristic structure in that a write complement control line $45_j$ and a write complement word line $34_i$ are added respectively to each bit line group $40_j$ and each word line group $30_i$ of the SRAM configuration of the first preferred embodiment.

The bit line decoder 4 and the word line decoder 3 place potentials (or logics) on the write complement control line $45_j$ and the write complement word line $34_i$, respectively. More specifically, logics complementary to the logics on the write control line $44_j$ and the write word line $31_i$ are placed on the write complement control line $45_j$ and the write complement word line $34_i$, respectively.

Figure 13:
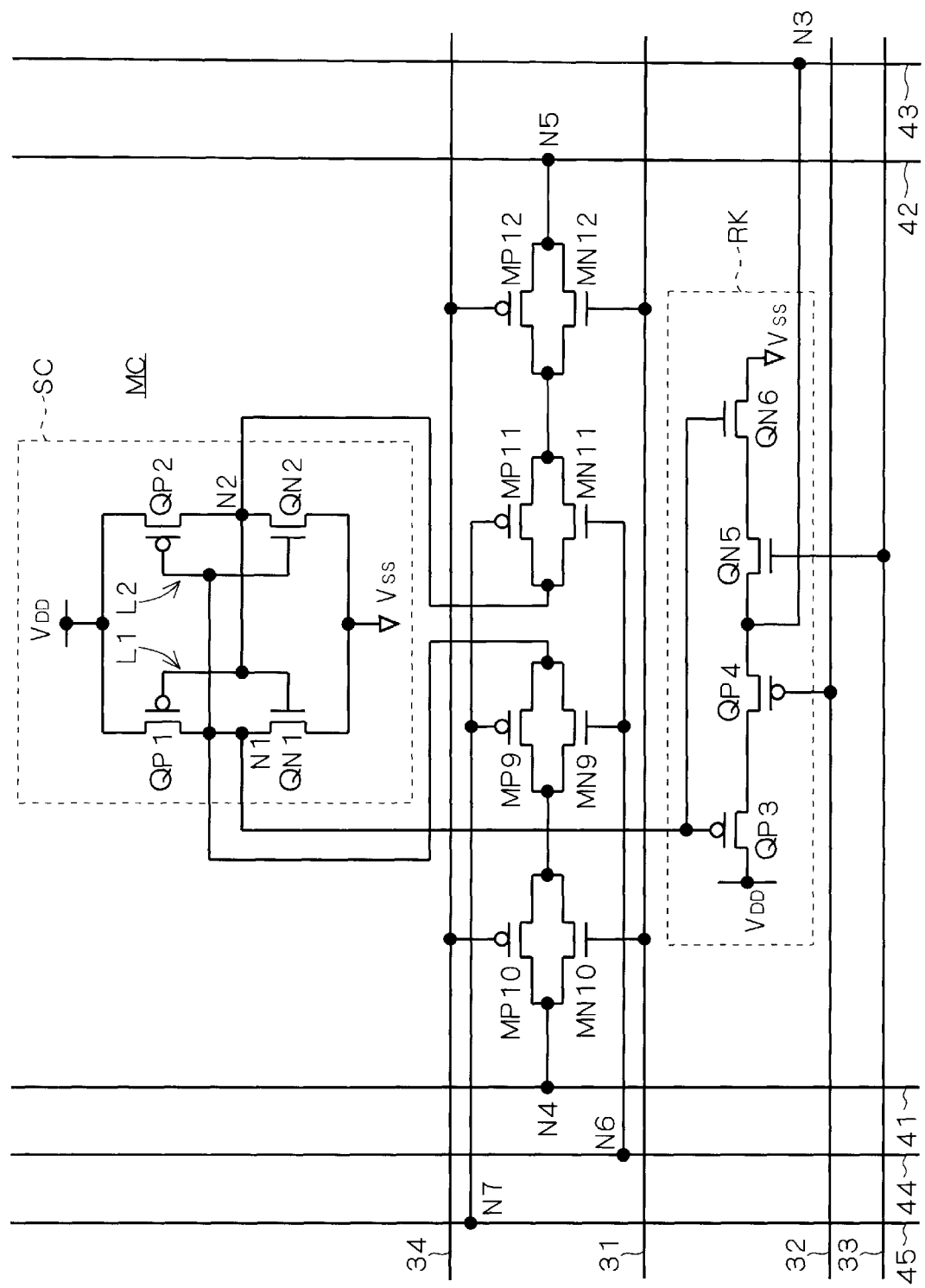
FIG. 13 is a circuit diagram showing a single memory cell according to the second preferred embodiment of the present invention.

FIG. 13 is a circuit diagram illustrating a configuration of a single memory cell MC shown in FIG. 12. As in the background art, the subscripts denoting the row and column locations are omitted in FIG. 13. The memory cell MC of FIG. 13 comprises pass transistors MP9, MP10, MP11 and MP12 which are PMOS transistors in addition to the components of the memory cell MC of FIG. 2. The write complement control line 45 and the write complement word line 34 are additionally provided.

The pass transistors MP9, MP10, MP11 and MP12 are connected in parallel with the pass transistors MN9, MN10, MN11 and MN12, respectively. The logics to be provided to the gates of the pass transistors MP9, MP10, MP11 and MP12 are complementary to the logics to be provided to the gates of the pass transistors MN9, MN10, MN11 and MN12, respectively. That is, the gates of the pass transistors MP9 and MP11 are connected at a node N7 to the write complement control line 45, and the gates of the pass transistors MP10 and MP12 are connected to the write complement word line 34.

Thus, the pass transistors MP9, MP10, MP11 and MP12 and the pass transistors MN9, MN10, MN11 and MN12 constitute respective transmission gates. Therefore, the potential reduction by the amount of the threshold voltage $V_{thn}$ due to the substrate effect, which is mentioned with reference to FIG. 2, does not occur when the logic "high" is transmitted from the write data bit line 41 to the node N1 (or when the logic "high" is transmitted from the write data complement bit line 42 to the node N2). This is advantageous in eliminating the need to provide a booster circuit for increasing the potential to be applied to the write word line 31.

Figure 14:
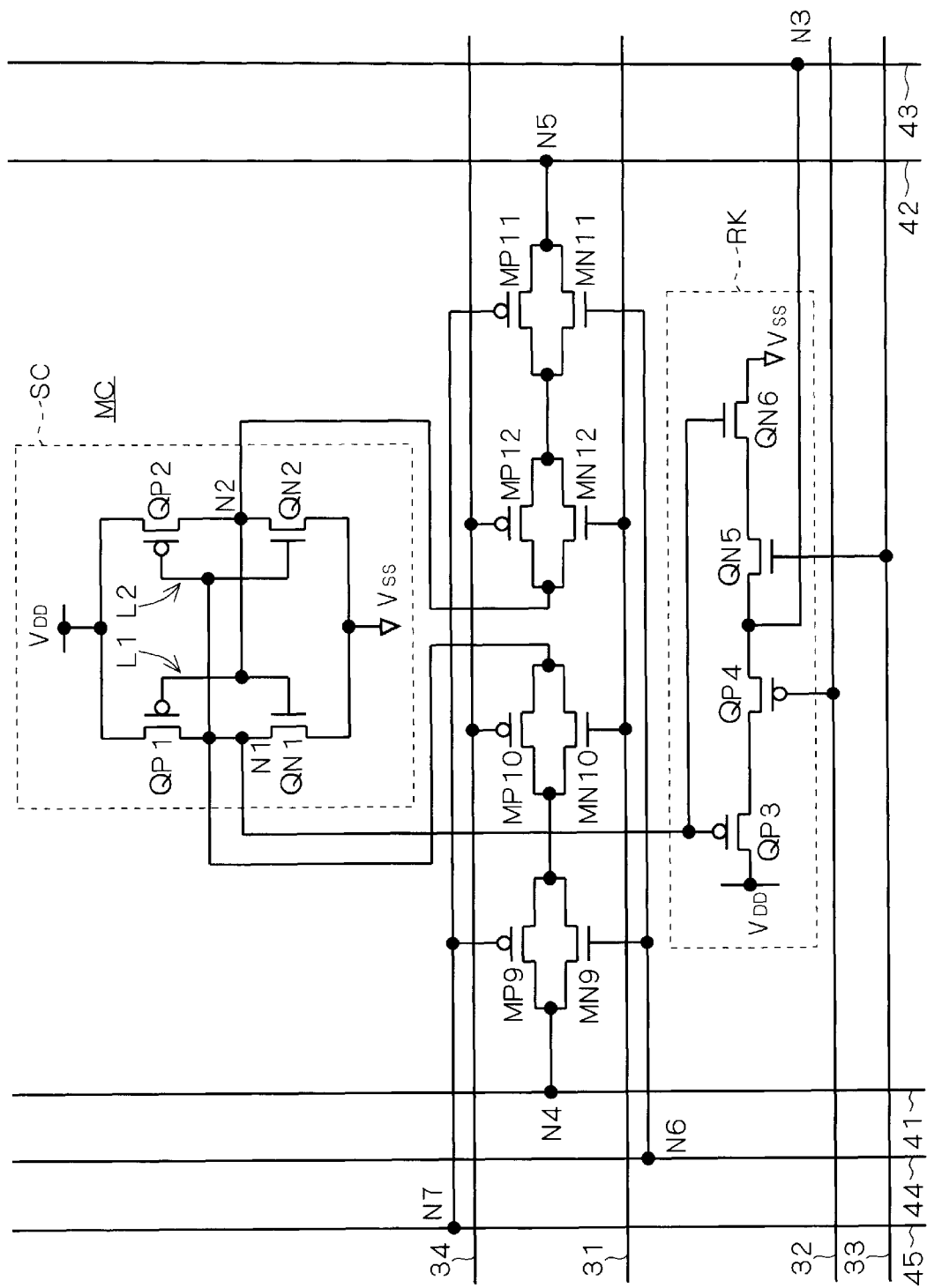
FIG. 14 is a circuit diagram of a modification of the second preferred embodiment of the present invention.

FIG. 14 is a circuit diagram showing a modification of the second preferred embodiment of the present invention, and corresponds to FIG. 10 as seen in accordance with the first preferred embodiment. The configuration of FIG. 14 differs from that of FIG. 13 in that the transmission gate comprised of the pass transistors MN9 and MP9 and the transmission gate comprised of the pass transistors MN10 and MP10 are interchanged in position between the nodes N1 and N4, and in that the transmission gate comprised of the pass transistors MN11 and MP11 and the transmission gate comprised of the pass transistors MN12 and MP12 are interchanged in position between the nodes N2 and N5. Such a configuration can, of course, provide the effects of the second preferred embodiment.

The pass transistors MP9 and MP10, like the pass transistors MN9 and MN10, may share a source/drain region with each other to reduce the required area thereof. The same holds true for the pass transistors MP11 and MP12.

Figure 15:
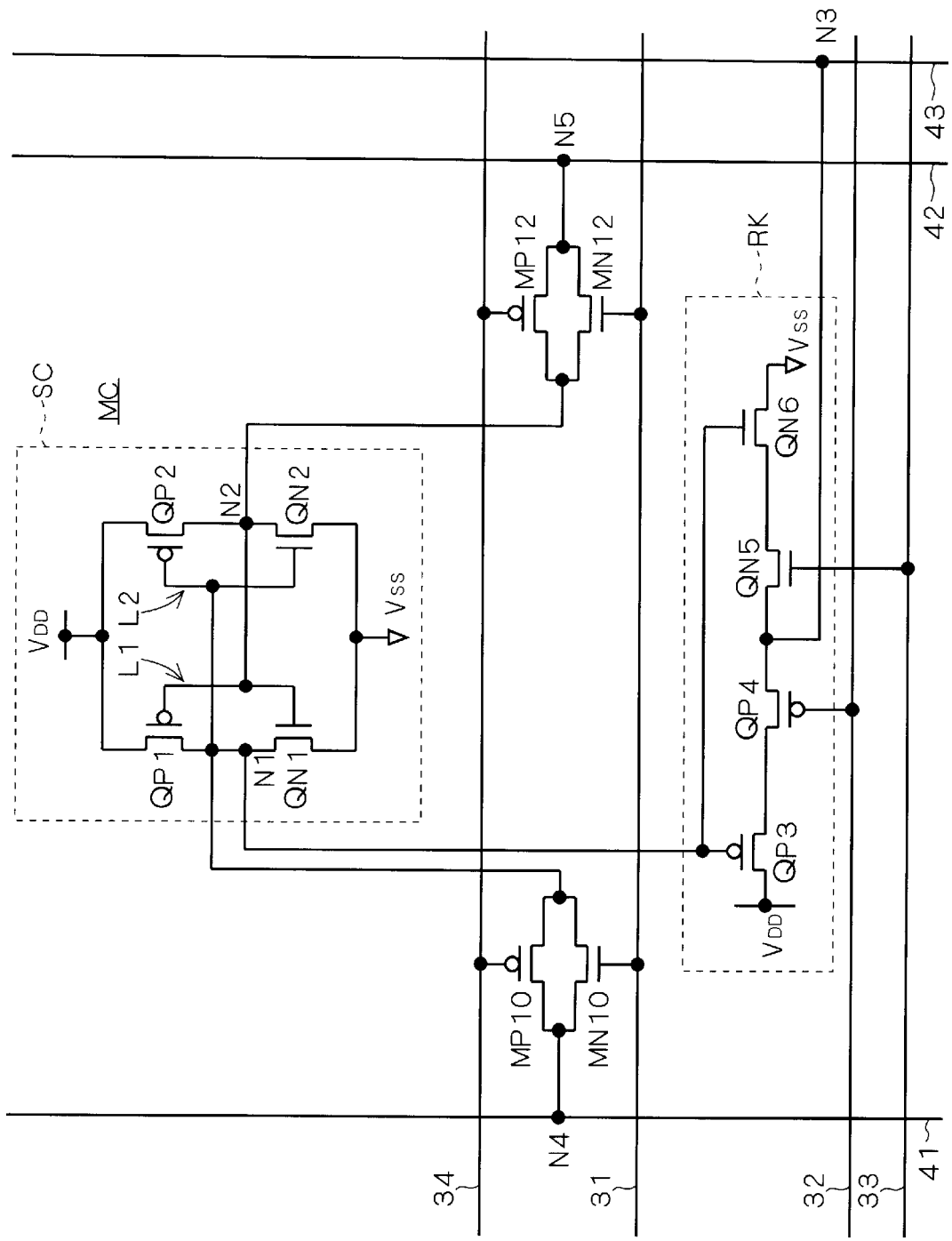
FIG. 15 is a circuit diagram of another modification of the second preferred embodiment of the present invention.
Figure 52:
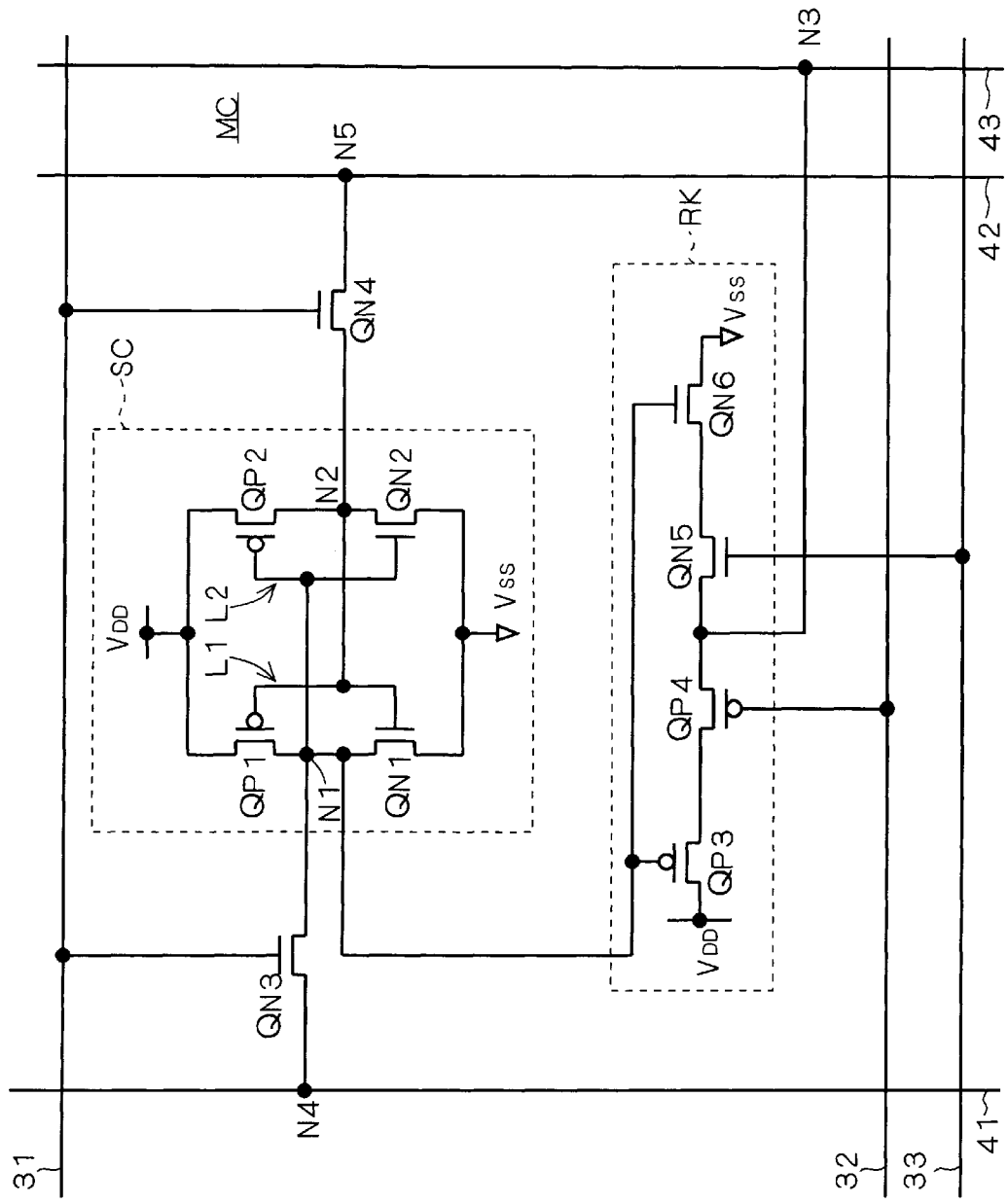
FIGS. 52 and 53 are circuit diagrams illustrating background art memory cells.

Transmission gates may be used in place of the access transistors to avoid the potential reduction by the amount of the threshold voltage $V_{thn}$ due to the substrate effect. FIG. 15 is a circuit diagram in which: the write complement word line 34 is added to the circuit of FIG. 52; the access transistor QN3 of FIG. 52 is replaced with a transmission gate comprised of the PMOS transistor MP10 and the NMOS transistor MN10; and the access transistor QN4 of FIG. 52 is replaced with a transmission gate comprised of the PMOS transistor MP12 and the NMOS transistor MN12.

The electrical conduction of the transistors MN10 and MN12 is controlled by the logic on the write word line 31, and the electrical conduction of the transistors MP10 and MP12 is controlled by the logic on the write complement word line 34, as in the configuration of FIG. 14. This also avoids the potential reduction by the amount of the threshold voltage $V_{thn}$ due to the substrate effect, to eliminate the need to increase the potential to be applied to the write word line 31. The configuration of FIG. 15 has advantages over those of FIGS. 13 and 14 in that the reduction in the number of transmission gates by one in each branch transmitting write data accordingly shortens the time required to access the storage cell SC and reduces an area penalty and in that there is no need to provide the write control line 44 and, hence, the XOR circuit. Unlike the second preferred embodiment, however, the modification shown in FIG. 15 has a poorer function to avoid the potential conflict between the storage cell SC and the write data bit line pair in each of the memory cells MC disposed in unselected columns.

Third Preferred Embodiment

Figure 16:
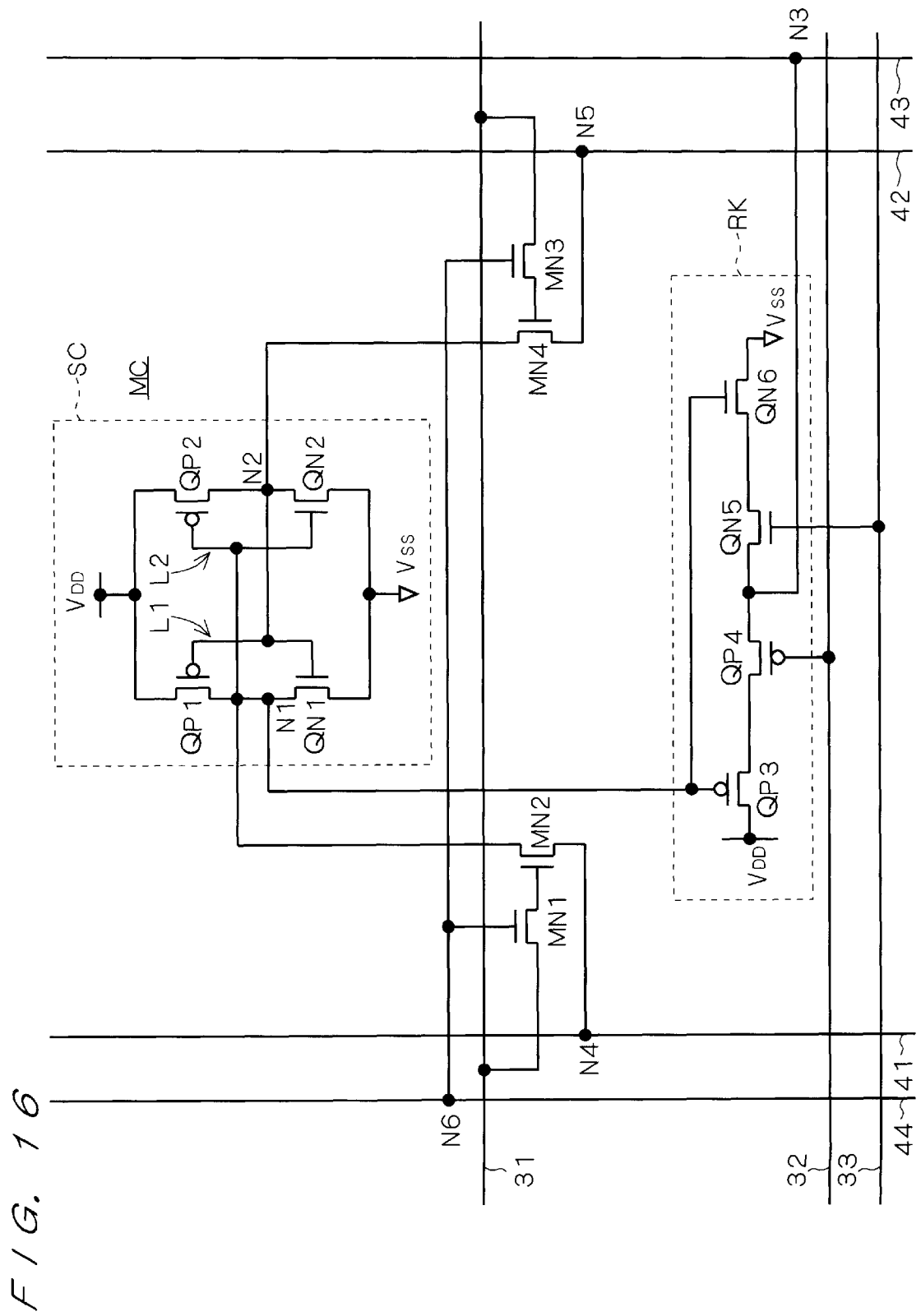
FIG. 16 is a circuit diagram illustrating a single memory cell according to a third preferred embodiment of the present invention.

FIG. 16 is a circuit diagram illustrating a configuration of a single memory cell MC according to a third preferred embodiment of the present invention. As in the background art, the subscripts denoting the row and column locations are omitted in FIG. 16. The memory cell MC shown in FIG. 16 may be used as each of the memory cells $MC_{ij}$ shown in FIG. 1.

The memory cell MC comprises access transistors MN2 and MN4 and control transistors MN1 and MN3 all of which are NMOS transistors in place of the access transistors QN3 and QN4 of the configuration of FIG. 52.

The access transistor MN2, like the access transistor QN3, controls the electrical conduction between the nodes N1 and N4. The access transistor MN2 is similar to the access transistor QN3 in having a gate connected to the write word line 31, but there is a difference in that the control transistor MN1 is connected between the write word line 31 and the access transistor MN2. Likewise, the access transistor MN4 controls the electrical conduction between the nodes N2 and N5. The access transistor MN4 is similar to the access transistor QN4 in having a gate connected to the write word line 31, but there is a difference in that the control transistor MN3 is connected between the write word line 31 and the access transistor MN4.

Since the gates of the control transistors MN1 and MN3 are connected through the node N6 to the write control line 44, the electrical conduction between the node N1 and N4 and the electrical conduction between the nodes N2 and N5 are effected only when both of the write word line 31 and the write control line 44 are high, as in the first preferred embodiment. Therefore, the memory cell MC of FIG. 16 can reduce unwanted power consumption while rapidly performing a write operation which inverts the stored content thereof, as in the first preferred embodiment.

The above-mentioned configuration is disadvantageous in that it is impossible to share a source/drain region between the control transistor MN1 and the access transistor MN2 or between the control transistor MN3 and the access transistor MN4, as compared with the configuration of the first preferred embodiment.

Figure 17:
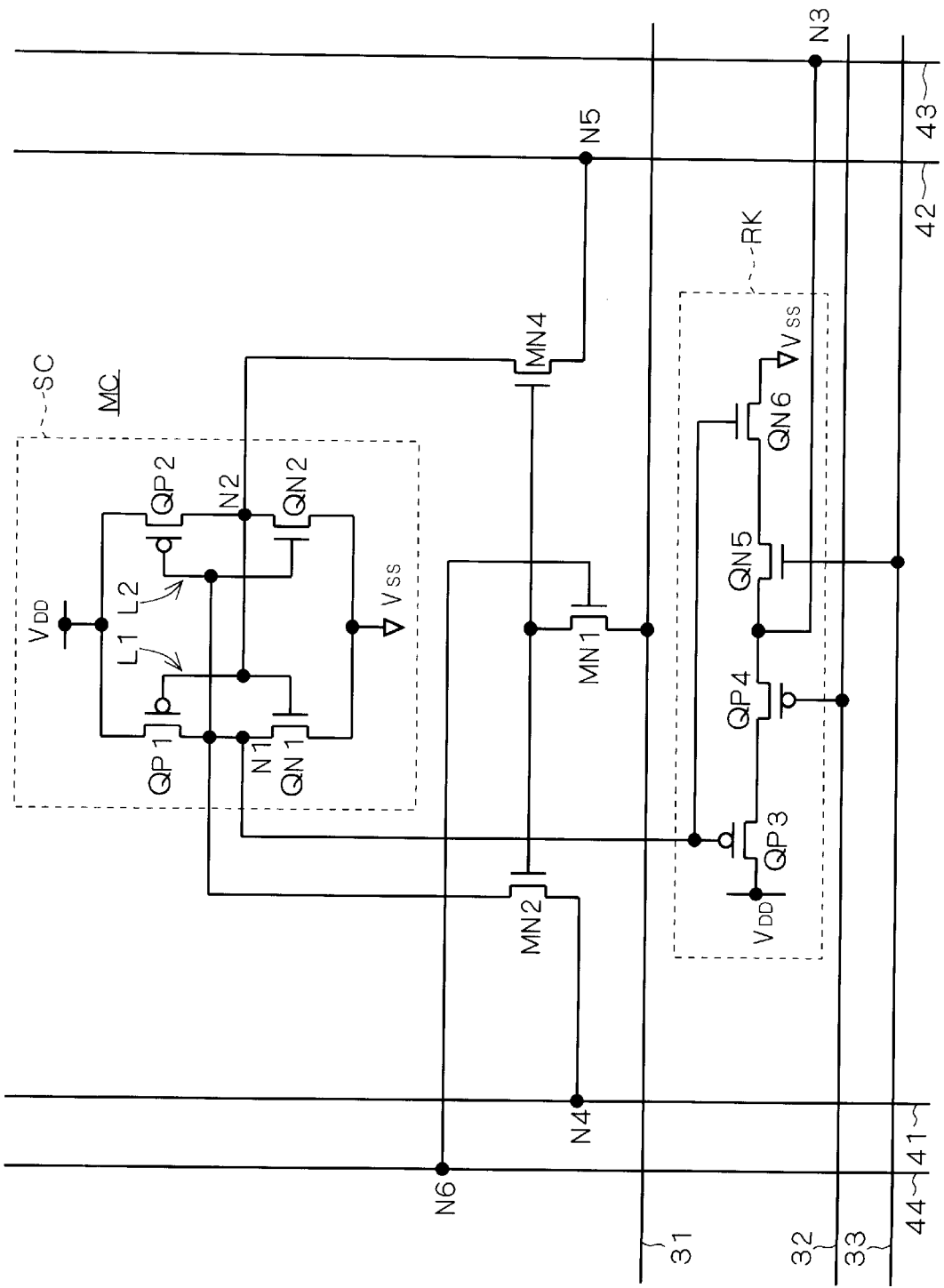
FIG. 17 is a circuit diagram of a modification of the third preferred embodiment of the present invention.

However, the control transistors MN1 and MN3 conduct depending on the logic on the write control line 44, thereby to transmit the logic on the write word line 31 to the gates of the access transistors MN2 and MN4, respectively. Therefore, the circuit configuration of FIG. 16 may be modified in such a manner that the control transistor MN3 is merged with the control transistor MN1, as shown in FIG. 17, to reduce the required area thereof.

Fourth Preferred Embodiment

Figure 18:
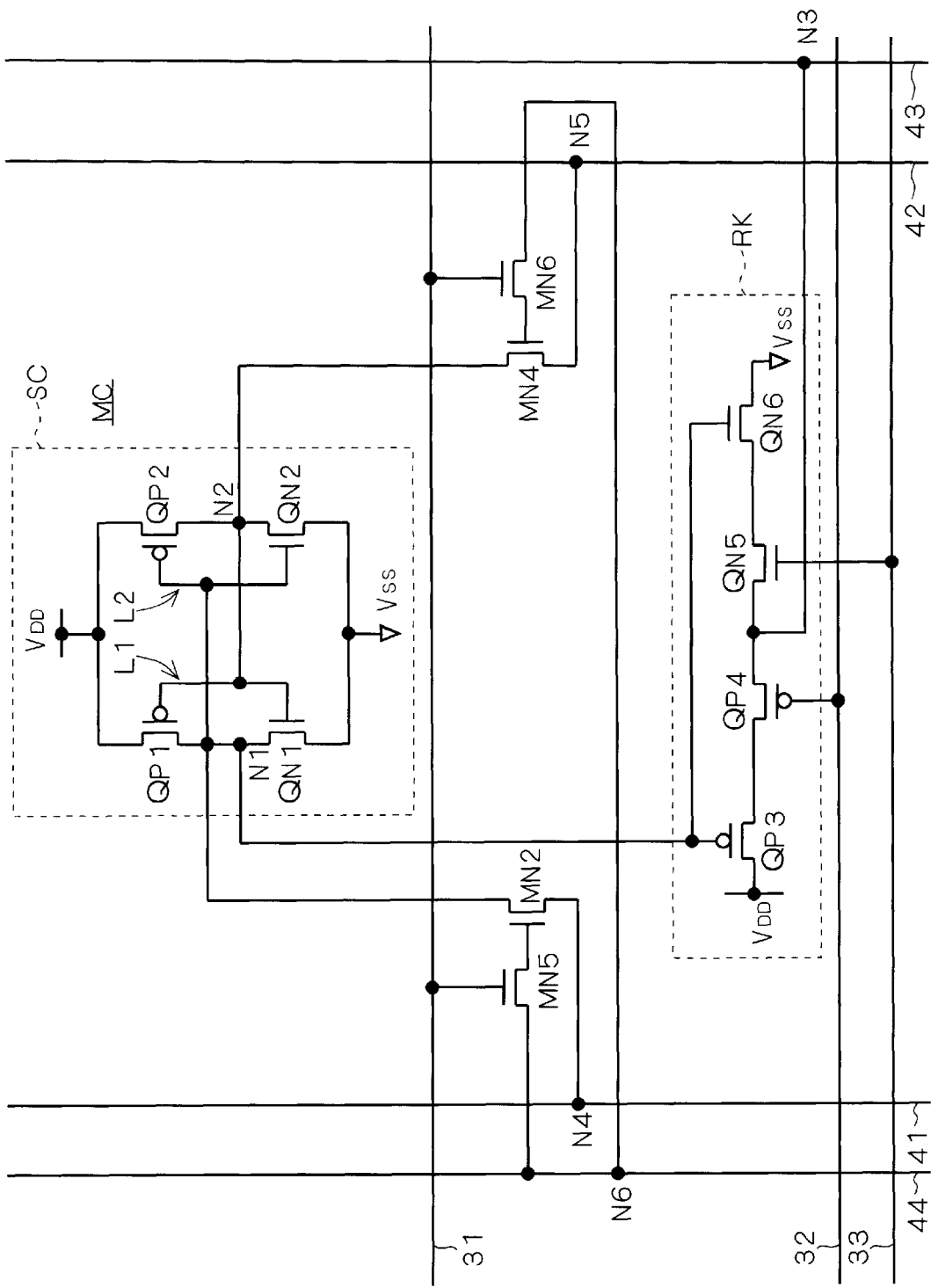
FIG. 18 is a circuit diagram illustrating a single memory cell according to a fourth preferred embodiment of the present invention.

FIG. 18 is a circuit diagram illustrating a configuration of a single memory cell MC according to a fourth preferred embodiment of the present invention. As in the background art, the subscripts denoting the row and column locations are omitted in FIG. 18. The memory cell MC shown in FIG. 18 may be used as each of the memory cells $MC_{ij}$ shown in FIG. 1. The memory cell MC of FIG. 18 comprises control transistors MN5 and MN6 in place of the control transistors MN1 and MN3 of the memory cell MC of FIG. 16.

The gates of the control transistors MN5 and MN6 are connected commonly to the write word line 31. The control transistor MN5 is connected between the write data bit line 41 and the gate of the access transistor MN2, and the control transistor MN6 is connected between the write data complement bit line 42 and the gate of the access transistor MN4. Therefore, the electrical conduction between the node N1 and N4 and the electrical conduction between the nodes N2 and N5 are effected only when both of the write word line 31 and the write control line 44 are high, as in the first preferred embodiment. Therefore, the memory cell MC of FIG. 18 can reduce unwanted power consumption while rapidly performing a write operation which inverts the stored content thereof, as in the first preferred embodiment.

The above-mentioned configuration is disadvantageous in that it is impossible to share a source/drain region between the control transistor MN5 and the access transistor MN2 or between the control transistor MN6 and the access transistor MN4, as compared with the configuration of the first preferred embodiment.

Figure 19:
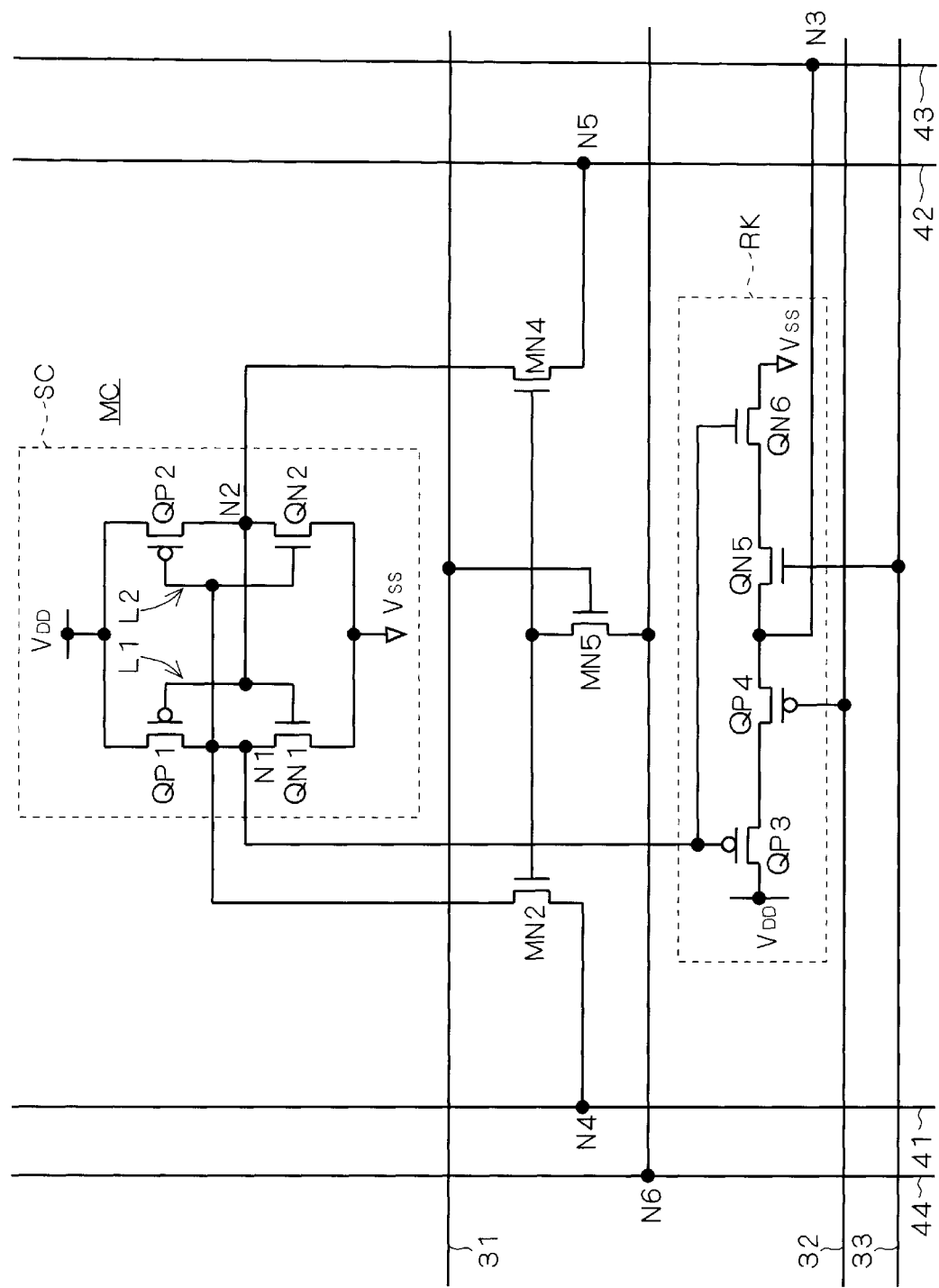
FIG. 19 is a circuit diagram of a modification of the fourth preferred embodiment of the present invention.

However, the control transistors MN5 and MN6 conduct depending on the logic on the write word line 31, thereby to transmit the logic on the write control line 44 to the gates of the access transistors MN2 and MN4, respectively. Therefore, the circuit configuration of FIG. 18 may be modified in such a manner that the control transistor MN6 is merged with the control transistor MN5, as shown in FIG. 19, to reduce the required area thereof.

Fifth Preferred Embodiment

Figure 20:
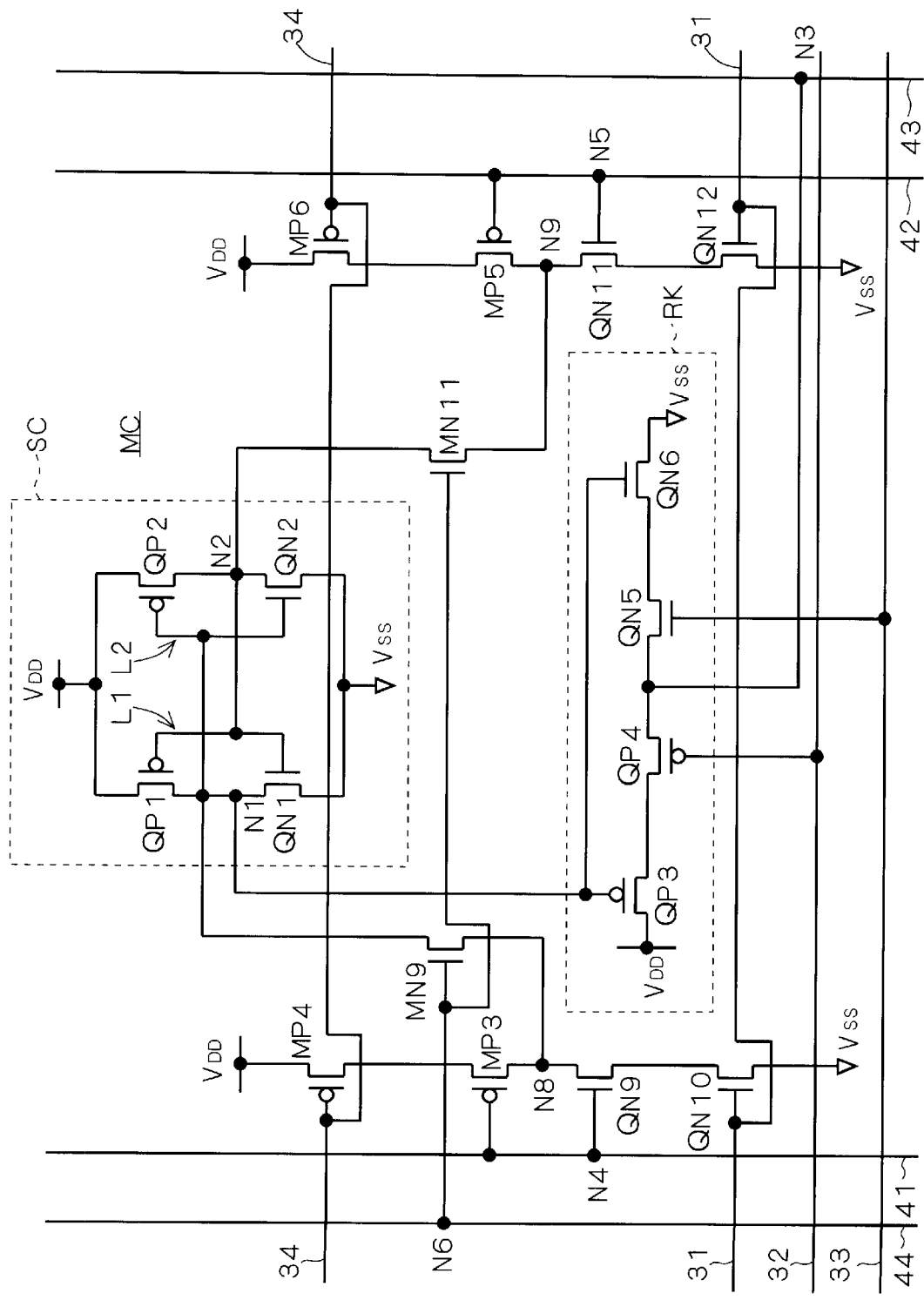
FIG. 20 is a circuit diagram illustrating a single memory cell according to a fifth preferred embodiment of the present invention.

FIG. 20 is a circuit diagram illustrating a configuration of a single memory cell MC according to a fifth preferred embodiment of the present invention. As in the background art, the subscripts denoting the row and column locations are omitted in FIG. 20. The memory cell MC shown in FIG. 20 may be used as each of the memory cells $MC_{ij}$ shown in FIG. 12, but does not require the write complement control line 45. The memory cell MC of FIG. 20 has two major differences from that of FIG. 53.

A first difference is that the transistor QN9 is not directly connected to the node N1, but the pass transistor MN9 is connected between the transistor QN9 and the node N1. Similarly, the transistor QN11 is not directly connected to the node N2, but the pass transistor MN11 is connected between the transistor QN11 and the node N2. As in the first preferred embodiment, the gates of the pass transistors MN9 and MN11 are connected at the node N6 to the write control line 44. The point of connection between the transistors QN9 and MN9 is indicated as a node N8, and the point of connection between the transistors QN11 and MN11 is indicated as a node N9.

A second difference is that PMOS transistors MP3 and MP4 are connected in series between a potential point providing the potential $V_{DD}$ (also referred to hereinafter as a "potential point $V_{DD}$") and the node N8. Likewise, PMOS transistors MP5 and MP6 are connected in series between the potential point $V_{DD}$ and the node N9. One of the pair of current electrodes of each of the transistors MP4 and MP6 receives the potential $V_{DD}$, and the gate of each of the transistors MP4 and MP6 is connected to the write complement word line 34. One of the pair of current electrodes of the transistor MP3 is connected to the node N8, and one of the pair of current electrodes of the transistor MP5 is connected to the node N9. The other of the pair of current electrodes of the transistor MP3 and the other of the pair of current electrodes of the transistor MP4 are connected to each other. The other of the pair of current electrodes of the transistor MP5 and the other of the pair of current electrodes of the transistor MP6 are connected to each other. The gates of the transistors MP3 and MP5 are connected to the write data bit line 41 and the write data complement bit line 42, respectively.

With this arrangement, the provision of the transistors MP3 and MP4 capable of forcing the node N1 high from externally of the storage cell SC and the transistors MP5 and MP6 capable of forcing the node N2 high allows a rapid write operation which inverts the content stored in the memory cell MC. Additionally, the electrical conduction between the nodes N1 and N8 and the electrical conduction between the nodes N2 and N9 are effected by the pass transistors MN9 and MN19, respectively, depending on the logic on the write control line 44. This reduces the unwanted power consumption resulting from the potential conflict between the node N1 and the write data bit line 41 and between the node N2 and the write data complement bit line 42.

Transistors MP3, MP4, QN9 and QN10 and transistors MP5, MP6, QN11 and QN12 constitute a pair of tristate inverters having outputs at the nodes N8 and N9, respectively. The operation of the memory cell MC of the fifth preferred embodiment will be described from the viewpoint of the operation of these tristate inverters.

These tristate inverters function as inverters only when the write word line 31 is high and, accordingly, the write complement word line 34 is low. That is, the logic complementary to the logic on the write data bit line 41 is provided to the node N8, and the logic complementary to the logic on the write data complement bit line 42 is provided to the node N9. With the write word line 31 held low and, accordingly, the write complement word line 34 held high, the potential at the node N8 is not placed by the corresponding tristate inverter (in the tristate condition) even if the transistors MP3 and QN9 turn on, and the potential at the node N9 is not placed by the corresponding tristate inverter even if the transistors MP5 and QN11 turn on.

In the word line group 30 corresponding to the row including the memory cell MC to be written or the selected word line group 30, a high potential and a low potential are applied to the write word line 31 and the write complement word line 34 respectively, and the logics complementary to the logics on the write data bit line 41 and the write data complement bit line 42 are applied to the nodes N8 and N9 respectively. In the bit line group 40 corresponding to the column including the memory cell MC to be written or the selected bit line group 40, logics complementary to each other are applied to the write data bit line 41 and the write data complement bit line 42. Then, the logic on the write control line 44 goes high to turn on the pass transistors MN9 and MN11. Therefore, the logics complementary to the logics on the write data bit line 41 and the write data complement bit line 42 are rapidly stored in the nodes N1 and N2 respectively, even in the case of inverting the stored content of the storage cell SC.

In each of the memory cells MC disposed in the row corresponding to the selected word line group 30, the tristate inverters function as inverters. On the other hand, in each of the memory cells MC disposed in the rows corresponding to the unselected bit line groups 40, since the write data bit line 41 and the write data complement bit line 42 are precharged to approximately equal potentials, the logic on the write control line 44 is low which places the pass transistors MN9 and MN11 in a non-conducting state. This provides disconnection between the node N1 and the write data bit line 41 and between the node N2 and the write data complement bit line 42 to reduce the unwanted power consumption resulting from the potential conflict.

The pass transistors MN9 and MN10 may be replaced with transmission gates in order to avoid the voltage reduction by the amount of the threshold voltage of the pass transistors MN9 and MN10 due to the substrate effect. Alternatively, the potential on the write word line 31 may be increased by the amount of the threshold voltage in order to compensate for the substrate effect of the pass transistors MN9 and MN10.

Figure 21:
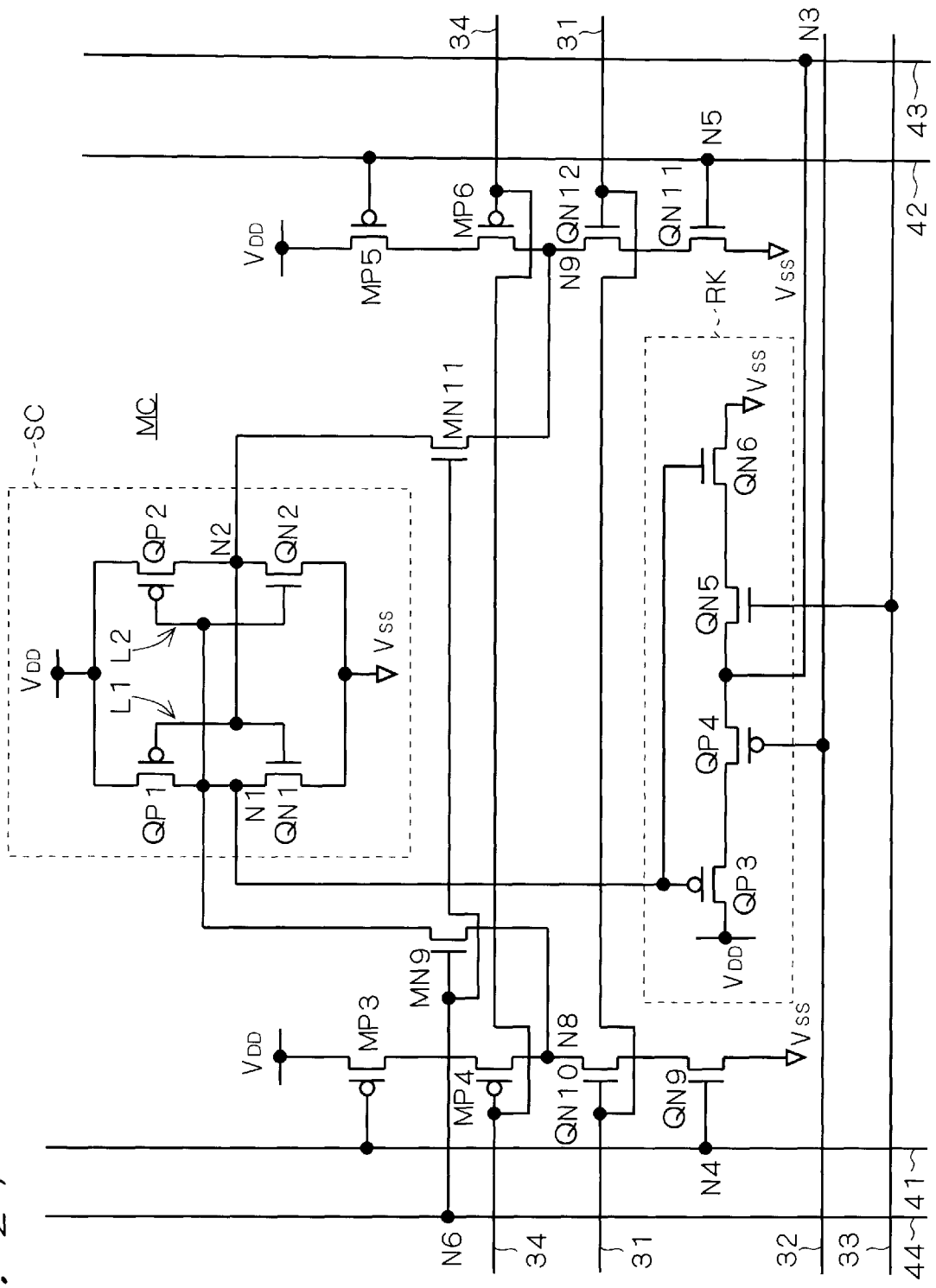
FIG. 21 is a circuit diagram of a memory cell according to a first modification of the fifth preferred embodiment of the present invention.

FIG. 21 is a circuit diagram illustrating a configuration of a memory cell MC according to a first modification of the fifth preferred embodiment of the present invention. The memory cell configuration of FIG. 21 is such that the sequence of the in-series connected transistors QN9 and QN10 of the configuration of FIG. 20 is changed and the sequence of the in-series connected transistors QN11 and QN12 of the configuration of FIG. 20 is changed. The first modification can, of course, produce the effects of the fifth preferred embodiment.

Figure 22:
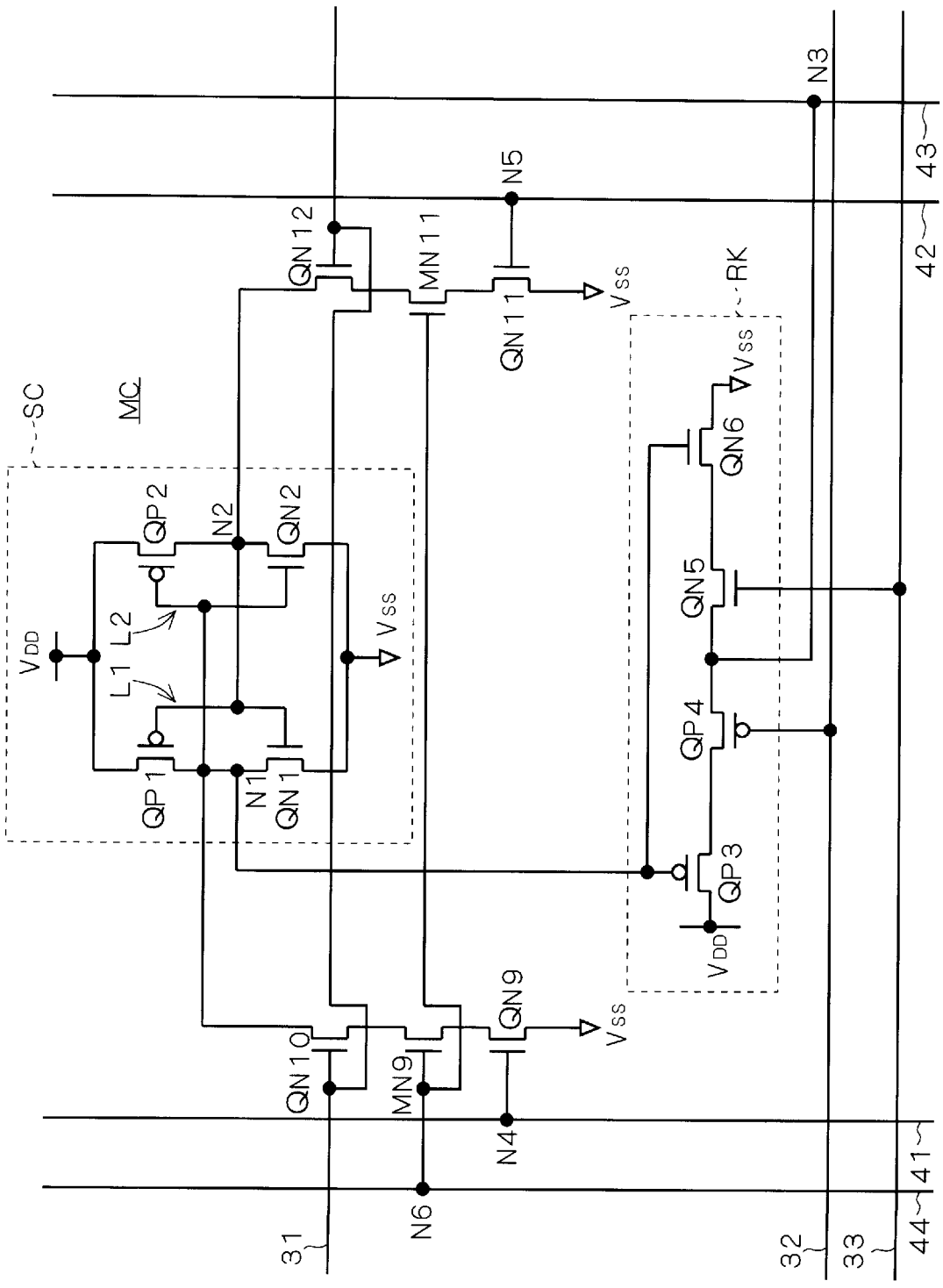
FIG. 22 is a circuit diagram of a memory cell according to a second modification of the fifth preferred embodiment of the present invention.

FIG. 22 is a circuit diagram illustrating a configuration of a memory cell MC according to a second modification of the fifth preferred embodiment of the present invention. The memory cell configuration of FIG. 22 is such that the transistors MP3, MP4, MP5 and MP6 for providing the logic "high" to the storage cell SC are eliminated from the configuration of FIG. 21, and such that the sequence of the in-series connected pass transistor MN9 and transistor QN10 of the configuration of FIG. 21 is changed and the sequence of the in-series connected pass transistor MN11 and transistor QN12 of the configuration of FIG. 21 is changed.

As compared with the circuit shown in FIG. 53, the sequence of the in-series connected transistors QN9 and QN10 is changed between the node N1 and the potential point $V_{SS}$, and the pass transistor MN9 the electrical conduction of which is controlled by the logic on the write control line 44 is connected between the transistors QN9 and QN10. Likewise, the sequence of the in-series connected transistors QN11 and QN12 is changed between the node N2 and the potential point $V_{SS}$, and the pass transistor MN11 the electrical conduction of which is controlled by the logic on the write control line 44 is connected between the transistors QN11 and QN12.

With this arrangement, it is impossible to externally force the storage cell SC high. This is disadvantageous in being incapable of rapidly performing the write operation which inverts the content stored in the storage cell SC. However, the configuration of FIG. 22 has advantages over the configurations shown in FIGS. 20 and 21 in eliminating the need to provide the write complement word line 34 and in being usable as each of the SRAM memory cells MC shown in FIG. 1. Further, the configuration of FIG. 22 has an advantage over the configuration shown in FIG. 53 in that the write data bit line 41 and the write data complement bit line 42 in each of the unselected bit line groups 40 may be precharged either low or high.

Of course, there are six possible sequences of in-series connection of the transistors QN10, MN9 and QN9, and any one of the sequences may be used to produce the above-mentioned effects. The same is true for the sequences of in-series connection of the transistors QN12, MN11 and QN11.

FIG. 23 is a circuit diagram of a dual write port static memory cell according to a third modification of the fifth preferred embodiment of the present invention. The memory cell of FIG. 23 comprises two word line groups (except for the read complement word line 32 and the read word line 33), two bit line groups (except for the read data bit line 43) and two tristate inverters corresponding to the two bit line groups. A first word line group, a first bit line group and a first tristate inverter are designated by the respective reference characters of FIG. 21 with the character "a" added thereto, and a second word line group, a second bit line group and a second tristate inverter are designated by the respective reference characters of FIG. 21 with the character "b" added thereto.

Such a dual write port static memory cell can, of course, rapidly perform the storing operation when inverting the stored content of the storage cell SC and reduce the unwanted power consumption resulting from the potential conflict.

Figure 24:
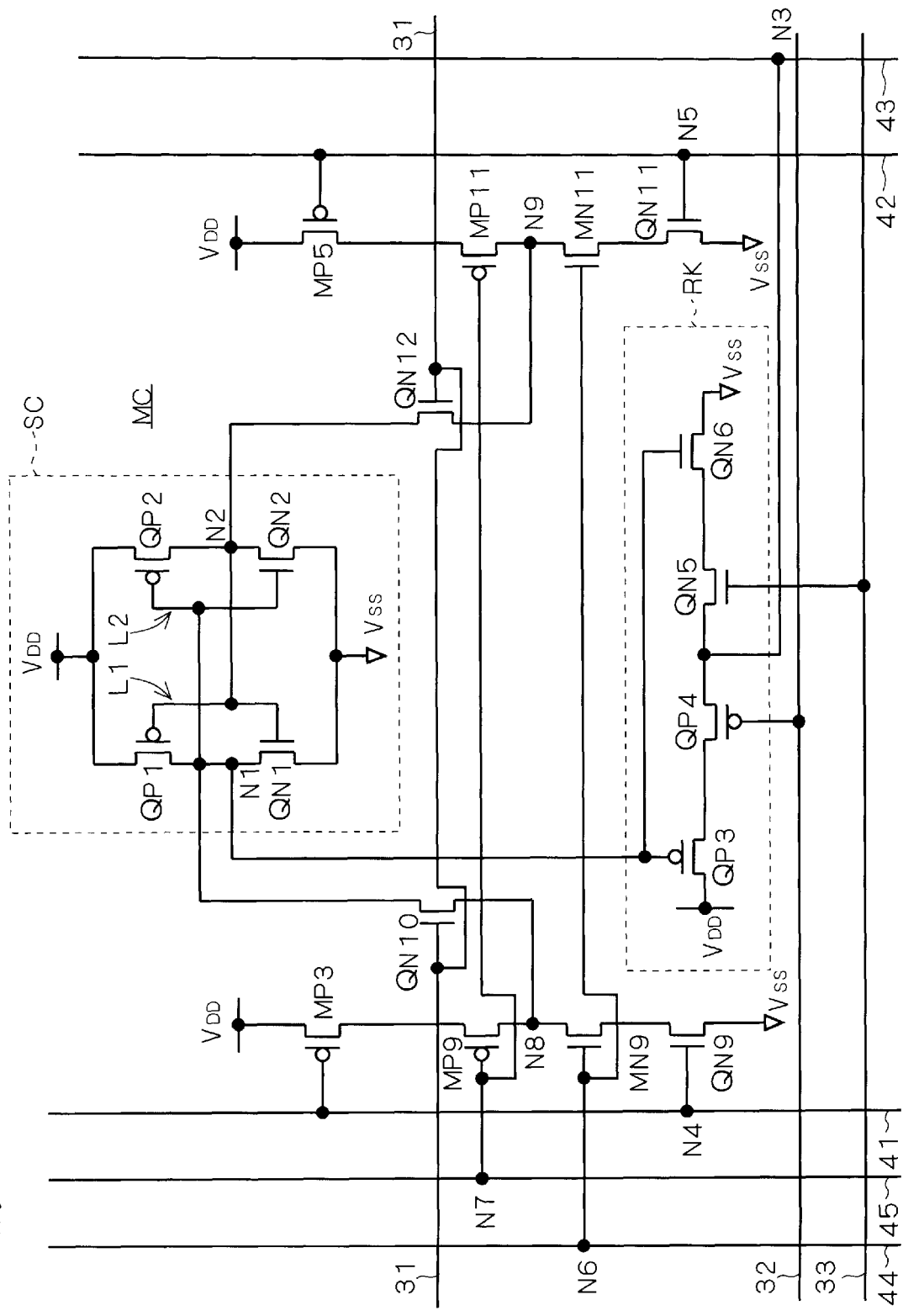
FIG. 24 is a circuit diagram of a memory cell according to a fourth modification of the fifth preferred embodiment of the present invention.

FIG. 24 is a circuit diagram showing a configuration of a memory cell MC according to a fourth modification of the fifth preferred embodiment of the present invention. The configuration of FIG. 24 differs from that of FIG. 21 in that devices between the node N8 serving as the output of one of the pair of tristate inverters and the transistor MP3, between the node N8 and the transistor QN9 and between the node N8 and the node N1 are changed and in that devices between the node N9 serving as the output of the other of the pair of tristate inverters and the transistor MP5, between the node N9 and the transistor QN11 and between the node N9 and the node N2 are changed.

The node N8 is connected through the transistor MP9 to the transistor MP3, is connected through the NMOS transistor MN9 to the transistor QN9, and is connected through the NMOS transistor QN10 to the storage node N1. The node N9 is connected through the PMOS transistor MP11 to the transistor MP5, is connected through the NMOS transistor MN11 to the transistor QN11, and is connected through the NMOS transistor QN12 to the storage node N2.

The fourth modification of the fifth preferred embodiment does not employ the write complement word line 34 but comprises the write complement control line 45 instead. The gates of the transistors MP9 and MP11 are connected at the node N7 to the write complement control line 45, and the gates of the transistors MN9 and MN11 are connected at the node N6 to the write control line 44. The gates of the transistors QN10 and QN12 are connected to the write word line 31.

The write word line 31 corresponding to the selected row is activated to turn on the transistors QN10 and QN12. This provides electrical conduction between the nodes N1 and N8 and between the nodes N2 and N9. The write control line 44 and the write complement control line 45 corresponding to the selected column go high and low, respectively, to turn on the transistors MP9, MP11, MN9 and MN11. Thus, to-be-written data which are the inverses of the logics on the write data bit line 41 and the write data complement bit line 42 are provided through the nodes N8 and N9 to the nodes N1 and N2, respectively, of the memory cell MC to be written. This operation is rapidly performed even when inverting the data to be stored in the storage cell SC.

In each of the memory cells MC which are disposed in the selected row but are not to be written (or disposed in unselected columns), the write control line 44 and the write complement control line 45 go low and high, respectively, to turn off the transistors MP9, MP11, MN9 and MN11. The nodes N8 and N9 are placed in the tristate condition. Thus, the nodes N1 and N2 are not forced to any logics from externally of the storage cell SC, and the unwanted power consumption resulting from the potential conflict is prevented.

Figure 25:
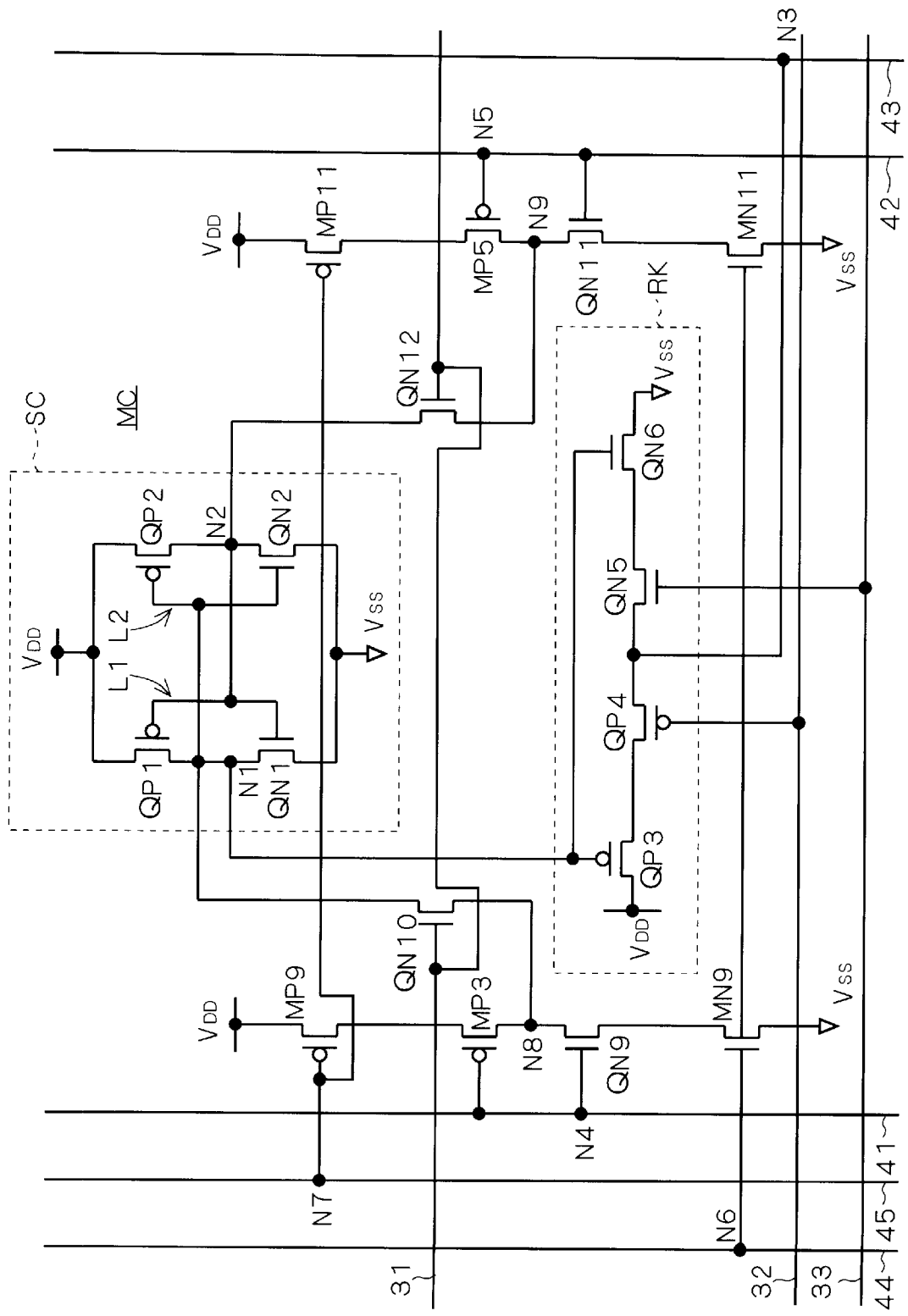
FIG. 25 is a circuit diagram of a memory cell according to a fifth modification of the fifth preferred embodiment of the present invention.

FIG. 25 is a circuit diagram showing a configuration of a memory cell MC according to a fifth modification of the fifth preferred embodiment of the present invention. The configuration of FIG. 25 differs from that of FIG. 24 in that the sequence of the in-series connected transistors MP3 and MP9 between the node N8 and the potential point $V_{DD}$ is changed, that the sequence of the in-series connected transistors MN9 and QN9 between the node N8 and the potential point $V_{SS}$ is changed, that the sequence of the in-series connected transistors MP5 and MP11 between the node N9 and the potential point $V_{DD}$ is changed, and that the sequence of the in-series connected transistors MN11 and QN11 between the node N9 and the potential point $V_{SS}$ is changed. Therefore, the configuration shown in FIG. 25 produces the effects of rapidly writing data and reducing the unwanted power consumption.

Figure 26:
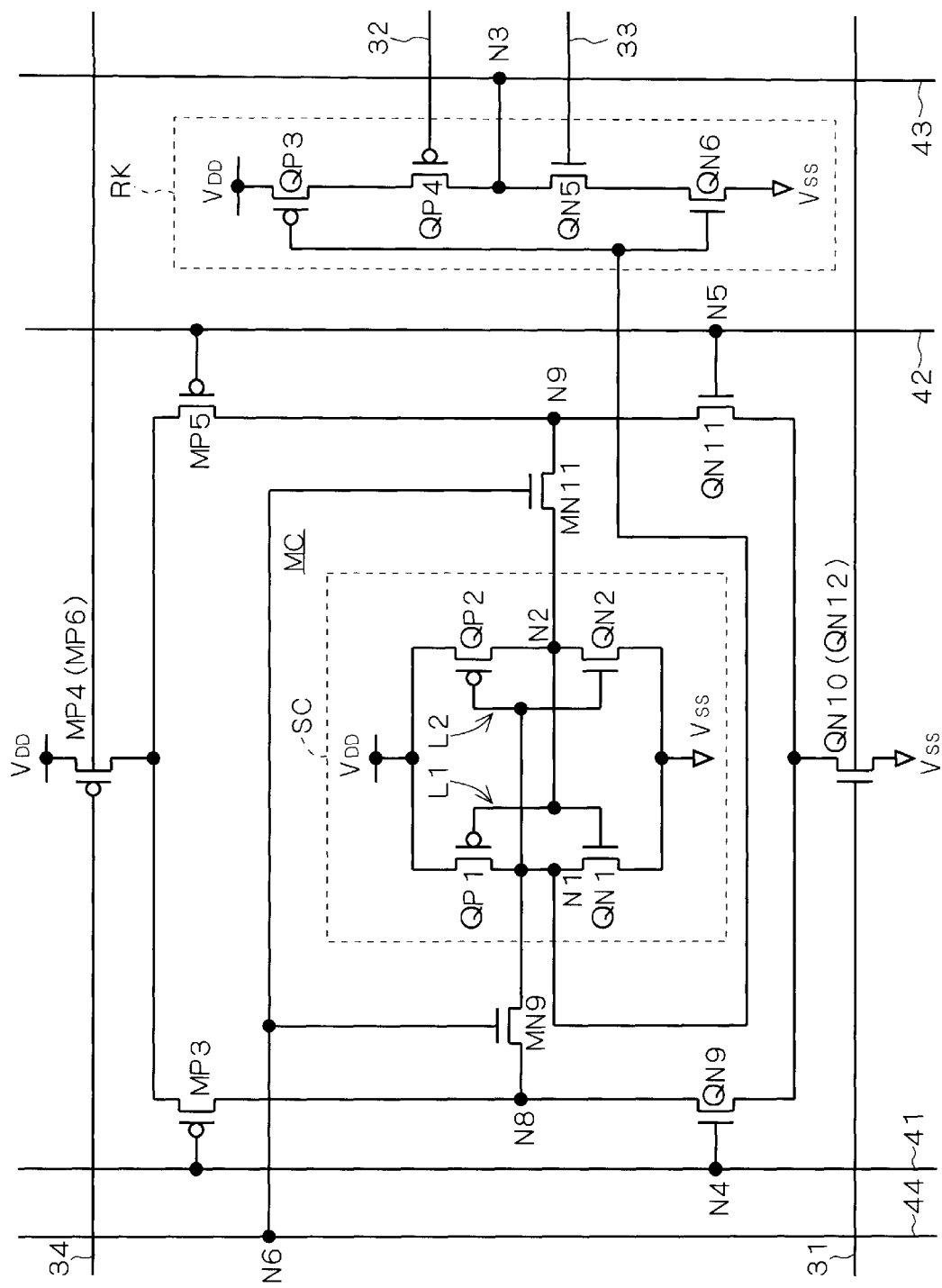
FIG. 26 is a circuit diagram of a memory cell according to a sixth modification of the fifth preferred embodiment of the present invention.

FIG. 26 is a circuit diagram showing a configuration of a memory cell MC according to a sixth modification of the fifth preferred embodiment of the present invention. The configuration of FIG. 26 differs from that of FIG. 21 in that the sequence of the in-series connected transistors MP3 and MP4 between the node N8 and the potential point $V_{DD}$ is changed, that the sequence of the in-series connected transistors MP5 and NP6 between the node N9 and the potential point $V_{DD}$ is changed, and that the transistors MP4 and MP6 are merged into a single transistor. Likewise, the sequence of the in-series connected transistors QN9 and QN10 between the node N8 and the potential point $V_{SS}$ is changed; the sequence of the in-series connected transistors QN11 and QN12 between the node N9 and the potential point $V_{SS}$ is changed; and the transistors QN10 and QN12 are merged into a single transistor. Therefore, the configuration shown in FIG. 26 can reduce the number of transistors to reduce the area required to produce the effects of the fifth preferred embodiment, as compared with the circuit shown in FIG. 21. The The nodes N8 and N9 are connected to the potential point $V_{SS}$ in similar connecting relationship with the nodes N1 and N2 of FIG. 53. However, the electrical conduction between the nodes N8 and N1 and the electrical conduction between the node N9 and N2 are provided by the transistors MN9 and MN11, respectively, only when the write control line 44 is high. This is true when the write data bit line 41 and the write data complement bit line 42 of each unselected bit line group 40 are precharged either low or high. Therefore, the configuration of FIG. 26 can produce effects similar to those of FIG. 21.

Figure 27:
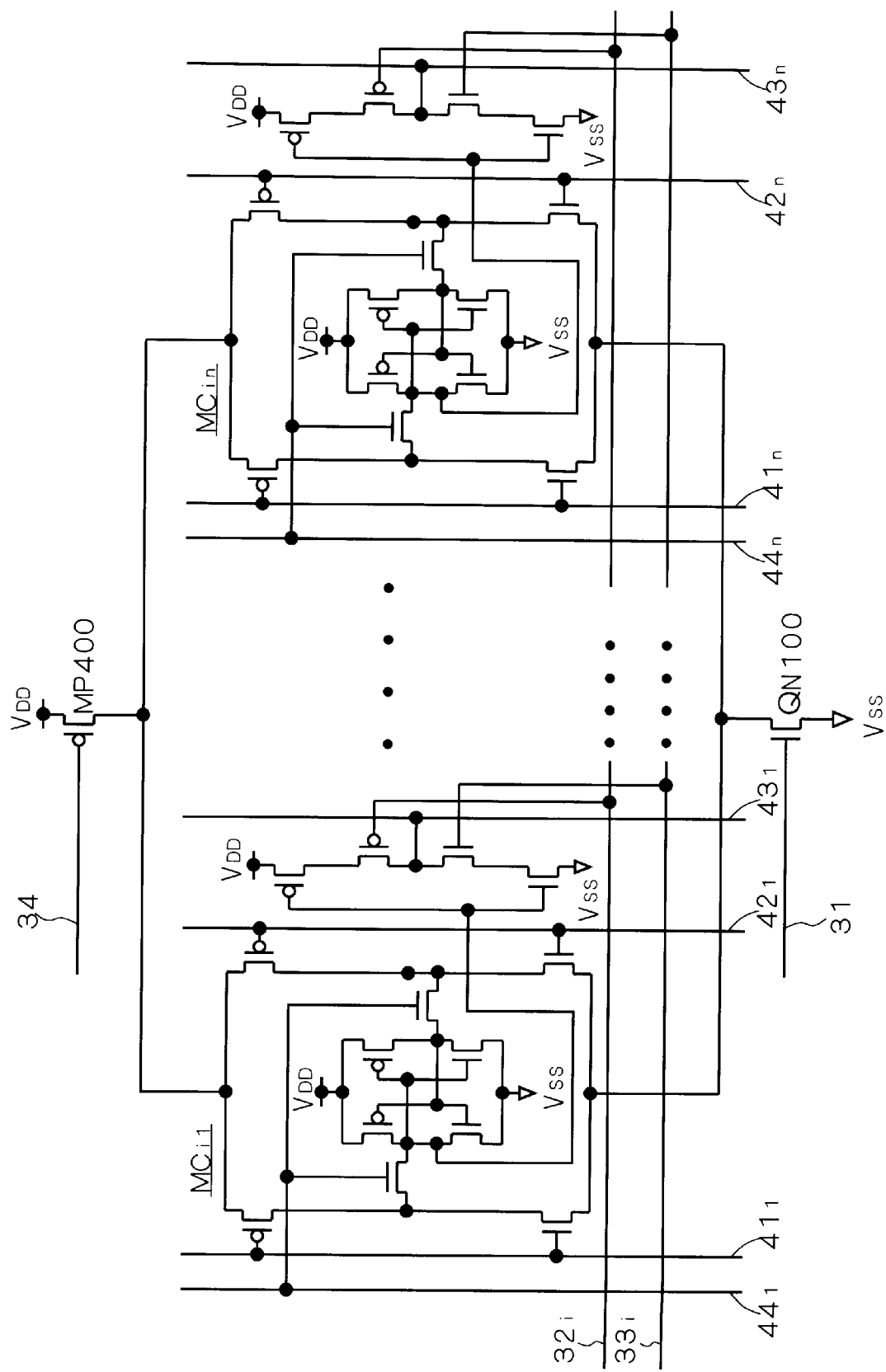
FIG. 27 is a circuit diagram of a plurality of memory cells according to the sixth modification of the fifth preferred embodiment of the present invention.

FIG. 27 is a circuit diagram showing an application of the configuration shown in FIG. 26 to memory cells $MC_{i1}$ to $MC_{in}$ in the i-th row. The plurality of memory cells $MC_{ij}$ disposed in the same row commonly use the write word line 31 and the write complement word line 34. The transistors MP4 (or the transistors MP6) of the n respective memory cells $MC_{i1}$ to $MC_{in}$ may be merged into a PMOS transistor MP400, and the transistors QN10 (or the transistors QN12) thereof may be merged into an NMOS transistor QN100. Such merge further reduces the number of transistors.

Sixth Preferred Embodiment

A sixth preferred embodiment of the present invention is similar to the first to fifth preferred embodiments in configuration shown in circuit diagram. A feature of the sixth preferred embodiment lies in that the MOSFETs constituting the memory cell MC are formed on an SOI (Semiconductor On Insulator or Silicon On Insulator) substrate.

Figure 28:
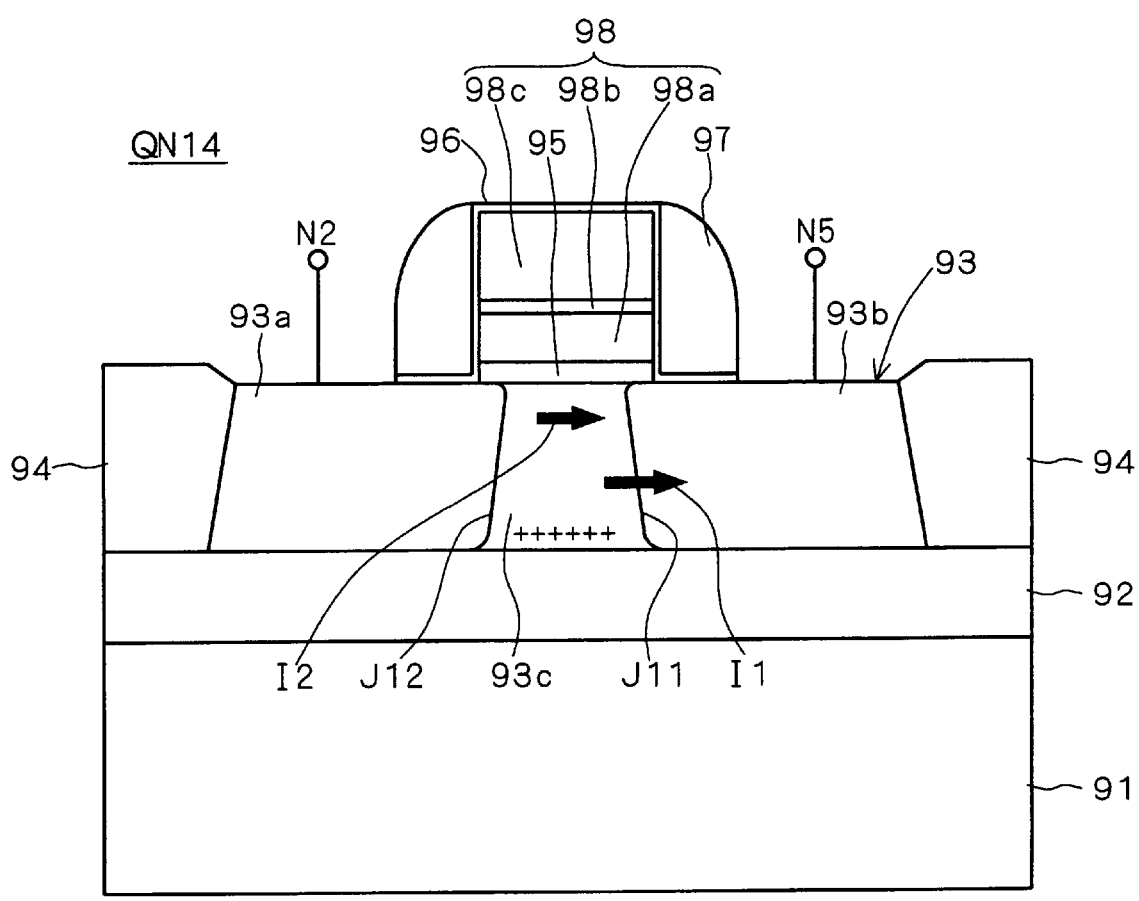
FIG. 28 is a cross-sectional view illustrating a background art access transistor.

First, a problem with a MOSFET constituting a background art memory cell MC and formed on the SOI substrate will be described. FIG. 28 is a cross-sectional view illustrating a construction of the access transistor QN4 of FIG. 52 formed as a MOS transistor on the SOI substrate.

A semiconductor substrate 91, a buried oxide film 92 and an SOI substrate 93 are arranged in vertically stacked relation in the order named. An insulative isolator 94 is selectively buried in the SOI substrate 93. The SOI substrate 93 is divided into an n-type drain 93a connected to the node N2, an n-type source 93b connected to the node N5, and a P-type channel region 93c between the drain 93a and the source 93b. A pn junction J11 is formed between the source 93b and the channel region 93c, and a pn junction J12 is formed between the drain 93a and the channel region 93c. A gate electrode 98 is opposed to the channel region 93c, with a gate insulation film 95 therebetween, and has top and side surfaces covered with an insulation film 96. Sidewalls 97 are opposed to the side surfaces of the gate electrode 98, with the gate insulation film 96 therebetween. The gate electrode 98 comprises doped polysilicon 98a, a tungsten nitride film 98b and tungsten 98c arranged in vertically stacked relation in the order named from bottom to top. In this construction, since the insulative isolator 94 insulates the SOI substrate 93 from its surroundings, the access transistor QN4 is normally in a so-called floating body condition unless a mechanism for fixing the potential of the channel region 93c is additionally provided.

A pair of memory cells $MC_{xj}$ and $MC_{yj}$ disposed in the j-th column and each having the configuration shown in FIG. 52 are assumed. Consideration will be given to so-called "half-select write disturb" when writing a "high" and a "low" into the nodes N1 and N2, respectively, of the memory cell $MC_{yj}$ after a "low" and a "high" are written into the nodes N1 and N2, respectively, of the memory cell $MC_{xj}$.

The write word line $31_x$ is low after the write operation to the memory cell $MC_{xj}$, and remains low during the write operation to the memory cell $MC_{yj}$. Thus, the source 93b, the channel region 93c and the drain 93a constitute a parasitic lateral bipolar transistor in the access transistor QN4, and function as the emitter, base and collector, respectively, of the bipolar transistor.

After the write operation to the memory cell $MC_{xj}$, the write data bit line $41_j$ and the write data complement bit line $42_j$ are both precharged high. Then, the access transistor QN4 of the memory cell $MC_{xj}$ does not turn on, and the source 93b and the drain 93a of the transistor QN4 is held high. Since the P-type channel region 93c is floating, holes (schematically indicated by "+" in FIG. 28) are thermally accumulated in the channel region 93c.

In this condition, when the write data bit line $41_j$ is precharged high and the write data complement bit line $42_j$ is precharged low for the write operation to the memory cell $MC_{yj}$, the pn junction J11 of the access transistor QN4 of the memory cell $MC_{xj}$ is forward biased. Electrons are injected from the source 93b into the channel region 93c to discharge the holes accumulated in the channel region 93c. In this process, current I1 flowing through the pn junction J11 functions as an effective base current for the above-mentioned parasitic bipolar transistor. This induces spike-shaped current I2 flowing from the drain 93a into the channel region 93c. In particular, longer time before the write operation to the memory cell $MC_{yj}$ causes more holes to be thermally accumulated, resulting in the greater current I2. In this case, the potential at the node N2 is sometimes lowered from a "high" to a "low" by discharging the electric charges accumulated at the node N2 to invert the stored content of the memory cell $MC_{xj}$.

The use of the circuit configuration according to the present invention, however, avoids the above-mentioned problem. For example, in the configuration shown in FIG. 2, the logic on the write data complement bit line 42 is written into the node N2 through the transistors MN11 and MN12. In general, an interconnect line between the transistors MN11 and MN12 is much shorter than the write data complement bit line 42. Thus, as compared with the access transistor QN4 of the memory cell MC having the structure of FIG. 52, the transistor MN11 has a lower parasitic capacitance connected to one of the pair of current electrodes thereof which is closer to the write data complement bit line 42 (e.g., source), particularly if the impurity region is shared as shown in FIG. 11. As a result, the parasitic bipolar transistor does not sufficiently operate even when the transistor MN11 is the SOI FET shown in FIG. 28. Therefore, the use of the circuit configuration according to the sixth preferred embodiment reduces the probability of occurrence of half-select write disturb.

It is desirable that the potential corresponding to the logic "low" on the unselected write word lines 31 is lower than the potential corresponding to the logic "low" on the write data complement bit lines 42 and, for example, ranges from about $V_{SS}$−0.3Vb to about $V_{SS}$−Vb where Vb is the built-in voltage developed by the drain 93a and the channel region 93c. Applying such a potential to the unselected write word lines 31 alleviates the forward bias at the pn junction J11 while the accumulation of holes in the channel region 93c is avoided. Such potential setting on the write word lines 31 is particularly effective in the circuit configuration shown in FIG. 16 since the transistor MN4 has the pair of current electrodes connected to the nodes N2 and N5 and is similar to the transistor QN4 shown in FIG. 52 in terms of parasitic capacitance.

Of course, the transistor may be configured to fix the potential of the channel region 93c to avoid the half-select write disturb.

Although the dual port static memory cell is taken as an example in the first to sixth preferred embodiments, it is needless to say that these preferred embodiments are applicable to a multi port static memory cell.

Seventh Preferred Embodiment

The first to sixth preferred embodiments enable a write operation by activating not only the write word line 31 but also the write control line 44 to produce predetermined effects. However, the determination of the logic on the write control line 44 requires the determination of the potentials on the write data bit line 41 and the write data complement bit line 42 by precharge, independently of whether the potentials are $V_{SS}$, $V_{DD}$ or $(V_{DD}+V_{SS})/2$. In other words, if the write data bit line 41 and the write data complement bit line 42 are allowed to be floating, there is apprehension that the potential on the write control line 44 is not determined. Further, when the write data bit line 41 and the write data complement bit line 42 are floating, there is a likelihood that power consumption results from the charging and discharging of the write data bit line 41 and the write data complement bit line 42 by the storage cell SC in each of the memory cells disposed in the same row as the memory cell to be written but in different columns therefrom.

In particular, in some multi port SRAMs, e.g. dual port SRAMs, having a plurality of read and write paths for each cell and capable of independently and asynchronously reading and writing binary information, the storage cell SC can drive not only the write data bit line 41 and the write data complement bit line 42 but also the read data bit line 43 in parallel.

Figure 54:
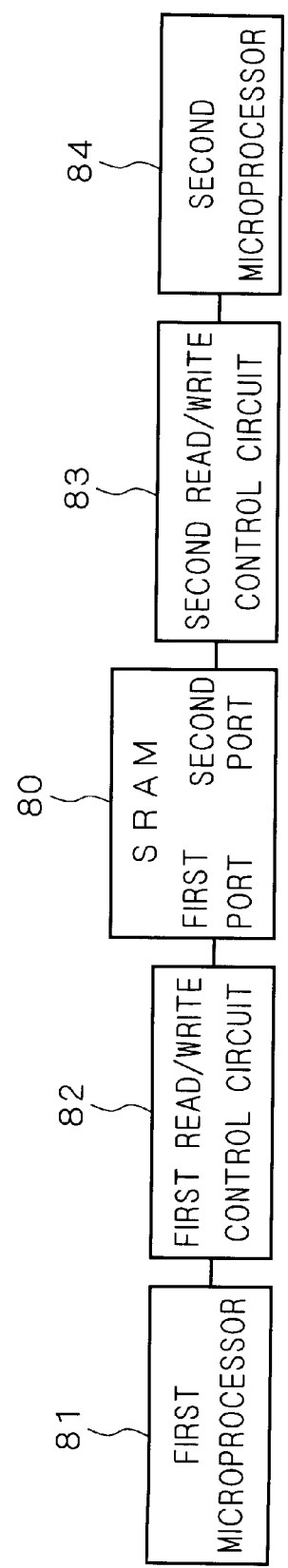
FIG. 54 is a block diagram showing connection between a dual port SRAM and a device for controlling the operation thereof.

FIG. 54 is a block diagram showing a dual port SRAM 80 having first and second ports one of which serves as a write port and the other as a read port, and connections with devices for controlling the operation of the dual port SRAM 80. A first microprocessor 81 performs read and write operations using the first port of the dual port SRAM 80 through a first read/write control circuit 82. A second microprocessor 84 performs read and write operations using the second port of the dual port SRAM 80 through a second read/write control circuit 83.

Figure 29:
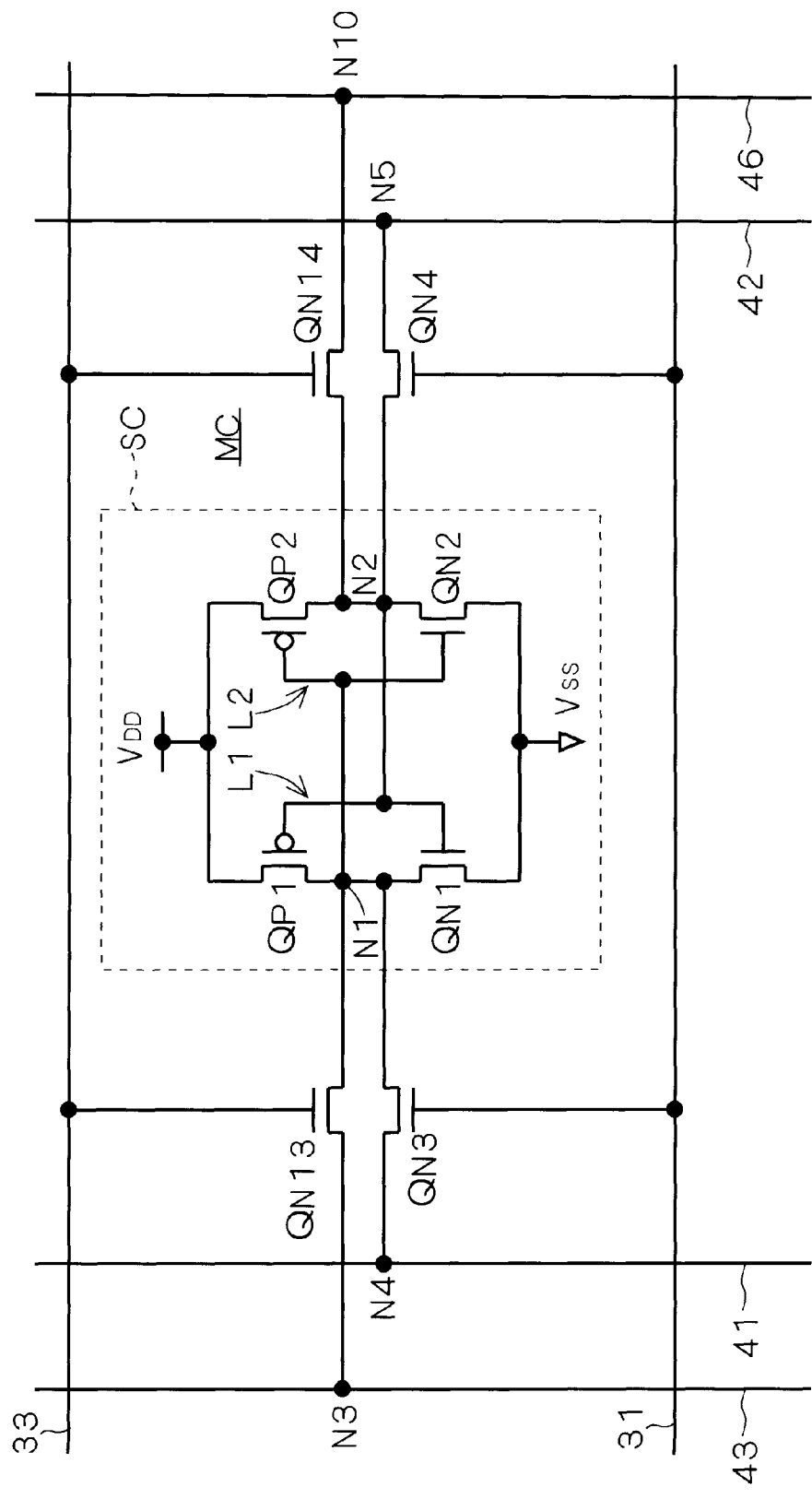
FIG. 29 is a circuit diagram illustrating a memory cell employable in a dual port SRAM.

FIG. 29 is a circuit diagram illustrating a configuration of a memory cell MC usable in the dual port SRAM 80. The memory cell MC of FIG. 29 comprises access transistors QN13 and QN14 which are NMOS transistors in place of the read circuit RK of the configuration shown in FIG. 52. The access transistor QN13 is connected between the node N1 and the read data bit line 43, and has a gate connected to the read word line 33. The access transistor QN14 is connected between the node N2 and a read data complement bit line 46, and has a gate connected to the read word line 33.

The configuration shown in FIG. 29 has an advantage over that of FIG. 52 in that the number of transistors is reduced by two per memory cell MC. However, at the nodes N3 and N10, the storage cell SC charges and discharges the read data bit line 43 and the read data complement bit line 46 having greater electrostatic capacitances than do the gates of the transistors QP3 and QN6 of the read circuit RK, respectively, when the transistors QN13 and QN14 turn on. This produces a time period during which both the write word line 31$_i$ and the read word line 33$_i$ are high, when the write operation of the first read/write control circuit 82 and the read operation of the second read/write control circuit 83 are performed in parallel upon memory cells MC$_{ix}$ and MC$_{iy}$ (x≠y) both disposed in the i-th row. During this time period, the storage cell SC of the memory cell MC$_{iy}$ drives not only the read data bit line 43 and the read data complement bit line 46 but also the write data bit line 41 and the write data complement bit line 42, which might slow the read operation.

Figure 30:
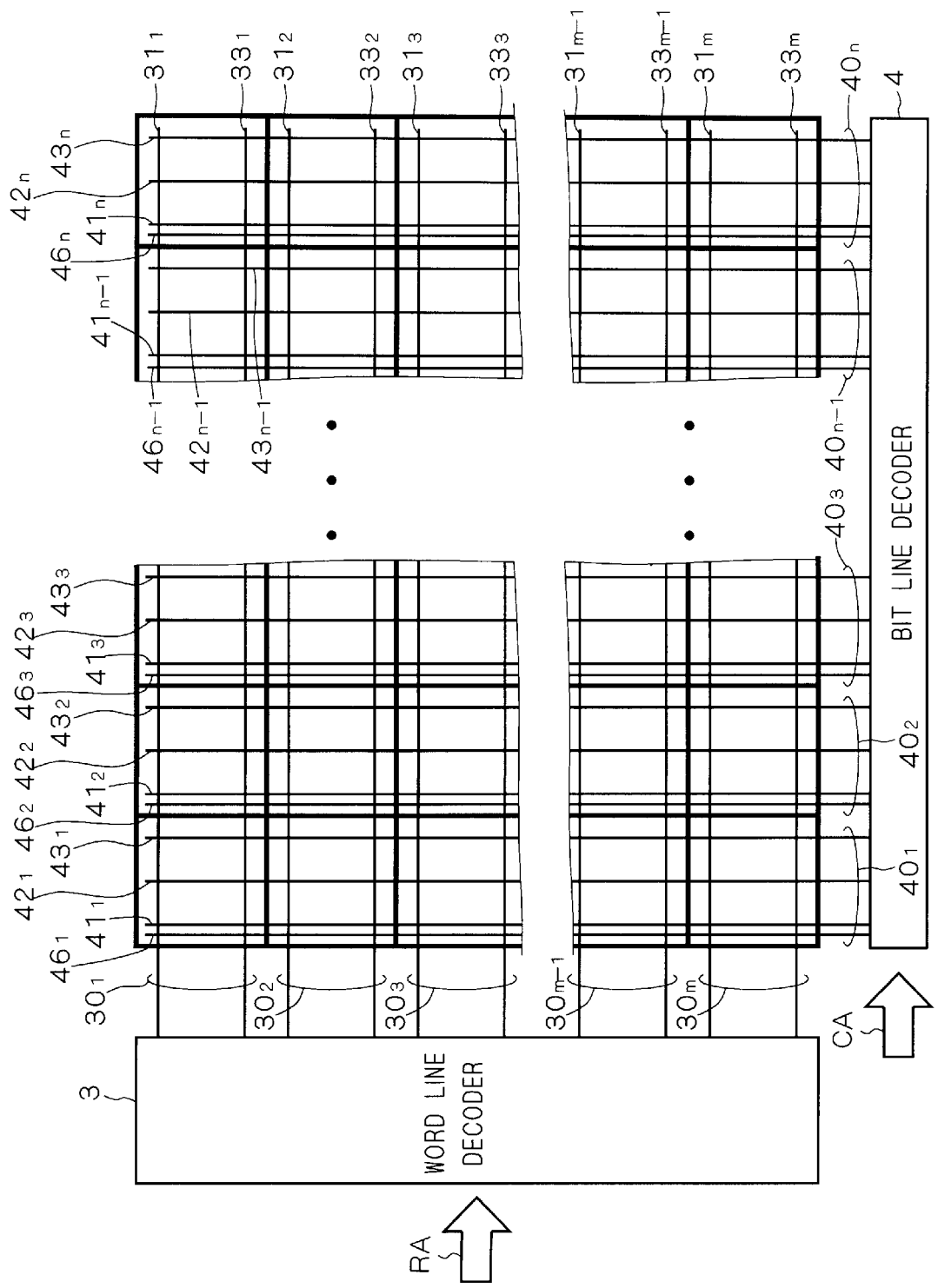
FIG. 30 conceptually shows an SRAM according to a seventh preferred embodiment of the present invention.

FIG. 30 conceptually shows an SRAM including a memory cell array and its peripheral components according to a seventh preferred embodiment of the present invention. The SRAM shown in FIG. 30 is constructed such that the write control lines 44 of the configuration shown in FIG. 1 are replaced with the read data complement bit lines 46, and the read complement word lines 32 of the configuration shown in FIG. 1 are eliminated.

Figure 31:
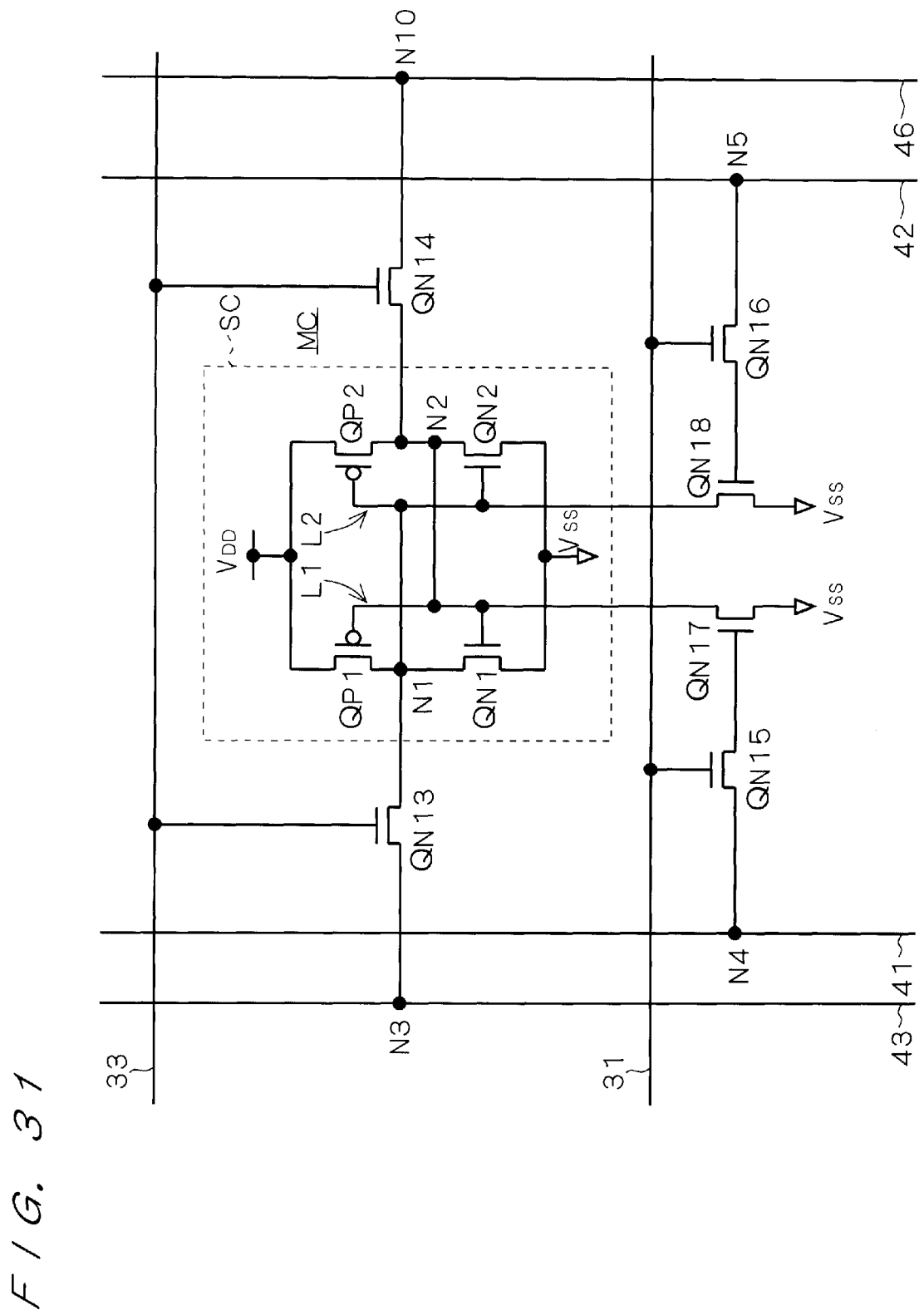
FIG. 31 is a circuit diagram illustrating a single memory cell according to the seventh preferred embodiment of the present invention.

FIG. 31 is a circuit diagram illustrating a configuration of a single memory cell MC shown in FIG. 30. As in the background art, the subscripts denoting the row and column locations are omitted in FIG. 31. The memory cell MC shown in FIG. 31 comprises NMOS transistors QN15, QN16, QN17 and QN18 in place of the transistors QN3 and QN4 of the memory cell MC of FIG. 29. Of course, the read complement word line 32 may also be used, and the read circuit RK may be used in place of the transistors QN13 and QN14 in the memory cell MC. However, the seventh preferred embodiment is particularly effective when the memory cell MC includes a read mechanism having the possibility that the nodes N1 and N2 charge and discharge the read data bit line 43 and the read data complement bit line 46, rather than the transistor gates, as above described.

The potential $V_{SS}$ is supplied to one of the pair of current electrodes, e.g. the source, of the transistor QN17, and the node N2 is connected to the other of the pair of current electrodes, e.g. the drain, thereof. The potential $V_{SS}$ is supplied to one of the pair of current electrodes, e.g. the source, of the transistor QN18, and the node N1 is connected to the other of the pair of current electrodes, e.g. the drain, thereof.

The write data bit line 41 is connected at the node N4 to one of the pair of current electrodes, e.g. the source, of the transistor QN15, and the gate of the transistor QN17 is connected to the other of the pair of current electrodes, e.g. the drain, thereof. The write data complement bit line 42 is connected to one of the pair of current electrodes, e.g. the source, of the transistor QN16, and the gate of the transistor QN18 is connected to the other of the pair of current electrodes, e.g. the drain, thereof. The gates of the transistors QN15 and QN16 are connected to the write word line 31.

With this arrangement, a write operation is performed as described below. The write data bit line 41 and the write data complement bit line 42 are precharged to potentials corresponding to logics to be provided to the nodes N1 and N2, respectively. For example, the potentials $V_{DD}$ and $V_{SS}$ corresponding to a "high" and a "low" are placed on the write data bit line 41 and the write data complement bit line 42, respectively. Thereafter, the write word line 31 is activated to turn on the transistors QN15 and QN16, thereby applying potentials $(V_{DD}-V_{thn})$ and $V_{SS}$ to the gates of the transistors QN17 and QN18, respectively (where the threshold voltage $V_{thn}$ of the transistor QN15 is greater than zero). This places the transistors QN17 and QN18 into the on- and off-states, respectively. Since the transistor QN17 is on, the potential $V_{SS}$ is transmitted to the node N2. Then, the inverter L1 functions to store the logic "high" in the node N1.

Thereafter, the potential $V_{SS}$ is placed on both of the write data bit line 41 and the write data complement bit line 42 to drive the gates of the transistors QN17 and QN18 low, thereby turning off the transistors QN17 and QN18. Subsequently, the write word line 31 is inactivated to go low. This turns off the transistors QN15 and QN16 to place the gates of the transistors QN17 and QN18 into a floating condition.

In a read operation, the read word line 33 is activated to turn on the transistors QN13 and QN14. Thus, the logics stored in the nodes N1 and N2 are transmitted at the nodes N3 and N10 to the read data bit line 43 and the read data complement bit line 46, respectively. To increase the rate of reading, it is desirable to precharge the read word line 33 prior to the activation thereof.

With this arrangement, electrical charges are not supplied from the write data bit line 41 and the write data complement bit line 42 to the storage cell SC but the potential $V_{SS}$ is applied to one of the nodes N1 and N2 during the write operation. In other words, there is no path through which the electrical charges directly move between the bit lines 41, 42 and the nodes N1, N2. Thus, when the write word line 31 is active and the write data bit line 41 and the write data complement bit line 42 are floating, these lines are neither charged nor discharged by the storage cell SC to avoid the unwanted power consumption. Therefore, the read operation is not slowed if there is a time period during which both the write word line 31 and the read word line 33 are high.

At the end of the above-mentioned write operation, the procedure is discussed such that turning off the transistors QN17 and QN18 is followed by turning off the transistors QN15 and QN16. The procedure may be reversed so that turning off the transistors QN15 and QN16 is followed by turning off the transistors QN17 and QN18. This produces the effect of backing up the information in the storage cell SC since the gates of the transistors QN17 and QN18 are placed into the floating condition while one of the transistors QN17 and QN18 remains on. There is a possible soft error such that the content stored in the storage cell SC is inverted, for example, resulting from irradiation with a cosmic ray, such as a neutron beam. Backing up the information in the storage cell SC increases the critical amount of charge required to cause a soft error, that is, makes a soft error difficult to occur.

Figure 32:
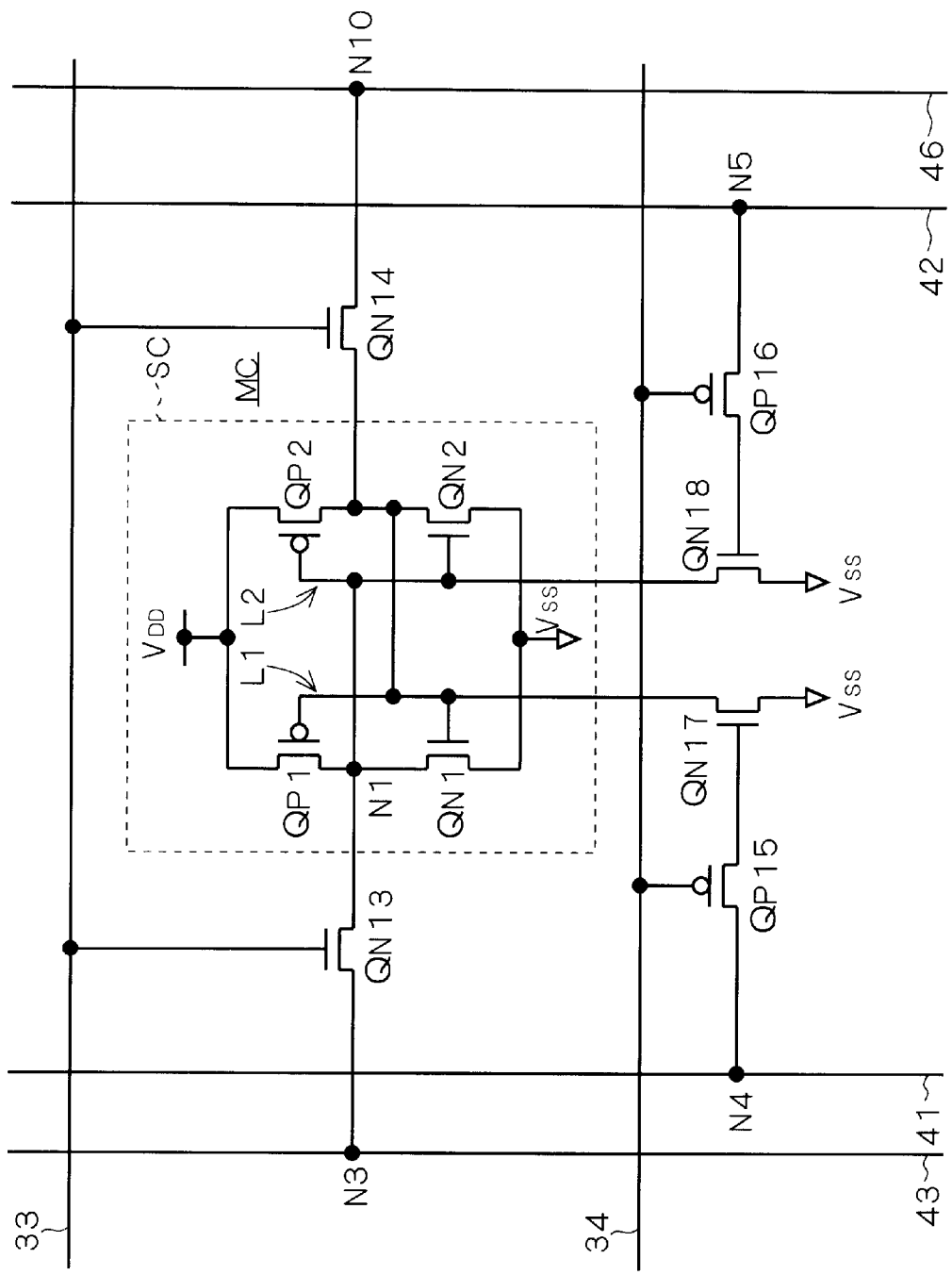
FIG. 32 is a circuit diagram of a memory cell according to a modification of the seventh preferred embodiment of the present invention.

FIG. 32 is a circuit diagram showing a modification of the seventh preferred embodiment of the present invention. The memory cell MC of FIG. 32 comprises the write complement word line 34 substituted for the write word line 31, and PMOS transistors QP15 and QP16 substituted for the transistors QN15 and QN16.

The configuration shown in FIG. 32 produces effects similar in logic propagation to those of the configuration shown in FIG. 31. However, the configuration shown in FIG. 32 can avoid the reduction in potential by the amount of the threshold voltage $V_{thn}$ (>0) when placing a "high" on the gates of the transistors QN17 and QN18.

On the other hand, when placing a "low" on the gates of the transistors QN17 and QN18, the potentials thereof increase to $V_{SS}-V_{thp}$ where $V_{thp}$ is the threshold voltage of the PMOS transistors QP15 and QP16 and is less than zero. Therefore, the configuration of FIG. 31 is advantageous over that of FIG. 32 in ensuring the turning off of the transistors QN17 and QN18 to suppress the leakage current from the nodes N1 and N2 to the potential point $V_{SS}$.

Figure 33:
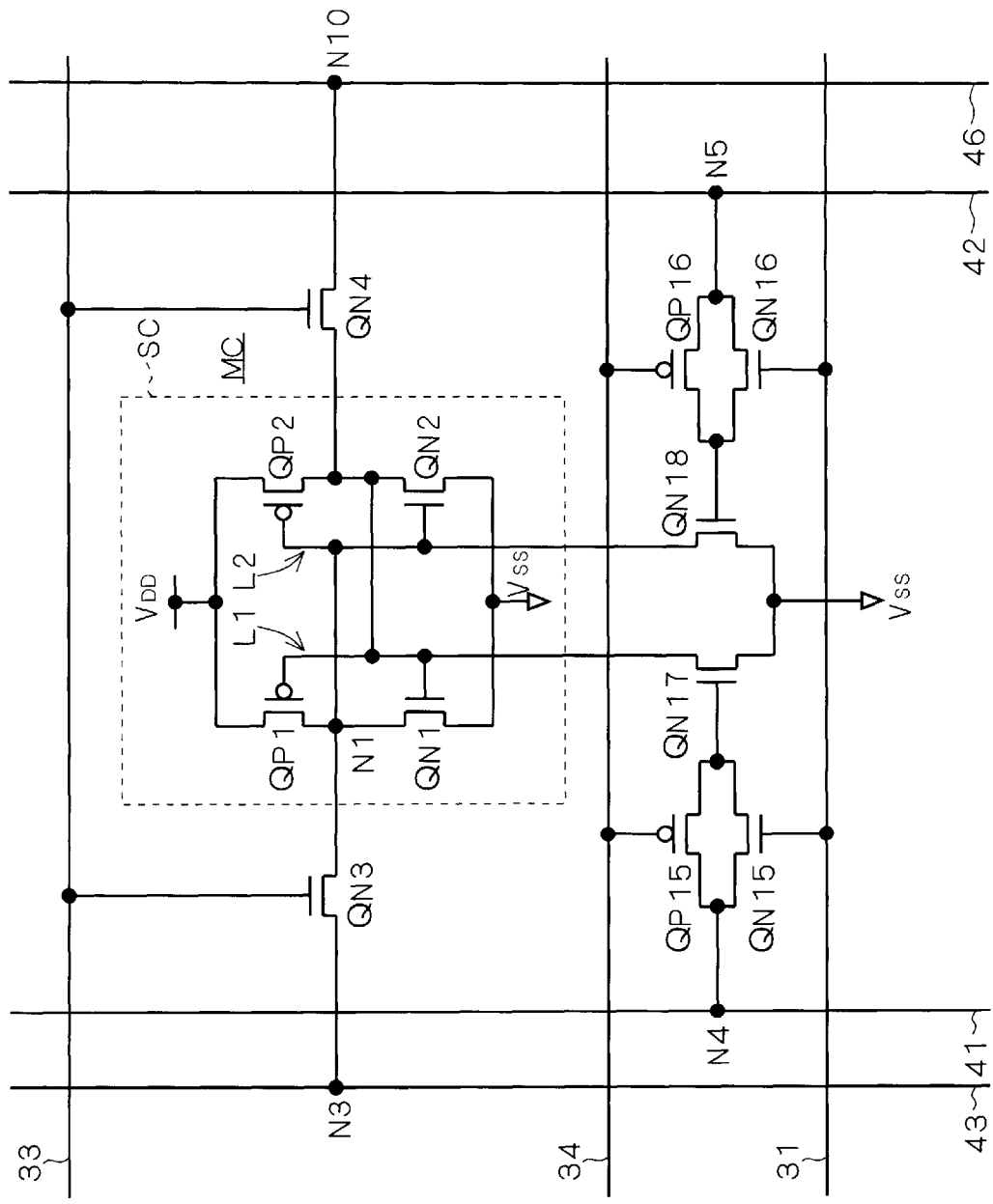
FIG. 33 is a circuit diagram of a memory cell according to another modification of the seventh preferred embodiment of the present invention.
Figure 35A:
FIGS. 35A through 35E are a timing chart showing the operation of the memory cell according to the eighth preferred embodiment of the present invention.
Figure 35B:
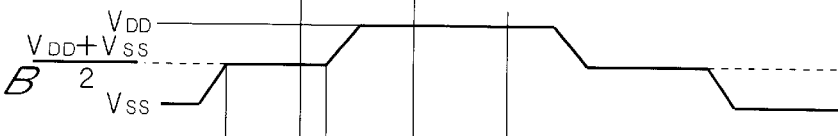
Figure 35C:
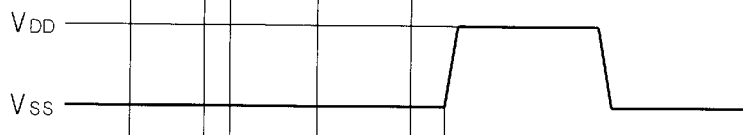
Figure 35D:
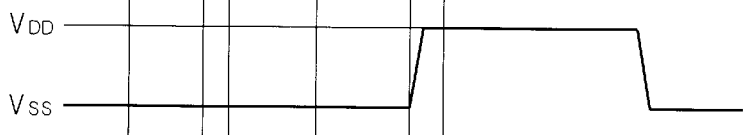
Figure 35E:
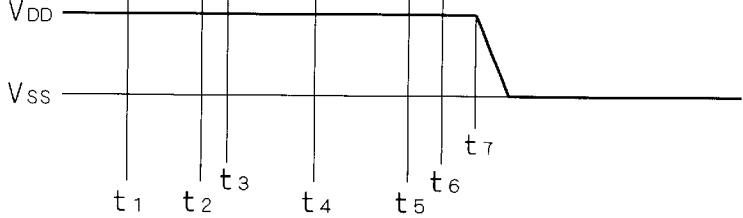

FIG. 33 is a circuit diagram showing another modification of the seventh preferred embodiment of the present invention. Both of the write word line 31 and the write complement word line 34 are used. A transmission gate comprised of the transistors QP15 and QN15 connected in parallel is connected between the node N4 and the gate of the transistor QN17. A transmission gate comprised of the transistors QP16 and QN16 connected in parallel is connected between the node N5 and the gate of the transistor QN18. The gates of the PMOS transistors QP15 and QP16 are connected to the write complement word line 34, and the gates of the NMOS transistors QN15 and QN16 are connected to the write word line 31.

Such a construction allows the on/off control of the transistors QN17 and QN18 with precision.

Eighth Preferred Embodiment

FIG. 34 is a circuit diagram illustrating a configuration of a memory cell MC according to an eighth preferred embodiment of the present invention. As in the background art, the subscripts denoting the row and column locations are omitted in FIG. 34. The memory cell MC shown in FIG. 34 may be used as each of the memory cells $MC_{ij}$ shown in FIG. 30.

The memory cell shown in FIG. 34 has a characteristic difference in configuration of the storage cell SC from the configuration shown in FIG. 53. Briefly, the storage cell SC does not have the transistors QN1 and QN2 but consists essentially of the cross-coupled transistors QP1 and QP2.

More specifically, the storage node N2 is connected to the potential point $V_{SS}$ only through the in-series connection of the transistors QN9 and QN10. The gates of the transistors QN9 and QN10 are connected to the write data bit line 41 and the write word line 31, respectively. Electrical conduction of the transistors QN9 and QN10 is controlled by the logics on the write data bit line 41 and the write word line 31. Similarly, the storage node N1 is connected to the potential point $V_{SS}$ only through the in-series connection of the transistors QN11 and QN12. The gates of the transistors QN11 and QN12 are connected to the write data complement bit line 42 and the write word line 31, respectively. Electrical conduction of the transistors QN11 and QN12 is controlled by the logics on the write data complement bit line 42 and the write word line 31.

The configuration shown in FIG. 34 differs from that shown in FIG. 53 in a structure for reading from the storage nodes N1 and N2 of the storage cell SC. Specifically, the configuration shown in FIG. 34 uses the transistors QN13 and QN14 illustrated in the seventh preferred embodiment, rather than the read circuit RK. Activation of the read word line 33 turns on the transistors QN13 and QN14, whereby the logics stored on the nodes N1 and N2 are transmitted at the nodes N3 and N10 to the read data bit line 43 and the read data complement bit line 46, respectively. To increase the rate of reading, it is desirable to precharge the read data bit line 43 and the read data complement bit line 46 prior to the activation of the read word line 33.

FIGS. 35A through 35E are a timing chart illustrating the operation of the memory cell MC shown in FIG. 34. Specifically, FIGS. 35A through 35E show the potentials on the read word line 33, the read data complement bit line 46, the write word line 31, the write data bit line 41, and the storage node N2, respectively. Illustrated in FIGS. 35A through 35E is the operation when writing a "low" into the storage node N2 which has been high.

Before time $t_1$, the memory cell MC is in a standby state in which the read data complement bit line 46, as well as the read data bit line 43, remains precharged to the potential $V_{SS}$ as indicated by the solid line or to a potential $(V_{DD}+V_{SS})/2$ as indicated by the broken line. At the time $t_1$, the read data complement bit line 46, as well as the read data bit line 43, is precharged to the potential $(V_{DD}+V_{SS})/2$. Thereafter, at time $t_2$, the read word line 33 starts making a transition to the potential $V_{DD}$. With this transition as a turning point, the transistor QN14, as well as the transistor QN13, turns on. Thus, at time $t_3$, the potential on the read data complement bit line 46 starts making a transition to the potential $V_{DD}$ because of the logic "high" stored at the storage node N2.

Thereafter, at time $t_4$, the read word line 33 starts making a transition to the potential $V_{SS}$. Then, at time $t_5$, the write data bit line 41 starts making a transition to the potential $V_{DD}$. With this transition as a turning point, the transistor QN9 turns on. Then, at time $t_6$, the write word line 31 also starts making a transition to the potential $V_{DD}$. With this transition as a turning point, the transistor QN10 also turns on. Thus, the storage node N2 is connected to the potential point $V_{SS}$ through the transistors QN9 and QN10, and the potential at the storage node N2 starts making a transition from the potential $V_{DD}$ to the potential $V_{SS}$ at time $t_7$. Thereafter, the write word line 31 makes a transition to the potential $V_{SS}$ to enter the standby state, and the write data bit line 41 also makes a transition to the potential $V_{SS}$.

Writing a "low" into the storage node N2 which has been low is, of course, achieved similarly by connecting the storage node N2 through the transistors QN9 and QN10 to the potential point $V_{SS}$. When the "low" is written into the storage node N2, the transistor QP1 turns on, and the storage node N1 is connected through the transistor QP1 to the potential point $V_{DD}$ and accordingly written with a "high."

In the eighth preferred embodiment as well as in the seventh preferred embodiment, there is no path through which electrical charges directly move between the bit lines 41, 42 and the nodes N1, N2. Thus, when the write word line 31 is active and the write data bit line 41 and the write data complement bit line 42 are floating, these lines are neither charged nor discharged by the storage cell SC to avoid the unwanted power consumption. Therefore, the read operation is not slowed if there is a time period during which both the write word line 31 and the read word line 33 are high at the same time.

Additionally, the configuration shown in FIG. 34 which has a reduced number of transistors can achieve area reduction by the area of two transistors per storage cell, as compared with the configuration shown in FIG. 53. Further, the inverters L1 and L2 are designed to have a high static noise margin in order to hold information in a stable fashion, thereby requiring time to invert the stored content. In the configuration of the eighth preferred embodiment, however, the cross-coupled transistors hold the stored information to perform a rapid write operation.

Figure 36:
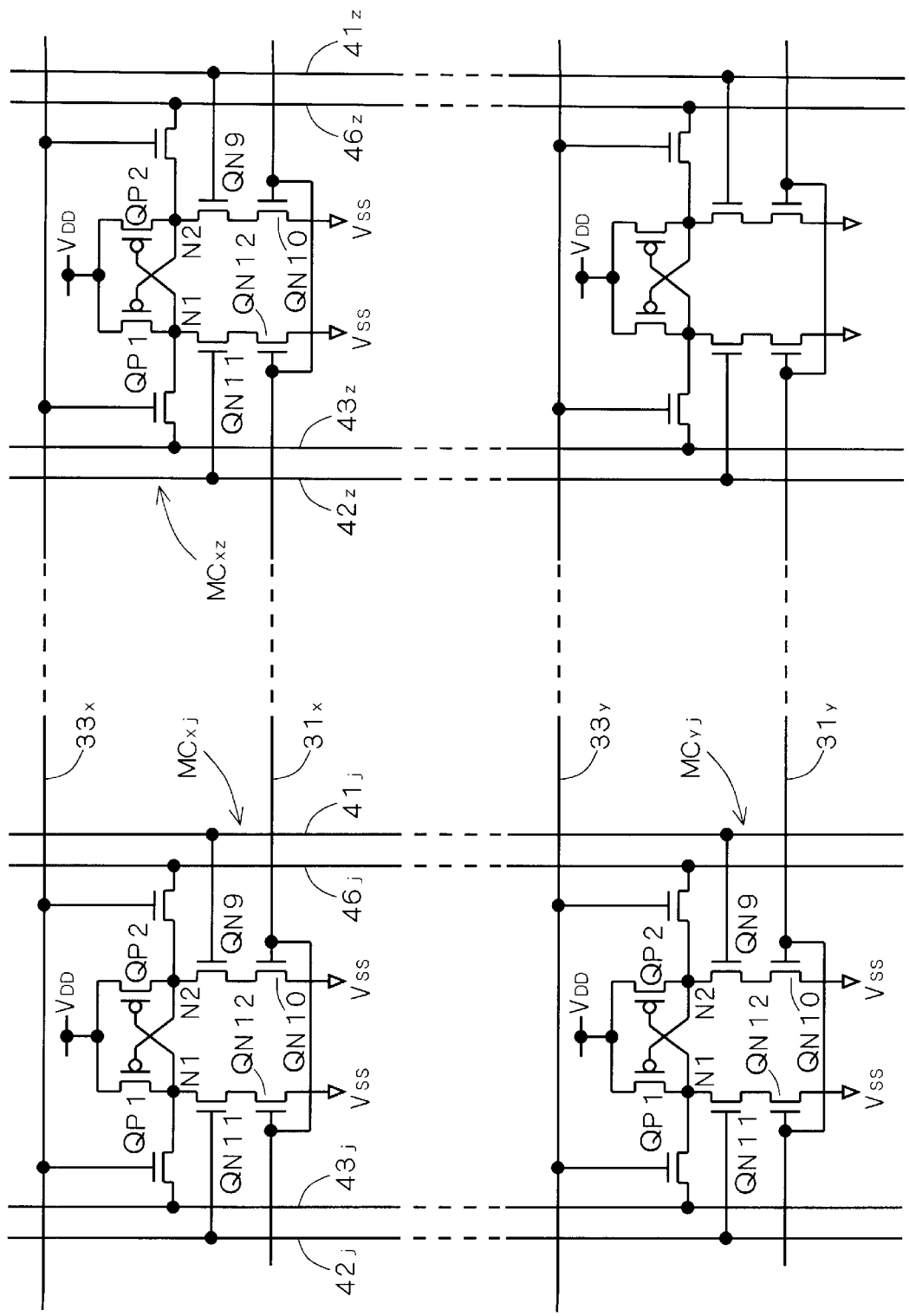
FIG. 36 is a circuit diagram showing part of an arrangement of memory cells in a matrix according to the eighth preferred embodiment of the present invention.

Moreover, the memory cell having the configuration of the eighth preferred embodiment can avoid the half-select write disturb. FIG. 36 is a circuit diagram of part of an arrangement of memory cells MC each having the structure shown in FIG. 34 in a matrix. Selectively illustrated in FIG. 36 are a memory cell $MC_{xj}$ in the x-th row, j-th column, a memory cell $MC_{xz}$ in the x-th row, z-th column, and a memory cell $MC_{yj}$ in the y-th row, j-th column.

First, writing information into the storage node N1 of the memory cell $MC_{xj}$ is assumed. When the write word line $31_X$ goes high while the write data bit line $41_j$ and the write data complement bit line $42_j$ are high and low respectively, the potential $V_{SS}$ is applied to the storage node N2 through the transistors QN9 and QN10 of the memory cell $MC_{xj}$. At this time, the transistor QN11 of the memory cell $MC_{xj}$ is off. Since the potential $V_{SS}$ is applied to the storage node N2, the transistor QP1 of the memory cell $MC_{xj}$ turns on, and the potential $V_{DD}$ is applied to the storage node N1.

Then, driving the write word line $31_x$ high turns on the transistors QN10 and QN12 of the memory cell $MC_{xz}$. However, the transistors QN9 and QN11 of the memory cell $MC_{xz}$ are held off by precharging the write data bit line $41_z$ and the write data complement bit line $42_z$ to the potential $V_{SS}$ into the standby state. Therefore, the stored content of the memory cell $MC_{xz}$ is not rewritten.

Further, driving the write data bit line $41_j$ high turns on the transistor QN9 of the memory cell $MC_j$. However, the write word line $31_y$ is unselected and accordingly low, which allows the transistor QN10 and QN12 of the memory cell $MC_{yj}$ to be held off. Therefore, the stored content of the memory cell $MC_{yj}$ is not rewritten. For the foregoing reasons, the half-select write disturb is avoided.

FIG. 37 is a circuit diagram showing a configuration of a memory cell according to a first modification of the eighth preferred embodiment. The memory cell shown in FIG. 37 employs the write complement word line 34, rather than the write word line 31 in the configuration shown in FIG. 34. Additionally, the NMOS transistors QN10 and QN12 are replaced with PMOS transistors QP10 and QP12, respectively. Since a logic complementary to the logic on the write word line 31 is placed on the write complement word line 34 in the write operation, the PMOS transistors QP10 and QP12 perform operations similar to those of the NMOS transistors QN10 and QN12 in response to the logics placed on the write word line 31 and the write complement word line 34. Therefore, the configuration shown in FIG. 37 produces effects similar to those of the configuration shown in FIG. 34.

FIG. 38 is a circuit diagram showing a configuration of a memory cell according to a second modification of the eighth preferred embodiment. The memory cell shown in FIG. 38 is such that the NMOS transistors QN9 and QN11 in the configuration shown in FIG. 34 are replaced with PMOS transistors QP11 and QP9, respectively. The write data bit line 41 and the write data complement bit line 42 are connected to the gates of the PMOS transistors QP9 and QP11, respectively. Since logics complementary to each other are placed on the write data bit line 41 and the write data complement bit line 42 in the write operation, the PMOS transistors QP9 and QP11 perform operations similar to those of the NMOS transistors QN11 and QN9 in response to the logics placed on the write data bit line 41 and the write data complement bit line 42. Therefore, the configuration shown in FIG. 38 produces effects similar to those of the configuration shown in FIG. 34.

FIG. 39 is a circuit diagram showing a configuration of a memory cell according to a third modification of the eighth preferred embodiment. The memory cell shown in FIG. 39 is such that a high potential side and a low potential side in the configuration shown in FIG. 34 are replaced with each other. Specifically, the storage node N2 is connected to the potential point $V_{DD}$ only through the in-series connection of the transistors QP11 and QP10. The gates of the transistors QP11 and QP10 are connected to the write data bit line 41 and the write complement word line 34, respectively. Electrical conduction of the transistors QP11 and QP10 is controlled by the logics on the write data bit line 41 and the write complement word line 34. Similarly, the storage node N1 is connected to the potential point $V_{DD}$ only through the in-series connection of the transistors QP9 and QP12. The gates of the transistors QP9 and QP12 are connected to the write data complement bit line 42 and the write complement word line 34, respectively. Electrical conduction of the transistors QP9 and QP12 is controlled by the logics on the write data complement bit line 42 and the write complement word line 34. It is obvious that such a configuration produces effects similar to those of the configuration shown in FIG. 34.

FIG. 40 is a circuit diagram showing a configuration of a memory cell according to a fourth modification of the eighth preferred embodiment. The memory cell shown in FIG. 40 employs the write word line 31, rather than the write complement word line 34 in the configuration shown in FIG. 39. The PMOS transistors QP10 and QP12 are replaced with the NMOS transistors QN10 and QN12, respectively. Since a logic complementary to the logic on the write word line 31 is placed on the write complement word line 34 in the write operation, the NMOS transistors QN10 and QN12 perform operations similar to those of the PMOS transistors QP10 and QP12 in response to the logics placed on the write word line 31 and the write complement word line 34. Therefore, the configuration shown in FIG. 40 produces effects similar to those of the configuration shown in FIG. 39.

Figure 41:
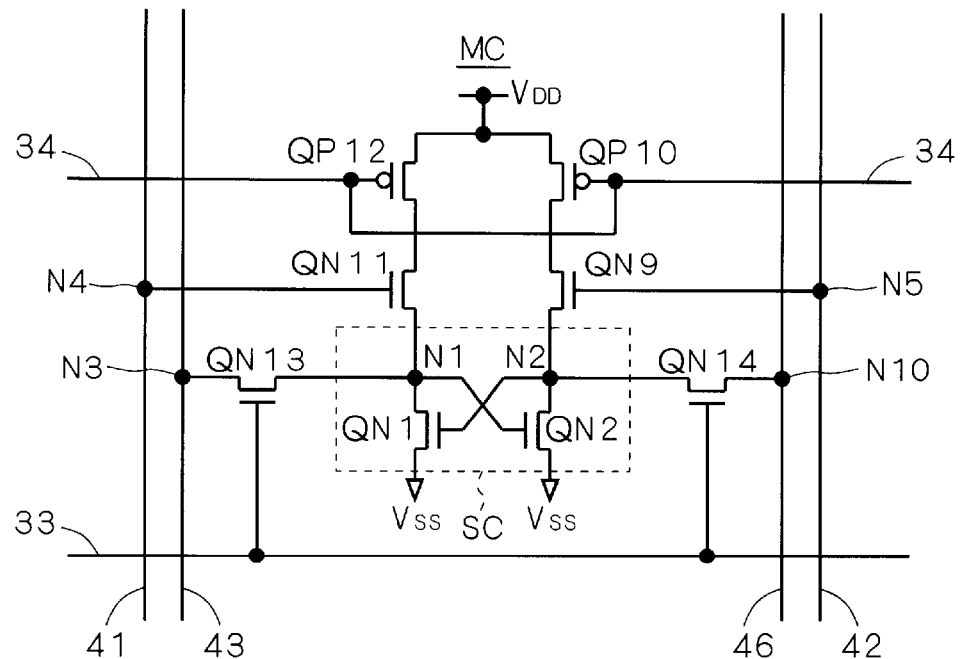
FIG. 41 is a circuit diagram of a memory cell according to a fifth modification of the eighth preferred embodiment of the present invention.

FIG. 41 is a circuit diagram showing a configuration of a memory cell according to a fifth modification of the eighth preferred embodiment. The memory cell shown in FIG. 41 is such that the PMOS transistors QP9 and QP11 in the configuration shown in FIG. 39 are replaced with the NMOS transistors QN11 and QN9, respectively. The write data bit line 41 and the write data complement bit line 42 are connected to the gates of the NMOS transistors QN11 and QN9, respectively. Since logics complementary to each other are placed on the write data bit line 41 and the write data complement bit line 42 in the write operation, the NMOS transistors QN9 and QN11 perform operations similar to those of the PMOS transistors QP11 and QP9 in response to the logics placed on the write data bit line 41 and the write data complement bit line 42. Therefore, the configuration shown in FIG. 41 produces effects similar to those of the configuration shown in FIG. 39.

Figure 42:
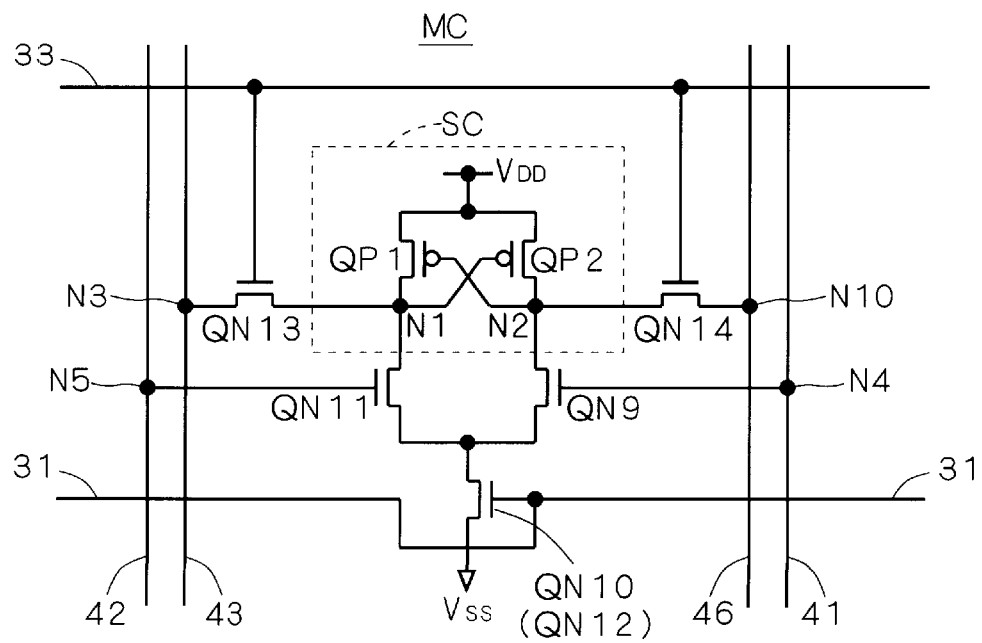
FIG. 42 is a circuit diagram of a memory cell according to a sixth modification of the eighth preferred embodiment of the present invention.

FIG. 42 is a circuit diagram showing a configuration of a memory cell according to a sixth modification of the eighth preferred embodiment. The memory cell shown in FIG. 42 is such that the transistor QN10 doubles as the transistor QN12 in the configuration shown in FIG. 34. FIG. 43 is a circuit diagram showing a configuration of a memory cell according to a seventh modification of the eighth preferred embodiment. The memory cell shown in FIG. 43 is such that the transistor QP10 doubles as the transistor QP12 in the configuration shown in FIG. 39. The sixth and seventh modifications merge two transistors together to reduce the number of transistors by one per memory cell. This produces the effects of the eighth preferred embodiment while reducing the area occupied by the memory cell.

Figure 44:
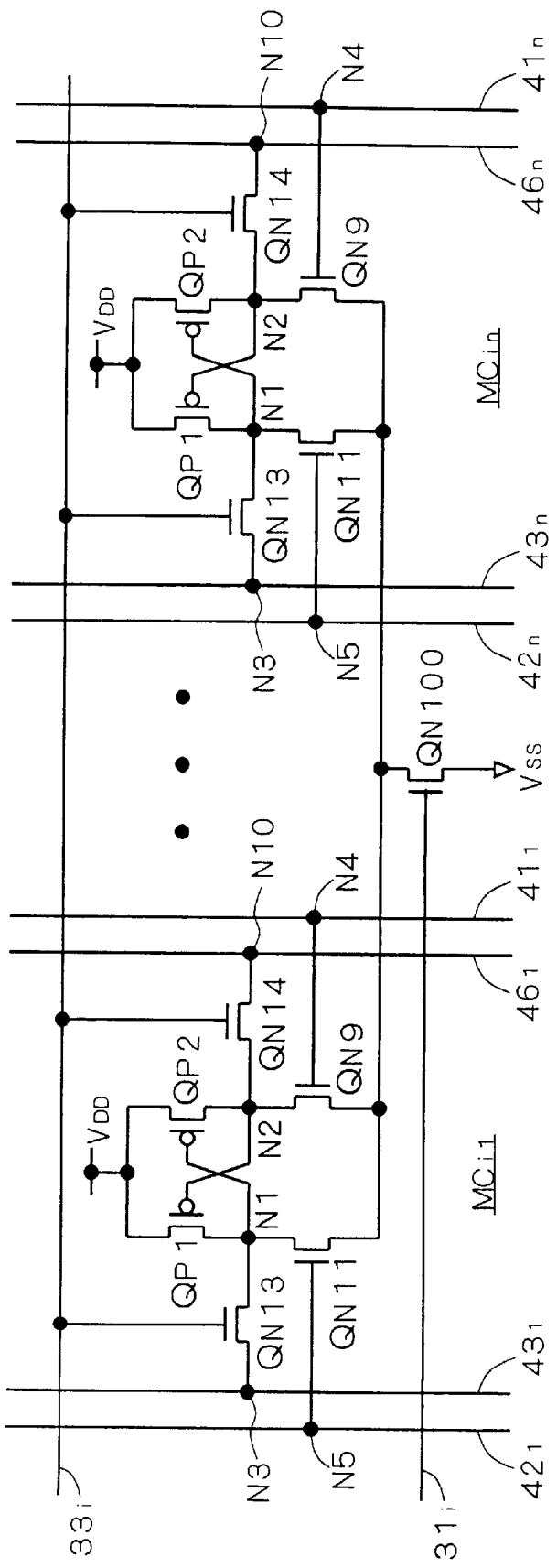
FIG. 44 is a circuit diagram showing a plurality of memory cells according to the sixth modification of the eighth preferred embodiment of the present invention.
Figure 45:
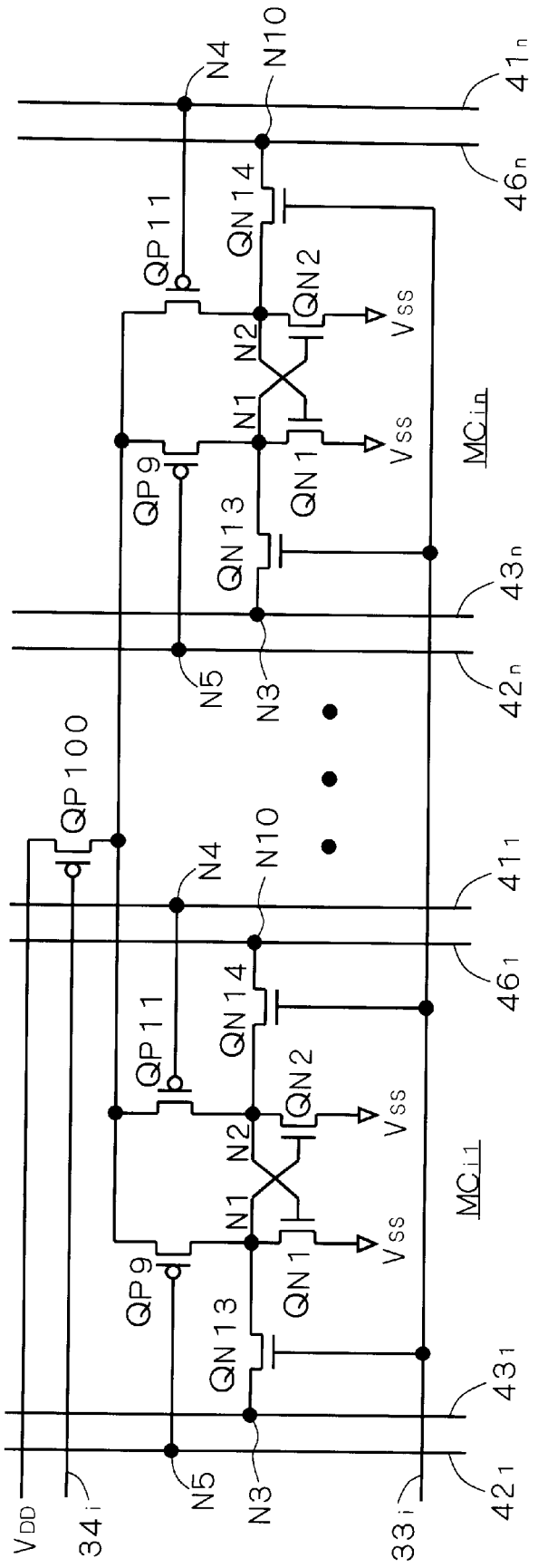
FIG. 45 is a circuit diagram showing a plurality of memory cells according to the seventh modification of the eighth preferred embodiment of the present invention.

FIG. 44 is a circuit diagram showing a configuration of memory cells $MC_{i1}$ to $MC_{in}$ in the i-th row to which the configuration shown in FIG. 42 is applied. The plurality of memory cells $MC_{ij}$ in the same row share the use of the write word line 31. Thus, the transistors QN10 (or QN12) of, respectively, n memory cells $MC_{i1}$ to $MC_{in}$ may be merged into a single NMOS transistor QN100. FIG. 45 is a circuit diagram showing a configuration of memory cells $MC_{i1}$ to $MC_{in}$ in the i-th row to which the configuration shown in FIG. 43 is applied. The plurality of memory cells $MC_{ij}$ in the same row share the use of the write complement word line 34. Thus, the transistors QP10 (or QP12) of, respectively, n memory cells $MC_{i1}$ to $MC_{in}$ may be merged into a single PMOS transistor QP100. Such merge further reduces the number of transistors.

The transistors illustrated in the eighth preferred embodiment may be formed using a silicon substrate, a known SOI substrate, or a SON (Silicon On Nothing) substrate.

Ninth Preferred Embodiment

FIG. 46 is a circuit diagram illustrating a configuration of a memory cell MC according to a ninth preferred embodiment of the present invention. As in the background art, the subscripts denoting the row and column locations are omitted in FIG. 46. The memory cell MC shown in FIG. 46 may be used as each of the memory cells $MC_{ij}$ shown in FIG. 1. The read circuit is not shown in FIG. 46.

The memory cell shown in FIG. 46 has a characteristic difference from the configuration shown in FIG. 10 in that the storage cell SC consists essentially of a pair of cross-coupled transistors. More specifically, the drain of the transistor QN1 and the gate of the transistor QN2 are connected in common to the storage node N1, and the gate of the transistor QN1 and the drain of the transistor QN2 are connected in common to the storage node N2. The sources of the transistors QN1 and QN2 are connected in common to the potential point $V_{SS}$.

The use of the pair of cross-coupled transistors, rather than a pair of cross-coupled inverters, to constitute the storage cell SC achieves area reduction by the area of two transistors per storage cell. Further, unlike inverters L1 and L2, the pair of cross-coupled transistors are not designed to have a high static noise margin, thereby to perform a rapid write operation.

The transistors MN9 and MN10 are connected in series between the storage node N1 and the write data bit line 41, and the transistors MN11 and MN12 are connected in series between the storage node N2 and the write data complement bit line 42. The transistors MN9 and MN11 are NMOS transistors and have respective gates connected in common to the write control line 44. The transistors MN10 and MN12 are NMOS transistors and have respective gates connected in common to the write word line 31.

Therefore, the transistors MN10 and MN12 in each of the memory cells which share the use of the write word line 31 in a selected row conduct, but the transistors MN9 and MN11 in each of the memory cells in an unselected column do not conduct. On the other hand, the transistors MN9 and MN11 in each of the memory cells which share the use of the write control line 44 in a selected column conduct, but the transistors MN10 and MN12 in each of the memory cells in an unselected row do not conduct. Consequently, the half-select write disturb is avoided.

Figure 48:
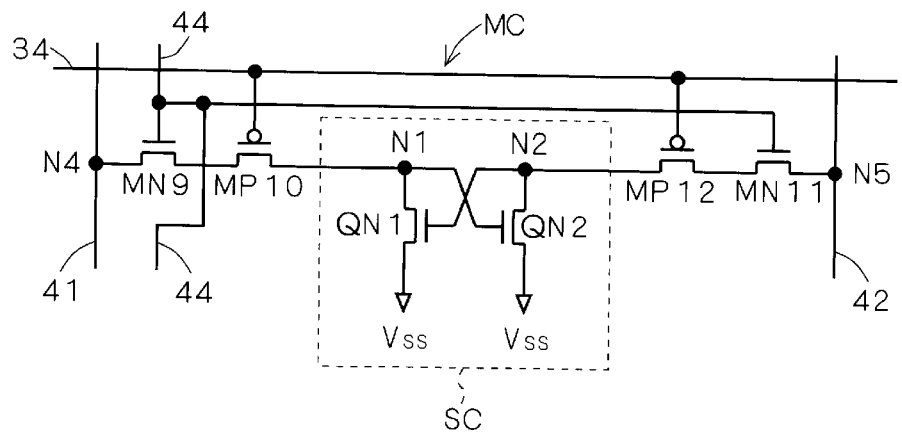
Figure 49:
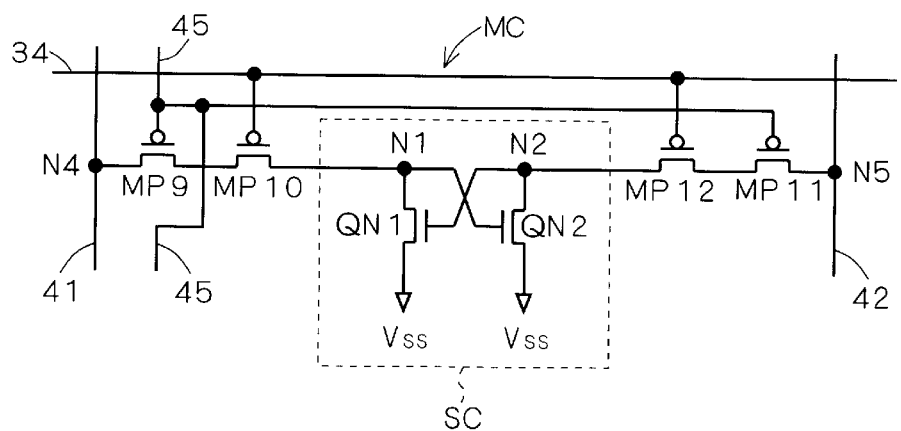

FIGS. 47 through 49 are circuit diagrams showing modifications of the ninth preferred embodiment. The configuration shown in FIG. 47 is constructed such that the write control line 44 and the NMOS transistors MN9 and MN11 in the configuration shown in FIG. 46 are replaced with the write complement control line 45 and the PMOS transistors MP9 and MP11, respectively. Since a logic complementary to the logic on the write control line 44 is placed on the write complement control line 45, it is obvious that the configuration shown in FIG. 47 performs operations similar to those of the configuration shown in FIG. 46.

The configuration shown in FIG. 48 is constructed such that the write word line 31 and the NMOS transistors MN10 and MN12 in the configuration shown in FIG. 46 are replaced with the write complement word line 34 and the PMOS transistors MP10 and MP12, respectively. Since a logic complementary to the logic on the write word line 31 is placed on the write complement word line 34 in the write operation, the PMOS transistors MP10 and MP12 perform operations similar to those of the NMOS transistors MN10 and MN12 in response to the logics placed on the write word line 31 and the write complement word line 34. Therefore, the configuration shown in FIG. 48 produces effects similar to those of the configuration shown in FIG. 46.

The configuration shown in FIG. 49 is constructed such that the write control line 44 and the NMOS transistors MN9 and MN11 in the configuration shown in FIG. 48 are replaced with the write complement control line 45 and the PMOS transistors MP9 and MP11, respectively. It is obvious that the configuration shown in FIG. 49 performs operations similar to those of the configuration shown in FIG. 46.

Figure 50:
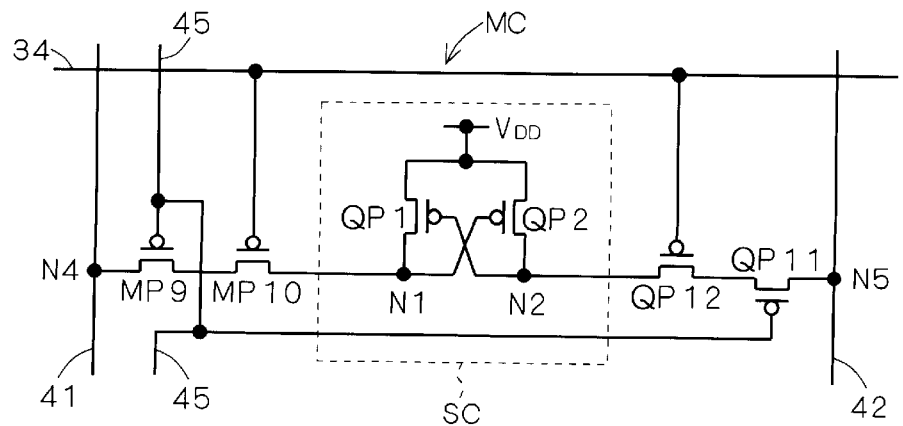
FIG. 50 is a circuit diagram of another modification of the ninth preferred embodiment of the present invention.
Figure 51:
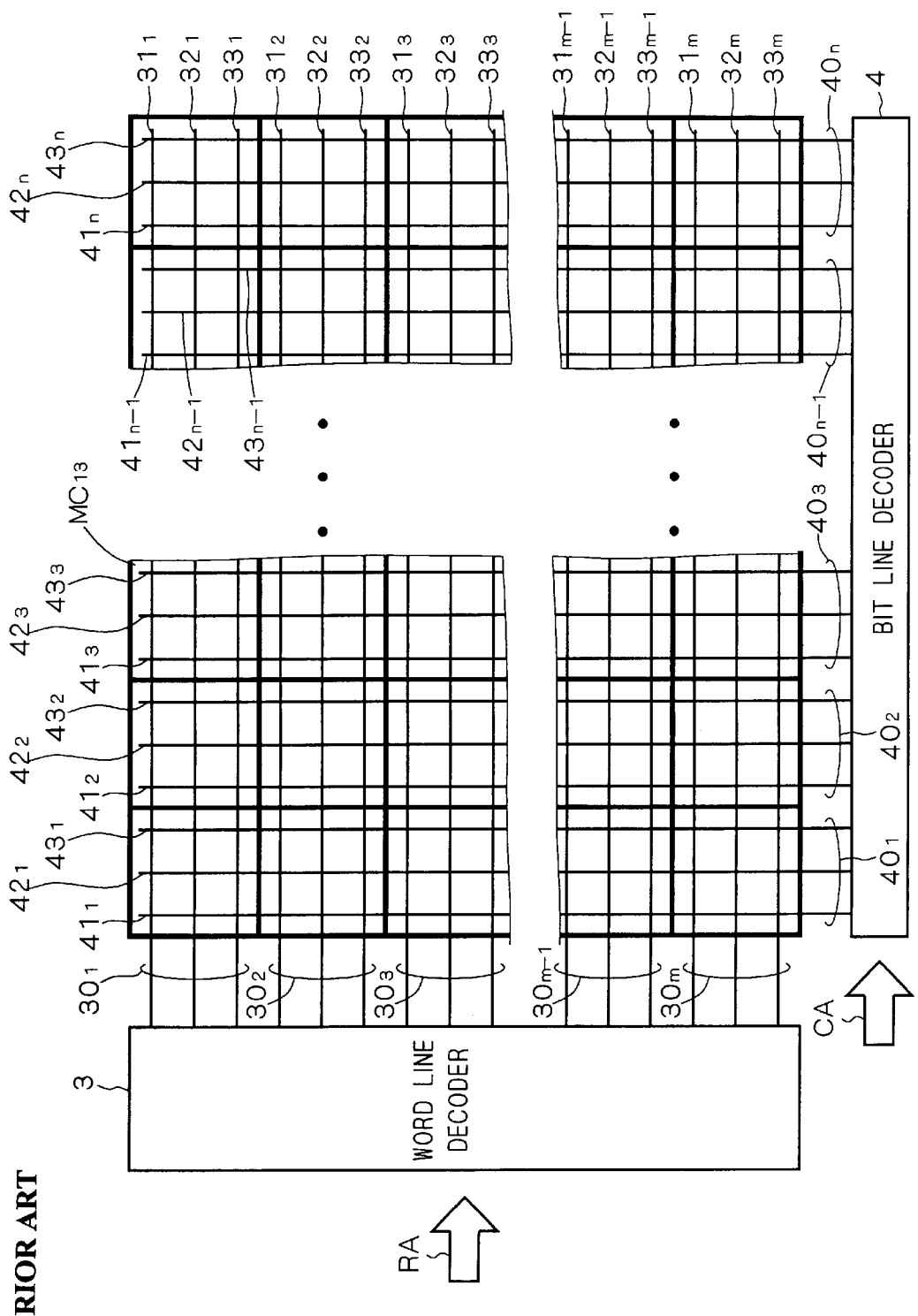
FIG. 51 conceptually shows a background art SRAM.

FIG. 50 is a circuit diagram showing another modification of the ninth preferred embodiment. The configuration shown in FIG. 50 differs from that shown in FIG. 49 only in configuration of the storage cell SC. The pair of cross-coupled transistors in FIG. 50 are PMOS transistors QP1 and QP2. More specifically, the drain of the transistor QP1 and the gate of the transistor QP2 are connected in common to the storage node N1, and the gate of the transistor QP1 and the drain of the transistor QP2 are connected in common to the storage node N2. The sources of the transistors QP1 and QP2 are connected in common to the potential point $V_{DD}$. It is obvious that the configuration shown in FIG. 50 performs operations similar to those of the configuration shown in FIG. 46.

The configuration shown in FIG. 46 in which the memory cell MC comprises only the NMOS transistors eliminates the need to provide an isolation region between PMOS and NMOS transistors to reduce the area occupied by the memory cell MC. The configuration shown in FIG. 50 in which the memory cell MC comprises only the PMOS transistors can similarly reduce the area occupied by the memory cell MC.

In the configuration shown in FIG. 46, when the write data bit line 41 is driven low and accordingly receives the potential $V_{SS}$, the threshold value of the NMOS transistors MN9 and MN10 presents no problem, and the potential $V_{SS}$ is applied to the storage node N1. On the other hand, when the write data bit line 41 is driven high and accordingly receives the potential $V_{DD}$, a potential $(V_{DD}-2V_{thn})$ is applied to the storage node N1 where $V_{thn}$ (>0) is the threshold voltage of the NMOS transistors MN9 and MN10. For this reason, the storage cell SC is stabilized more slowly when writing a "high" into the storage node N1 than when writing a "low" thereinto.

In the configurations shown in FIGS. 49 and 50, when the potential $V_{DD}$ is applied to the write data bit line 41, the threshold value of the PMOS transistors MP9 and MP10 presents no problem, and the potential $V_{DD}$ is applied to the storage node N1. On the other hand, when the potential $V_{SS}$ is applied to the write data bit line 41, a potential $(V_{SS}-2V_{thp})$ is applied to the storage node N1 where $V_{thp}$ (<0) is the threshold voltage of the PMOS transistors MP9 and MP10. For this reason, the storage cell SC is stabilized more slowly when writing a "low" into the storage node N1 than when writing a "high" thereinto.

In the configuration shown in FIG. 47, on the other hand, when the potential $V_{DD}$ is applied to the write data bit line 41, there is no reduction by the amount of the threshold voltage in the PMOS transistor MP9, and a potential $(V_{DD}-V_{thn})$ is applied to the storage node N1. When the potential $V_{SS}$ is applied to the write data bit line 41, there is no reduction by the amount of the threshold voltage in the NMOS transistor MN10, and a potential $(V_{SS}-V_{thp})$ is applied to the storage node N1. Therefore, the worst value (maximum value) of the time required to stabilize the storage cell SC in the configuration shown in FIG. 47 is less than that in the configurations shown in FIG. 49 and 50. The same is true for the configuration shown in FIG. 48.

Although description has been given on only the write circuit in the ninth preferred embodiment, it is obvious that the above-mentioned configurations may be employed for a read circuit, in which case the write word line 31, the write complement word line 34, the write data bit line 41 and the write data complement bit line 42 should be changed to the read word line 33, the read complement word line 32, the read data bit line 43 and the read data complement bit line 46, respectively. Additionally, the write control line 44 and the write complement control line 45 should be changed to a read control line and a read complement control line, respectively.

The read control line receives a signal which is active (e.g., high) during the read operation and which is inactive (e.g., low) in the standby state, and the read complement control line receives a signal which has a logic complementary to the logic on the read control line during the read operation. An example of the signal to be applied to the read control line includes an exclusive-OR of the logic to be placed on the read word line 33 and the logic to be placed on the read complement word line 32.

Of course, the word line pair and the bit line pair may be employed for both of the read and write operations. The ninth preferred embodiment is applicable to any one of the memory cells of a multi port type and a single port type.

The transistors illustrated in the ninth preferred embodiment may be formed using a silicon substrate, a known SOI substrate, or a SON (Silicon On Nothing) substrate.

While the invention has been described in detail, the foregoing description is in all aspects illustrative and not restrictive. It is understood that numerous other modifications and variations can be devised without departing from the scope of the invention.

What is claimed is:

1. A memory device comprising:
    (a) a plurality of word line groups each including
        (a-1) a write word line;
    (b) a plurality of bit line groups each including
        (b-1) a write data bit line, and
        (b-2) a write control line provided in corresponding relation to said write data bit line; and
    (c) a plurality of memory cells each provided in corresponding relation to one of said word line groups and one of said bit line groups, each of said memory cells including
        (c-1) a storage cell including a first storage node, and
        (c-2) a first switch connected between said write data bit line of said one of said bit line groups corresponding thereto and said first storage node, said first switch being conducting only when both of said write word line of said one of said word line groups corresponding thereto and said write control line are active,
    wherein said write control line is active when an associated one of said bit line groups which includes said write control line is selected, and is inactive when said associated one of said bit line groups is not selected.

2. The memory device according to claim 1,
    wherein each of said bit line groups further includes
        (b-3) a write data complement bit line provided in corresponding relation to said write data bit line,
    wherein said storage cell each includes
        (c-1-1) a second storage node receiving a logic complementary to a logic on said first storage node,
    wherein each of said memory cells further includes
        (c-3) a second switch connected between said write data complement bit line of said one of said bit line groups corresponding thereto and said second storage node, said second switch being conducting only when both of said write word line of said one of said word line groups corresponding thereto and said write control line are active, wherein said write data bit line and said write data complement bit line have logics complementary to each other when an associated one of said bit line groups which includes said write data bit line and said write data complement bit line is selected, and have the same logic when said associated one of said bit line groups is not selected, and wherein said write control line has the exclusive OR of said write data bit line and said write data complement bit line in said one of said bit line groups.

3. The memory device according to claim 2, wherein potentials on said write data bit line and said write data complement bit line are non-invertingly amplified and then exclusive-ORed.

4. The memory device according to claim 1, wherein said first switch includes:
(c-2-1) a first transistor having a control electrode connected to said write control line, and first and second current electrodes; and
(c-2-2) a second transistor having a control electrode connected to said write word line, and first and second current electrodes, and wherein said first and second current electrodes of said first transistor and said first and second current electrodes of said second transistor are connected in series between said first storage node and said write data bit line.

5. The memory device according to claim 4, wherein said first switch further includes:
(c-2-3) a third transistor having a control electrode receiving a logic complementary to a logic on said write control line, a first current electrode connected to said second current electrode of said first transistor, and a second current electrode connected to said first current electrode of said first transistor, said third transistor being different in conductivity type from said first transistor; and
(c-2-4) a fourth transistor having a control electrode receiving a logic complementary to a logic on said write word line, a first current electrode connected to said second current electrode of said second transistor, and a second current electrode connected to said first current electrode of said second transistor, said fourth transistor being different in conductivity type from said second transistor.

6. The memory device according to claim 4, wherein said first current electrode of said first transistor and said second current electrode of said second transistor share one region with each other.

7. The memory device according to claim 4, wherein said first transistor is an NMOS transistor formed on an SOI substrate; and wherein a potential for alleviating a forward bias on said first current electrode of said first transistor and a body is applied to said write word line which is inactive.

8. The memory device according to claim 4, wherein said storage cell comprises a pair of cross-coupled transistors.

9. The memory device according to claim 4, wherein said first transistor and said second transistor differ in conductivity type from each other.

10. The memory device according to claim 1, wherein said first switch includes:
(c-2-1) a first transistor having a control electrode, a first current electrode connected to said write data bit line, and a second current electrode connected to said first storage node; and
(c-2-2) a second transistor having a control electrode connected to said write control line, a first current electrode connected to said control electrode of said first transistor, and a second current electrode connected to said write word line.

11. The memory device according to claim 1, wherein said first switch includes:
(c-2-1) a first transistor having a control electrode connected to said write word line, a first current electrode, and a second current electrode connected to said write control line; and
(c-2-2) a second transistor having a control electrode connected to said first current electrode of said first transistor, a first current electrode connected to said write data bit line, and a second current electrode connected to said first storage node.

12. A memory device comprising:
(a) a plurality of word line groups each including
    (a-1) a write word line;
(b) a plurality of bit line groups each including
    (b-1) a write data bit line, and
    (b-2) a write control line provided in corresponding relation to said write data bit line; and
(c) a plurality of memory cells each provided in corresponding relation to one of said word line groups and one of said bit line groups, each of said memory cells including
    (c-1) a storage cell including a first storage node, and
    (c-2) a first potential setting section for providing a logic complementary to a logic on said write data bit line of said one of said bit line groups corresponding thereto to said first storage node only when both of said write word line of said one of said word line groups corresponding thereto and said write control line are active, wherein said write control line is active when an associated one of said bit line groups which includes said write control line is selected, and is inactive when said associated one of said bit line groups is not selected.

13. The memory device according to claim 12, wherein said first potential setting section includes:
(c-2-1) a first potential point for supplying a potential corresponding to a first logic;
(c-2-2) a first switch for controlling electrical conduction between said first storage node and a first connection point, depending on a logic on said write control line; and
(c-2-3) a second switch for controlling electrical conduction between said first connection point and said first potential point, depending on both of the logic on said write data bit line and a logic on said write word line.

14. The memory device according to claim 13, wherein said first potential setting section further includes:
(c-2-4) a second potential point for supplying a potential corresponding to a second logic complementary to said first logic; and
(c-2-5) a third switch for controlling electrical conduction between said first connection point and said second potential point, depending on both of the logic on said write data bit line and a logic complementary to the logic on the write word line.

15. The memory device according to claim 12,
wherein said first potential setting section includes:
(c-2-1) a first potential point for supplying a potential corresponding to a first logic;
(c-2-2) a first switch for controlling electrical conduction between said first storage node and a first connection point, depending on a logic on said write word line; and
(c-2-3) a second switch for controlling electrical conduction between said first connection point and said first potential point, depending on both of a logic on said write control line and the logic on said write data bit line.

16. The memory device according to claim 15,
wherein said first potential setting section further includes:
(c-2-4) a second potential point for supplying a potential corresponding to a second logic complementary to said first logic; and
(c-2-5) a third switch for controlling electrical conduction between said first connection point and said second potential point, depending on both of a logic complementary to the logic on said write control line and the logic on said write data bit line.

17. A memory device comprising:
(a) a plurality of word line groups each including
    (a-1) a write word line;
(b) a plurality of bit line groups each including
    (b-1) a write data bit line; and
(c) a plurality of memory cells each provided in corresponding relation to one of said word line groups and one of said bit line groups, each of said memory cells including
    (c-1) a storage cell including a first storage node,
    (c-2) a switch connected between said first storage node and a first potential point supplying a first potential corresponding to a first logic, and
    (c-3) a control device for permitting open/close control of said switch, depending on a logic on said write data bit line of said one of said bit line groups corresponding thereto when said write word line of said one of said word line groups corresponding thereto is active.

18. The memory device according to claim 17,
wherein said switch includes
    (c-2-1) a first transistor having a first current electrode connected to said first storage node, a second current electrode connected to said first potential point, and a control electrode, and
wherein said control device includes
    (c-3-1) a second transistor having a first current electrode connected to said control electrode of said first transistor, a second current electrode connected to said write data bit line, and a control electrode connected to said write word line.

19. The memory device according to claim 18,
wherein said control device further includes
    (c-3-2) a third transistor having a first current electrode connected to said second current electrode of said second transistor, a second current electrode connected to said first current electrode of said second transistor, and a control electrode receiving a potential corresponding to a logic complementary to a logic on said write word line.

20. A memory device comprising:
(a) a plurality of write word lines;
(b) a plurality of write data bit lines; and
(c) a plurality of memory cells each provided in corresponding relation to one of said write word lines and one of said write data bit lines, each of said memory cells including
    (c-1) a storage cell including a storage node,
    (c-2) a first transistor, electrical conduction of said first transistor being controlled by a logic placed on said one of said write data bit lines, and
    (c-3) a second transistor, electrical conduction of said second transistor being controlled by a logic placed on said one of said write word lines,
said storage node being connected through only in-series connection of said first transistor and said second transistor to a first potential point supplying a first potential corresponding to a first logic,
said storage cell further including
    a third transistor having a first current electrode connected to said storage node, a second current electrode receiving a second potential corresponding to a logic complementary to said first logic, and a control electrode, and
    a fourth transistor having a first current electrode connected to said control electrode of said third transistor, a second current electrode receiving said second potential, and a control electrode connected to said storage node.

* * * * *